(12) United States Patent
Luo et al.

(10) Patent No.: US 8,895,965 B2
(45) Date of Patent: Nov. 25, 2014

(54) PHOTOELECTRIC CONVERSION ELEMENT, PRODUCTION METHOD FOR A PHOTOELECTRIC CONVERSION ELEMENT, SOLID-STATE IMAGE SENSOR, PRODUCTION METHOD FOR A SOLID-STATE IMAGE SENSOR, ELECTRONIC APPARATUS, PHOTOCONDUCTOR, PRODUCTION METHOD FOR A PHOTOCONDUCTOR AND MULTILAYER TRANSPARENT PHOTOELECTRIC CONVERSION ELEMENT

(75) Inventors: Wei Luo, Kanagawa (JP); Yuichi Tokita, Kanagawa (JP); Yoshio Goto, Kanagawa (JP); Seiji Yamada, Kanagawa (JP); Satoshi Nakamaru, Kanagawa (JP)

(73) Assignee: Sony Corporation, Tokyo (JP)

( * ) Notice: Subject to any disclaimer, the term of this patent is extended or adjusted under 35 U.S.C. 154(b) by 202 days.

(21) Appl. No.: 13/402,134

(22) Filed: Feb. 22, 2012

(65) Prior Publication Data
US 2012/0228587 A1 Sep. 13, 2012

(30) Foreign Application Priority Data

Mar. 7, 2011 (JP) ................................. 2011-048510

(51) Int. Cl.
 H01L 31/0256 (2006.01)
 H01L 51/44 (2006.01)
 H01L 51/00 (2006.01)
(52) U.S. Cl.
 CPC .......... H01L 51/0093 (2013.01); H01L 51/447 (2013.01); *Y02E 10/549* (2013.01)
 USPC ...... 257/40; 257/431; 257/443; 257/E31.003; 438/1; 438/48
(58) Field of Classification Search
 USPC ........... 257/40, 431, 443, E31.003; 438/1, 48
 See application file for complete search history.

(56) References Cited

FOREIGN PATENT DOCUMENTS

JP 2007-220445 8/2007

OTHER PUBLICATIONS

Jane M. Vanderkooi et al.; Metallocytochroms c: Characterization of Electronic Absorption and Emission Spectra of Sn4+ and Zn2+ Cytochromes c; Eur. J. Biochem; 64, 381-387; 1976.
George McLendon and Michele Smith; Equilibrium and Kinetic Studies of Unfolding of Homologous Cytochromes c; The Journal of Biological Chemistry; vol. 253, No. 11; Issue of Jun. 10, pp. 4004-4008; 1978.
Beenu Moza et al.; Equilibrium studies of the effect of difference in sequence homology on the mechanism of denaturation of bovine and horse cytochomres-c; Biochimica et Biophysica Acta; 1646; 2003; 49-56.
Yuichi Tokita et al.; Mechanism of Intramolecular Electron Transfer in the Photoexcited Zn-Substituted Cytochrome c: Theoretical and Experimental Perspective; J. Am. Chem. Soc.; 2008; 130; 5302-5310.

*Primary Examiner* — Long Pham
(74) *Attorney, Agent, or Firm* — Dentons US LLP

(57) ABSTRACT

Provided is a photoelectric conversion element including a photoconductor containing a complex of a conductive polymer and/or polymer semiconductor and a protein containing at least one dye having a long-lived excited state.

25 Claims, 52 Drawing Sheets

PHOTOELECTRIC CONVERSION ELEMENT, PRODUCTION METHOD FOR A PHOTOELECTRIC CONVERSION ELEMENT, SOLID-STATE IMAGE SENSOR, PRODUCTION METHOD FOR A SOLID-STATE IMAGE SENSOR, ELECTRONIC APPARATUS, PHOTOCONDUCTOR, PRODUCTION METHOD FOR A PHOTOCONDUCTOR AND MULTILAYER TRANSPARENT PHOTOELECTRIC CONVERSION ELEMENT

BACKGROUND

The present disclosure relates to a photoelectric conversion element containing a protein, a production method for the photoelectric conversion element, a solid-state image sensor, a production method for the solid-state image sensor, an electronic apparatus, a photoconductor, a production method for the photoconductor and a multilayer transparent photoelectric conversion element.

Most known light-receiving elements function as photodiodes and the photodiodes containing the same operate, as a reverse bias voltage is applied thereto.

Proposed as a photoelectric conversion element containing a protein was a photoelectric conversion element containing a protein-immobilized electrode having a zinc-substituted equine cardiac muscle cytochrome c (in which the central metal iron of the prosthetic group hem of equine cardiac muscle cytochrome c is substituted with zinc) immobilized on a gold electrode (see Japanese Patent Application Laid-open No. 2007-220445, hereinafter referred to as Patent Document 1). It was shown that photocurrent can be obtained by using the protein-immobilized electrode.

SUMMARY

However, in the light-receiving elements in the past described above, a fairly large part of the carriers excited by light disappeared by recombination before they contribute to photocurrent (CMOS type) or charge accumulation (CCD type), which in turn led to deterioration in photoelectric conversion efficiency.

Thus, it is desired to provide a photoelectric conversion element which prevents recombination of optically excited carriers and disappearance thereof, and increases the photoelectric conversion efficiency and a production method thereof.

It is also desired to provide a solid-state image sensor which prevents recombination of optically excited carriers and disappearance thereof, and increases the photoelectric conversion efficiency and a production method thereof.

It is additionally desired to provide a photoconductor which prevents recombination of optically excited carriers and disappearance thereof, and increases the photoelectric conversion efficiency and a production method thereof.

It is additionally desired to provide a high-performance electronic apparatus containing the favorable photoelectric conversion element or solid-state image sensor.

It is additionally desired to provide a multilayer transparent photoelectric conversion element which prevents recombination of optically excited carriers and disappearance thereof, and increase the photoelectric conversion efficiency.

It is additionally desired to provide a high-performance electronic apparatus containing the favorable multilayer transparent photoelectric conversion element.

These and other objects, features and advantages of the present disclosure will become more apparent in light of the following detailed description of best mode embodiments thereof, as illustrated in the accompanying drawings.

According to an embodiment of the present disclosure, there is provided a photoconductor, including the complex of a conductive polymer and/or polymer semiconductor and a protein containing at least one dye having a long-lived excited state.

There is also provided a production method for the photoconductor, including the complex of a conductive polymer and/or polymer semiconductor and a protein containing at least one dye having a long-lived excited state.

There is also provided a photoelectric conversion element, including a photoconductor, containing the complex of a conductive polymer and/or polymer semiconductor and a protein containing at least one dye having a long-lived excited state.

There is also provided a production method for the photoelectric conversion element, including forming a photoconductor containing the complex of a conductive polymer and/or polymer semiconductor and a protein containing at least one dye having a long-lived excited state.

There is also provided an electronic apparatus, including a photoelectric conversion element containing a photoconductor that contains the complex of a conductive polymer and/or polymer semiconductor and a protein containing at least one dye having a long-lived excited state.

There is also provided a multilayer transparent photoelectric conversion element, including multiple mutually-laminated transparent photoelectric conversion elements containing a photoconductor that contains the complex of a conductive polymer and/or polymer semiconductor and a protein containing at least one dye having a long-lived excited state.

There is also provided an electronic apparatus, including a multilayer transparent photoelectric conversion element, containing multiple mutually-laminated transparent photoelectric conversion elements containing a photoconductor that contains the complex of a conductive polymer and/or polymer semiconductor and a protein containing at least one dye having a long-lived excited state.

Typically in the photoconductor described above, the conductive polymer and/or polymer semiconductor and the protein are bound to each other via non-covalent or covalent bonds. Typically, the conductive polymer and/or polymer semiconductor forms a network as a whole. The conductive polymer and/or polymer semiconductor is usually p-type, but it may be n-type. The term "extended-life" of the dye having a long-lived excited state contained in the protein is a value of the excitation lifetime common to fluorescent or phosphorescent dyes, and the life is typically tens of picoseconds or more, but is not limited thereto. The protein is at least one protein selected, for example, from the group consisting of electron transfer proteins, coenzyme-containing proteins, globins, fluorescent proteins and variants of the fluorescent proteins. Any known electron transfer protein may be used as the electron transfer protein. More specifically, the electron transfer protein for use may be a metal-containing electron transfer protein or a non-metal-containing (metal-free) electron transfer protein. The metal contained in the electron transfer protein is favorably a transition metal (e.g., zinc or iron) having electrons in the d or higher-energy orbital. A novel electron transfer protein described below may be used as the electron transfer protein. The complex of the conductive polymer and/or polymer semiconductor with the protein contains additionally another polymer higher in mechanical strength than the conductive polymer and/or polymer semiconductor, as necessary for increase in mechanical strength. In this way, it is not necessary to support the photoconductor with a substrate any more.

Typically in the photoelectric conversion element above, the conductive polymer and/or polymer semiconductor is electrically connected to the first and second electrodes therebetween. The photoconductor and the first and second electrodes may be formed on a substrate for mechanical support, as necessary. The substrate may be transparent or non-transparent. For example to obtain a photoelectric conversion element transparent to visible light, the substrate and the first and second electrodes are made transparent to visible light. The photoelectric conversion element is, for example, a light-receiving element, but is not limited thereto.

Typically in the production methods for the photoconductor and the photoelectric conversion element, the conductive polymer and/or polymer semiconductor and the protein are bound to each other via non-covalent or covalent bonds. The complex of the conductive polymer and/or polymer semiconductor and the protein can be prepared, for example, by using a solution containing the conductive polymer and/or polymer semiconductor and the protein. Alternatively, the complex can be prepared by adding a linker to the solution containing a conductive polymer and/or polymer semiconductor and a protein, thus binding the conductive polymer and/or polymer semiconductor and protein with the linker and then by using the resulting solution. Yet alternatively, the complex can be prepared by preparing a conductive polymer and/or polymer semiconductor from monomers by electrochemical polymerization of a solution containing the monomers for the conductive polymer and/or polymer semiconductor and a dye and forming a dye-containing protein by adding an apoprotein to the solution and then by using the solution. Typically in the production method for the photoelectric conversion element, the first and second electrodes are formed on a substrate, the photoconductor is formed on the resulting substrate in such a manner that the conductive polymer and/or polymer semiconductor is electrically connected to the first and second electrodes therebetween.

The electronic apparatus containing the photoelectric conversion element above may be, for example, an electronic apparatus having a light-receiving unit and the function or the application thereof is not limited. The electronic apparatus containing the multilayer transparent photoelectric conversion element is not particularly limited, if it can contain the multilayer transparent photoelectric conversion element, and typical examples thereof include 3D displays, 3D image sensors, cameras, optical recording and reproducing systems and the like.

There is also provided a solid-state image sensor, including a photoconductor that contains the complex of a conductive polymer and/or polymer semiconductor and a protein containing at least one dye having a long-lived excited state, as a light-receiving unit.

There is also provided a production method for a solid-state image sensor, including forming a light-receiving unit by using a photoconductor containing the complex of a conductive polymer and/or polymer semiconductor and a protein containing at least one dye having a long-lived excited state.

There is also provided an electronic apparatus, including a solid-state image sensor containing a photoconductor that contains the complex of a conductive polymer and/or polymer semiconductor and a protein containing at least one dye having a long-lived excited state, as a light-receiving unit.

The description above for the photoelectric conversion element, production method for photoelectric conversion element and electronic apparatus applies to the solid-state image sensor, production method for the solid-state image sensor and the electronic apparatus containing the solid-state image sensor, unless specified otherwise.

In the present disclosure described above, when light enters into the photoconductor containing the complex of a conductive polymer and/or polymer semiconductor and a protein containing at least one dye having a long-lived excited state, the dye contained in the protein absorbs photons, generating electron-hole pairs. The electron-hole pair is charge-separated, and one of them is injected out of the protein into the conductive polymer and/or polymer semiconductor (photodoping), while the other is localized in the neighborhood of the protein. For example, the hole of the electron-hole pair is injected into the conductive polymer and/or polymer semiconductor, while the electron is localized in the neighborhood of the protein. The conductive polymer and/or polymer semiconductor is electrically connected to the first and second electrodes therebetween. When bias voltage is applied between the first and second electrodes, the electron or hole injected into the conductive polymer and/or polymer semiconductor transmits through the conductive polymer and/or polymer semiconductor, and photocurrent flows between the first and second electrodes. In this case, each polypeptide constituting the protein serves as a barrier to the electrons or holes, preventing disappearance of the electrons or holes generated by the dye contained in one protein and the holes or electrons generated by the dye contained in another protein by recombination. When no light enters into the photoconductor containing the complex of a conductive polymer and/or polymer semiconductor and a protein, the photoconductor behaves like an insulator.

According an embodiment of the present disclosure, it is possible to provide a photoelectric conversion element, a solid-state image sensor and a multilayer transparent photoelectric conversion element which prevents recombination of optically excited carriers and disappearance thereof, and increases the photoelectric conversion efficiency. It is thus possible to provide a high-performance electronic apparatus by using the favorable photoelectric conversion element, solid-state image sensor or multilayer transparent photoelectric conversion element.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 16 are views showing an example of the photoelectric conversion element in the third embodiment that is applied to a photosensor array, in which

DETAILED DESCRIPTION OF EMBODIMENTS

Hereinafter, embodiments of the present disclosure will be described with reference to drawings. The embodiments will be described in the following order.
1. First embodiment (photoconductor and production method thereof)
2. Second embodiment (photoconductor and production method thereof)
3. Third embodiment (photoelectric conversion element and production method thereof)
4. Fourth embodiment (multilayer transparent photoelectric conversion element and production method thereof)
5. Fifth embodiment (multilayer transparent photoelectric conversion element and production method thereof)
6. Sixth embodiment (multilayer transparent photoelectric conversion element)
7. Seventh embodiment (multilayer transparent photoelectric conversion element)
8. Eighth embodiment (multilayer transparent photoelectric conversion element)
9. Ninth embodiment (3D imaging system)
10. Tenth embodiment (3D imaging system)
11. Eleventh embodiment (3D imaging system)
12. Twelfth embodiment (optical disk system)
13. Thirteenth embodiment (optical recording and reproducing system)
14. Fourteenth embodiment (CCD image sensor)

1. First Embodiment

Figure 1:
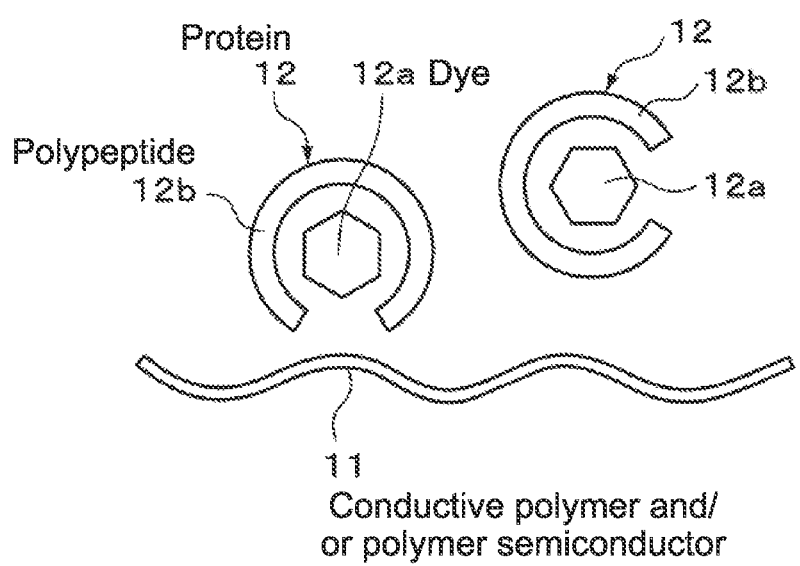
FIG. 1 is a schematic view illustrating a photoconductor of a first embodiment.

[Photoconductor]
FIG. 1 shows a photoconductor in a first embodiment.
As shown in FIG. 1, the photoconductor contains complexes of a network-like conductive polymer and/or polymer semiconductor 11 with one or more proteins 12. The protein 12, which is in a long-lived excited state, is oriented at a particular position, as a dye 12a, its emission center, is enclosed in a polypeptide 12b. Usually, the conductive polymer and/or polymer semiconductor 11 and the protein 12 are bound to each other non-covalently or covalently. The non-covalent bond is, for example, a bond by electrostatic interaction, Van der Waals interaction, hydrogen bond interaction or charge transfer interaction. The conductive polymer and/or polymer semiconductor 11 and the protein 12 may be bound to each other via a linker (not shown in the Figure). The entire shape of the photoconductor is not particularly limited and selected properly, as necessary, but it is, for example, in the film or plate shape. The surface shape of the photoconductor is also arbitrary and may be, for example, bent, protruded or irregular (both bent and protruded). Further, the planar shape of the photoconductor is not particularly limited and selected properly, as necessary, but it is, for example, polygonal (triangular, quadrangular, pentagonal, hexagonal or the like), circular or elliptical.

The blending ratio (mass ratio or weight ratio) of the conductive polymer and/or polymer semiconductor 11 to the protein 12 is not particularly limited and selected properly according to the desired photoconductivity of the photoconductor. Generally, the presence of the protein 12 in a greater amount with respect to that of the conductive polymer and/or polymer semiconductor 11 leads to increase in photoconductivity.

The conductive polymer and/or polymer semiconductor 11 may be a p-type or n-type polymer. Conductive polymers are grouped grossly to hydrocarbon-based conductive polymers and hetero atom-containing conductive polymers. Examples of the hydrocarbon-based conductive polymers include polyacetylene, polyphenylene, polyphenylene vinylene, polyacene, polyphenylacetylene, polydiacetylene, polynaphthalene and the like. Examples of the hetero atom-containing conductive polymers include polypyrrole, polyaniline, polythiophene, polythienylene vinylene, polyazulene, polyisothianaphthene and the like.

Examples of the proteins 12 containing a dye 12a, as enclosed in polypeptide 12b, include the following various proteins that are modified to show fluorescence or modified with a fluorescent compound. Derivatives of the following proteins (skeletal amino acid residues being chemically modified) or the variants thereof (part of the skeletal amino acid residues being substituted with other amino acid residues) can also be used.

(1) Cytochrome c's (electron transfer proteins):
cytochrome c, cytochrome $c_1$, cytochrome $c_2$, cytochrome $c_3$, cytochrome $c_4$, cytochrome $c_5$, cytochrome $c_6$ cytochrome $c_7$, cytochrome $C_8$, cytochrome c', cytochrome c", cytochrome cL, cytochrome cM, cytochrome cS, cytochrome $C_{544}$, cytochrome $c_{545}$, cytochrome $C_{546}$, cytochrome $C_{547}$, cytochrome $c_{548}$, cytochrome $c_{549}$, cytochrome $c_{550}$, cytochrome $c_{551}$, cytochrome $c_{551.5}$, cytochrome $c_{552}$, cytochrome $c_{553}$, cytochrome $c_{554}$, cytochrome $c_{555}$, cytochrome $c_{556}$, cytochrome $c_{557}$, cytochrome $c_{558}$, cytochrome $c_{559}$, cytochrome $c_{560}$, cytochrome $C_{561}$, cytochrome $c_{562}$, cytochrome $c_{563}$ and the like.

(2) Cytochrome b's (electron transfer proteins):
cytochrome b, cytochrome $b_1$, cytochrome $b_2$, cytochrome $b_3$, cytochrome $b_4$, cytochrome $b_5$, cytochrome $b_6$, cytochrome cytochrome $b_8$, cytochrome $b_9$, cytochrome $b_{550}$, cytochrome $b_{551}$, cytochrome $b_{552}$, cytochrome $b_{553}$, cytochrome $b_{554}$, cytochrome $b_{555}$, cytochrome $b_{556}$, cytochrome $b_{557}$, cytochrome $b_{558}$, cytochrome $b_{559}$, cytochrome $b_{560}$, cytochrome $b_{561}$, cytochrome $b_{562}$, cytochrome $b_{563}$, cytochrome $b_{564}$, cytochrome $b_{565}$, cytochrome $b_{566}$, cytochrome $b_{567}$, cytochrome $b_{568}$, cytochrome $b_{569}$, cytochrome $P_{450}$ and the like.

(3) Cytochrome a's (electron transfer proteins):
cytochrome a, cytochrome $a_1$, cytochrome $a_2$, cytochrome $a_3$, cytochrome o, cytochrome $o_3$ and the like.

(4) Other electron transfer proteins:
ferredoxin, rubredoxin, plastocyanin, azurin, pseudoazurin, stellacyanin, thioredoxin and the like.

(5) Proteins containing the following coenzymes:
nucleotide-based coenzymes: nicotinamide adenine dinucleotide (NADH), nicotinamide adenine dinucleotide phosphoric acid (NADPH), flavin adenine nucleotide (FADH), flavin mononucleotide (FMN) and the like;
quinone-based coenzymes: ubiquinone, plastoquinone, menaquinone, caldariellaquinone, coenzyme F420, rhodoquinone and the like; and porphyrin-based coenzymes: hem, chlorophyll, pheophytin, chlorin and the like.

(6) Globins:
myoglobin, hemoglobin, neuroglobin, cytoglobin and the like.

(7) Fluorescent proteins and the variants:
green fluorescent protein (GFP), DsRed, Kusabira orange, TagBFP (from Evrogen), fruit fluorescent protein from Clontech (http://catalog.takara-bio.co.jp/clontech/product/basicinfo.asp?unitid=U100005040), CoralHue series products from MBL (https://ruo.mbl.co.jp/product/flprotein/) and the like.

Examples of the fluorescent compounds include the following fluorescence dyes:

4-Acetamido-4'-isothiocyanatostilbene-2,2'-disulfonic acid

Acridine and derivatives such as acridine, acridine orange, acridine yellow, acridine red and acridine isothiocyanate 5-(2'-aminoethyl)aminonaphthalene-1-sulfonic acid (EDANS)

4-Amino-N-[3-(vinylsulfonyl)phenyl)naphthalimide-3,5-disulfonic acid (lucifer yellow VS)

N-(4-Anilino-1-naphthyl)maleimide

Anthranyl amide

Brilliant yellow

Coumarin and the derivatives thereof such as coumarin, 7-amino-4-methylcoumarin (AMC, coumarin 120) and 7-amino-4-trifluoromethylcouluarin (coumaran 151)

Cyanine and the derivatives thereof such as Cyanosine, Cy3, Cy5, Cy5.5 and Cy7

4',6-Diamidino-2-phenylindole (DAPI)

5',5''-Dibromopyrogallol-sulfonphthalein (bromopyrogallol red)

7-Diethylamino-3-(4'-isothiocyanatophenyl)-4-methylcoumarin

Diethylaminocoumarin

Diethylenetriamine pentaacetate 4,4'-Diisothiocyanatodihydrostilbene-2,2'-disulfonic acid 4,4'-Diisothiocyanato stilbene-2,2'-disulfonic acid 5-[Dimethylamino]naphthalene-1-sulfonyl chloride (DNS, dansyl chloride)

4-(4'-Dimethylaminophenylazo)benzoic acid (DABCYL)

4-Dimethylaminophenylazophenyl-4'-isothiocyanate (DABITC)

Eosin and the derivatives thereof such as eosin and eosin isothiocyanate

Erythrosine and the derivatives thereof such as erythrosine B and erythrosine isothiocyanate Fluorescein and the derivatives thereof such as ethidium, 5-carboxyfluorescein (FAM), 5-(4,6-dichlorotriazin-2-yl) aminofluorescein (DTAF), 2'7'-dimethoxy-4'5'-dichloro-6-carboxyfluorescein (JOE), fluorescein isothiocyanate (FITC), fluorescein chlorotriazinyl, naphthofluorescein and QFITC (XRITC)

Fluorescamine

IR144

IR1446

Green fluorescent protein (GFP)

Coral reef-derived fluorescent protein (RCFP)

Lissamine (trade name)

Lissamine rhodamine, Lucifer yellow

Malachite green isothiocyanate

4-Methylumbelliferone o-Cresolphthalein

Nitrotyrosine

Pararosaniline

Nile red

Oregon green

Phenol red

B-Phycoerythrin o-Phthaldialdehyde

Pyrene and the derivatives thereof such as pyrene, pyrene butyric acid and 1-Pyrenebutyric acid succinimidyl ester Reactive red 4 (Cibacron(trade name) Brilliant Red 3B-A)

Rhodamine and the derivatives thereof such as 6-carboxy-X-rhodamine (ROX), 6-carboxyrhodamine (R6G), 4,7-dichlororhodamine lissamine, rhodamine-B-sulfonyl chloride, rhodamine (Rhod), rhodamine B, rhodamine 123, rhodamine X isothiocyanate, sulforhodamine B, sulforhodamine 101, sulfonyl chloride derivative of sulforhodamine 101 (Texas red), N,N,N',N'-tetramethyl-6-carboxyrhodamine (TAMRA), tetramethylrhodamine and tetramethylrhodamine isothiocyanate (TRITC)

Riboflavin

Rosolic acid and terbium chelate derivatives

Xanthene combinations of the compounds above.

In addition to the compounds above, other fluorescent dyes known to those who are skilled in the art, such as those available from Molecular Probes (Eugene, Oreg., US) and Excitors (Dayton, Ohio, US) or the combinations thereof may be used.

For example for mechanical support of the photoconductor, the photoconductor is formed on a substrate, as necessary. Any known substrate may be used as the substrate, as it is selected properly, as necessary, and it may be a transparent or opaque substrate. The material for transparent substrate is selected properly, as necessary, but it is, for example, a transparent inorganic material such as quartz or glass or a transparent plastic material. A transparent plastic substrate is used favorably as the flexible transparent substrate. Examples of the transparent plastics include polyethylene terephthalate, polyethylene naphthalate, polycarbonate, polystyrene, polyethylene, polypropylene, polyphenylene sulfide, polyvinylidene fluoride, acetylcellulose, brominated phenoxy resins, aramides, polyimides, polystyrenes, polyarylates, polysulfones, polyolefins and the like. For example, a silicon substrate is used as the opaque substrate.

Figure 2:
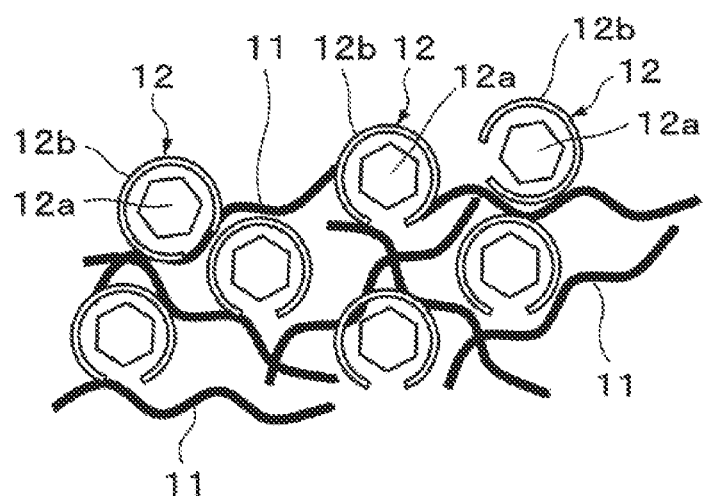
FIG. 2 is a schematic view illustrating a structural example of the photoconductor of the first embodiment.
Figure 3:
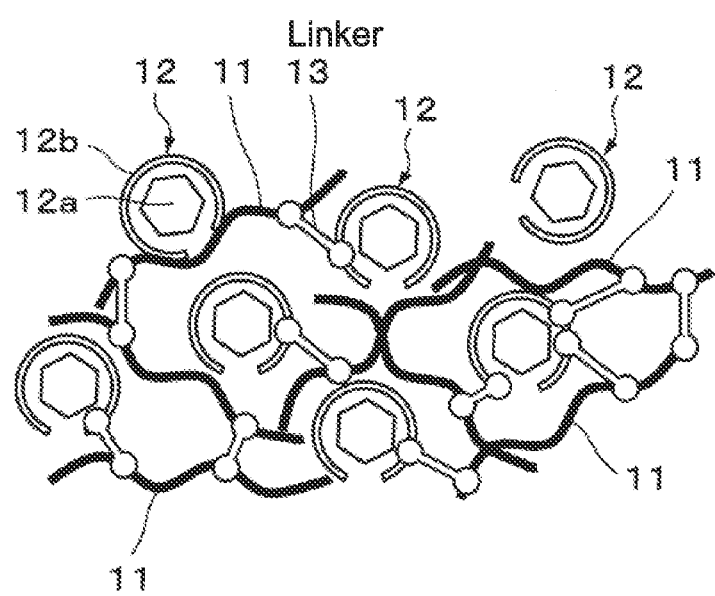
FIG. 3 is a schematic view illustrating another structural example of the photoconductor of the first embodiment.

FIG. 2 shows schematically an example of the state in which the conductive polymer and/or polymer semiconductor 11 and the protein 12 are bound to each other via noncovalent bonds. Alternatively, FIG. 3 shows schematically an example of the state in which the conductive polymer and/or polymer semiconductor 11 and the protein 12 bound to each other via a linker 13.

A known linker, which is selected properly according to the conductive polymer and/or polymer semiconductor 11 and the protein 12, may be used as the linker 13. Specifically, the following linkers can be used.

(1) Those binding the conductive polymer and/or polymer semiconductor 11 to the protein 12 via amine-amine bonds Glutaric aldehyde (reactive group: aldehyde group)

[Chemical Formula 1]

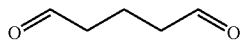

DSG (reactive group: NHS ester, molecular weight: 326.26, spacer arm length: 7.7 Å)

DMA (reactive group: imide ester, molecular weight: 245.15, spacer arm length: 8.6 Å)

[Chemical Formula 2]

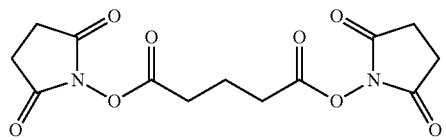

[Chemical Formula 7]

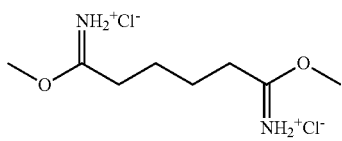

BS (PEG)$_5$, (reactive group: NHS ester, PEG spacer, molecular weight; 532.50)

[Chemical Formula 3]

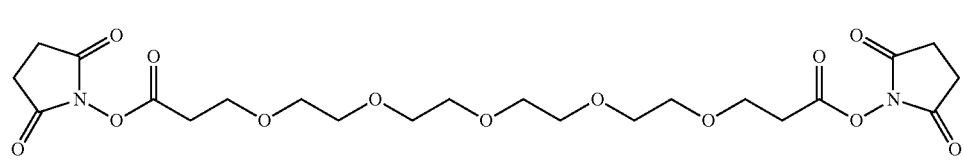

BS(PEG)$_9$ (reactive group: NHS ester, PEG spacer, molecular weight: 708.71)

DTBP (reactive group: imide ester, thiol cleavable, molecular weight: 309.28, spacer arm length: 11.9 Å)

[Chemical Formula 4]

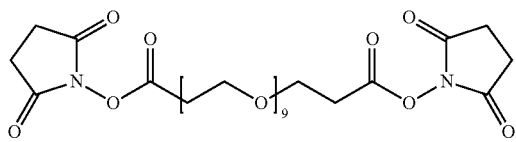

[Chemical Formula 8]

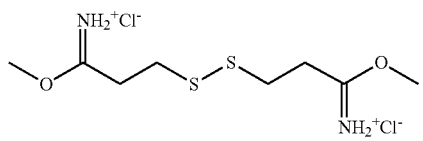

DSP (reactive group: NHS ester, thiol cleavable, molecular weight: 404.42, spacer arm length: 12.0 Å)

HBVS (vinylsulfone) (molecular weight: 266.38, spacer arm length: 14.7 Å)

[Chemical Formula 5]

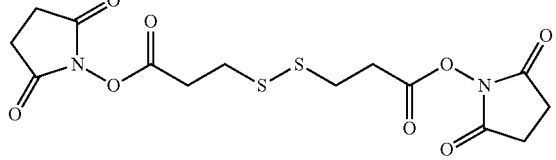

[Chemical Formula 9]

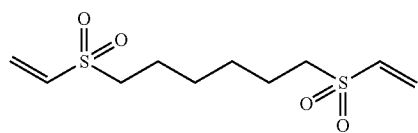

(2) Those binding the conductive polymer and/or polymer semiconductor 11 to the protein 12 with amine-mercapto (or sulfhydryl) bonds DST (reactive group: NHS ester, misc cleavable, molecular weight: 344.24, spacer arm length: 6.4 Å)

BMPS (reactive group: NHS ester/maleimide, molecular weight: 266.21, spacer arm length: 5.9 Å)

[Chemical Formula 6]

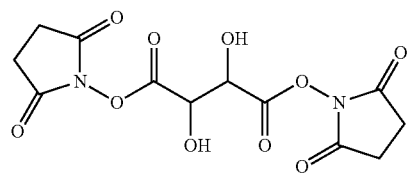

[Chemical Formula 10]

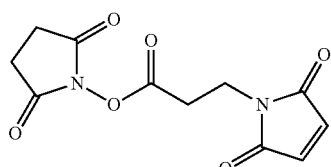

SM(PEG)$_n$ (reactive group: NHS ester/maleimide, PEG spacer)

[Chemical Formula 11]

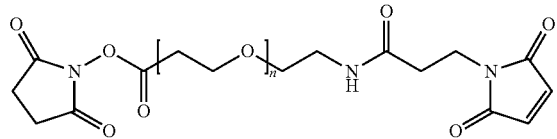

SM(PEG)$_2$ (reactive group: NHS ester/maleimide, PEG spacer, n=2, 4, 6, 8, 12 or 24)

[Chemical Formula 12]

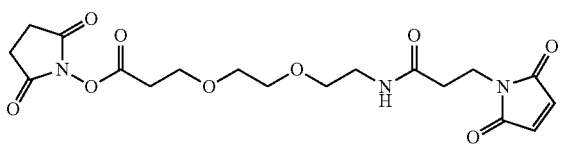

SMPT (reactive group: NHS ester/pyridyldithiol, cleavable, molecular weight: 388.46, spacer arm length: 20.0 Å)

[Chemical Formula 13]

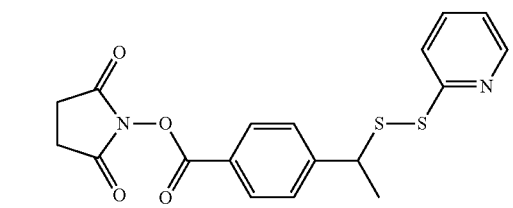

SIA (reactive group: NHS ester/haloacetyl, molecular weight: 283.02, spacer arm length: 1.5 Å)

[Chemical Formula 14]

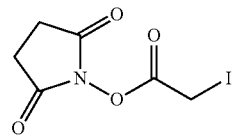

(3) Those binding the conductive polymer and/or polymer semiconductor 11 to the protein 12 via amine-carboxy bonds.

EDC (reactive group: carbodiimide, molecular weight: 191.70

[Chemical Formula 15]

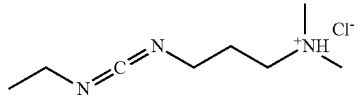

(4) Those binding the conductive polymer and/or polymer semiconductor 11 to the protein 12 with mercapto (or sulfhydryl)-carbohydrate bonds BMPH (reactive group: maleimide/hydrazide, molecular weight: 297.19, spacer arm length: 8.1 Å)

[Chemical Formula 16]

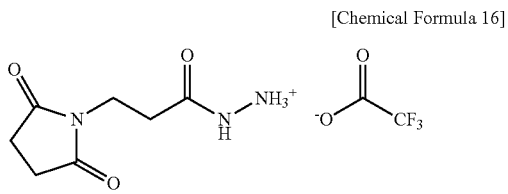

(5) Those binding the polymer network 11 to the protein 12 with hydroxyl-mercapto (or sulfhydryl) bonds PMPI (reactive group: isocyanate/maleimide, molecular weight: 214.18, spacer arm length: 8.7 Å)

[Chemical Formula 17]

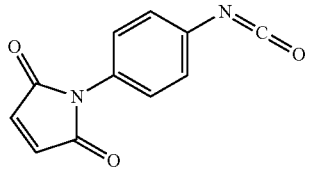

For improvement of the mechanical strength of the entire photoconductor, the photoconductor may contain one or more other polymers superior in mechanical strength, as necessary, in addition to the conductive polymer and/or polymer semiconductor 11. In this way, it is not necessary any more to form the photoconductor on a substrate for mechanical support thereof, for improvement in the mechanical strength of the photoconductor. Alternatively in addition to the conductive polymer and/or polymer semiconductor 11, one or more other polymers for viscosity adjustment may be added to the photoconductor for adjustment of the viscosity of the solution or suspension used during preparation of the photoconductor. The polymer for viscosity adjustment should be transparent at any absorption wavelength to the light entering into the photoconductor, should not raise the viscosity of the solution or suspension for preparation of the photoconductor when the polymer for viscosity adjustment is added thereto and should be stable in its insulative property. Alternatively, one or more other polymers superior in oxidation and humidity resistances may be blended with the photoconductor, for improvement of the oxidation resistance and humidity resistance of the photoconductor. Examples of the other polymers used for these purposes include, but are not limited to, polyethylene terephthalate (PET), polymethyl methacrylate (PMMA), polystyrene (PS), poly-4-vinylphenol (PVP) and the like.

[Production Method for Photoconductor]

The production method for the photoconductor will be described.

For production of the photoconductor shown in FIG. 2, first, a conductive polymer and/or polymer semiconductor 11 and a protein 12 are dissolved and mixed in a solvent. The solvent for use may be, for example, water or an organic solvent and is selected properly, as necessary. The solution thus obtained is applied on a substrate. The application methods include, for example, dip coating, spin coating, bar coating, inkjet printing and the like, and a suitable method is selected, as necessary. The surface shape of the substrate is arbitrary and may be flat or curved. The solvent is then removed by vaporization from the substrate, thus giving a photoconductor on the substrate.

For production of the photoconductor shown in FIG. 3, a conductive polymer and/or polymer semiconductor 11 and a protein 12 are first dissolved and mixed in a solvent. When other polymers are used with the conductive polymer and/or polymer semiconductor 11, the other polymers are also mixed with the solution. The solvent for use may be, for example, water or an organic solvent and is selected properly, as necessary. A linker 13 is then added to the solution thus obtained, making the conductive polymer and/or polymer semiconductor 11 and the protein 12 bound to each other via covalent bonds and precipitated with the linker 13. The unreacted linker 13, the conductive polymer and/or polymer semiconductor 11 and the protein 12 remaining unreactive with the linker 13 are then removed, to give a photoconductor formed on the substrate.

Figure 4:
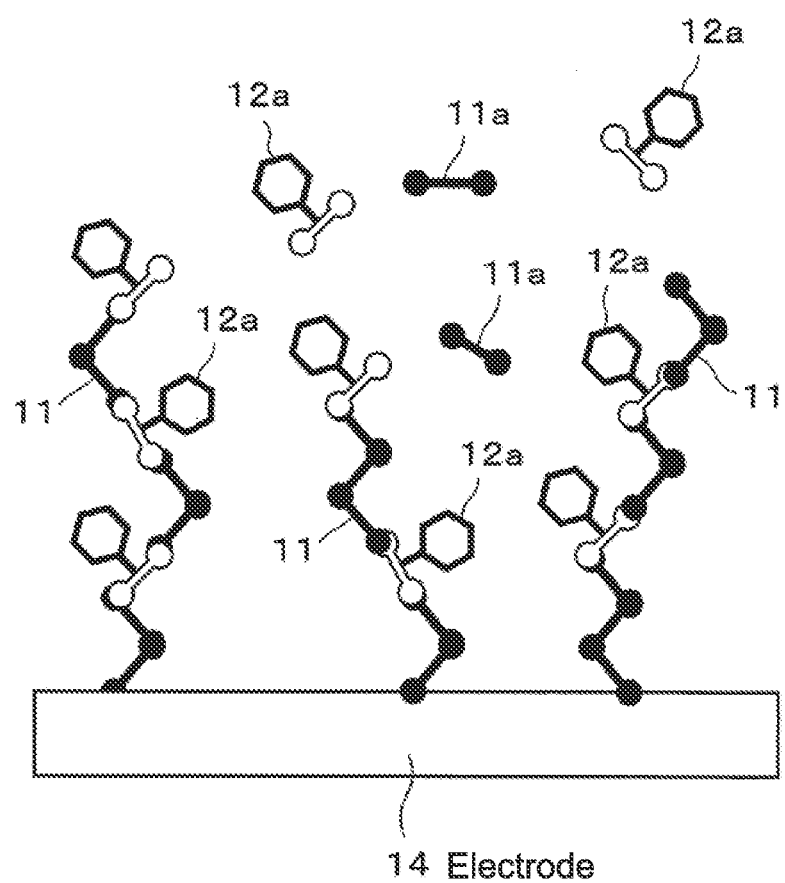
FIG. 4 is a schematic view explaining an example of a method of producing the photoconductor of the first embodiment.
Figure 5:
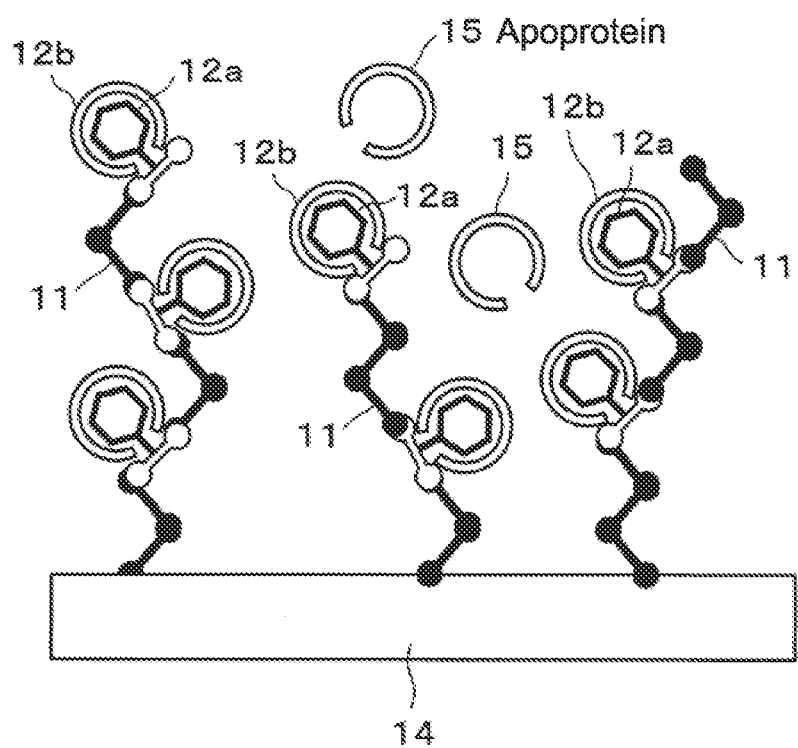
FIG. 5 is a schematic view explaining an example of a method of producing the photoconductor of the first embodiment.

The photoconductor shown in FIG. 2 can also be prepared in the following manner: In this production method, the conductive polymer and/or polymer semiconductor 11 is prepared by an electrochemical polymerization method (electrolytic polymerization method). Specifically, first as shown in FIG. 4, a monomer 11a for preparation of a conductive polymer and/or polymer semiconductor 11 and a dye 12a are dissolved and mixed in a solvent. A conductive polymer and/or polymer semiconductor 11 prepared from the monomers 11a by polymerization is formed on a surface of an electrode 14 by potential sweep, as the electrode 14 (working electrode) is immersed in the solution thus obtained, and the dyes 12a are then bound to the conductive polymer and/or polymer semiconductor 11. Then as shown in FIG. 5, an apoprotein (polypeptide) 15 is mixed with the polymer solution thus obtained. The dye 12a is enclosed in the apoprotein 15 by refolding thereof, as the condition of the polymer solution (pH, temperature, etc.) is adjusted, giving a protein 12 containing the dye 12a, as enclosed in the polypeptide 11a. The solvent and the unreacted monomers 11a are then removed, to give a photoconductor formed on the electrode 14.

In the first embodiment, a novel photoconductor containing the complex of a conductive polymer and/or polymer semiconductor 11 and a protein 12 containing a dye 12a, emission center, in the long-lived excited state is prepared. It is thus possible to produce a novel photoelectric conversion element by using the photoconductor as a photoelectric conversion layer.

2. Second Embodiment

[Photoconductor]

Figure 6:
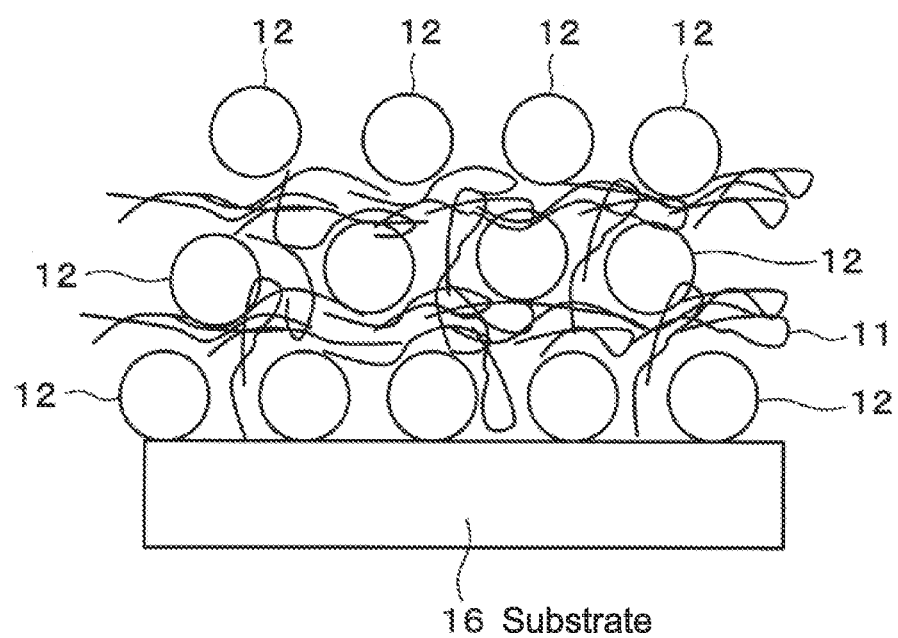
FIG. 6 is a schematic view illustrating the photoconductor of a second embodiment.

FIG. 6 shows the photoconductor in a second embodiment.

As shown in FIG. 6, the photoconductor contains the composite of a multilayer laminated protein 12 and a network-like conductive polymer and/or polymer semiconductor 11 formed on a substrate 16. Although a 3-layer laminate of protein 12 layers is shown as an example in FIG. 6, the lamination number of the protein 12 layer is not limited to 3 and selected properly, as necessary. The substrate 16 for use may be a substrate similar to that described in the first embodiment and is selected properly, as necessary.

Examples of the conductive polymer and/or polymer semiconductor 11, the protein 12 and the substrate 16 are shown below: The conductive polymer and/or polymer semiconductor 11 is, for example, p-type polyanilinesulfonic acid (PASA)

[Chemical Formula 18]

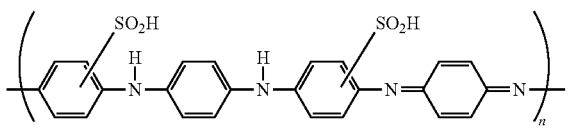

poly[2-methoxy-5-(2'-ethyl-hexyloxy)-1,4-phenylene vinylene (MEH-PPV)

[Chemical Formula 19]

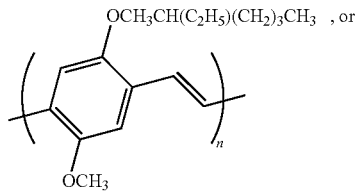

poly(3-hexylthiophene (P3HT)

[Chemical Formula 20]

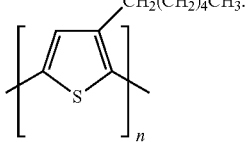

The n-type conductive polymer and/or polymer semiconductor for use may be, for example, poly(p-pyridyl vinylene)poly (isothianaphthene). An example of the protein 12 is zinc-substituted cytochrome c. An example of the substrate 16 is an indium-tin mixed oxide (ITO) substrate.

[Production Method for Photoconductor]

The production method for the photoconductor will be described below.

A polymer solution containing a conductive polymer and/or polymer semiconductor 11 in a solvent and a protein solution containing a protein 12 in the same solvent are prepared (for example, respectively at pH 5.0). The solvent for use may be, for example, water or an organic solvent and is selected properly, as necessary.

First, a first layer of the protein 12 is formed on the substrate 16, as the substrate 16 is immersed in the protein solution or coated with the protein solution and then the solvent is removed. Subsequently, the substrate 16 carrying the first layer protein 12 is immersed in the polymer solution or applied with the polymer solution. Electrostatic attractive force is then formed between the surface charge on the first layer protein 12 and the charge on the conductive polymer and/or polymer semiconductor 11 in the region carrying the charge opposite in polarity to the first layer, and the protein 12 and the conductive polymer and/or polymer semiconductor 11 are bound to each other by the electrostatic attractive force.

Subsequently after removal of the solvent, the substrate 16 having the first protein 12 layer and the conductive polymer and/or polymer semiconductor 11 layer formed thereon is additionally immersed in the protein solution, or applied with the protein solution. Electrostatic attractive force is generated then between the surface charge on the conductive polymer and/or polymer semiconductor 11 layer formed on the substrate 16 and the charge of the oppositely charged protein 12 layer, and the conductive polymer and/or polymer semiconductor 11 and the protein 12 thereon are bound to each other by the electrostatic attractive force. Subsequently after removal of the solvent, the conductive polymer and/or polymer semiconductor 11 is additionally formed similarly. The process is repeated for necessary times, forming a laminate having a desired number of the layers of the conductive polymer and/or polymer semiconductor 11 and the protein 12.

Other processes in the second embodiment are the same as those in the first embodiment. The production method of the second embodiment has advantages similar to those of the production method of the first embodiment.

3. Third Embodiment

[Photoelectric Conversion Element]

Figure 7:
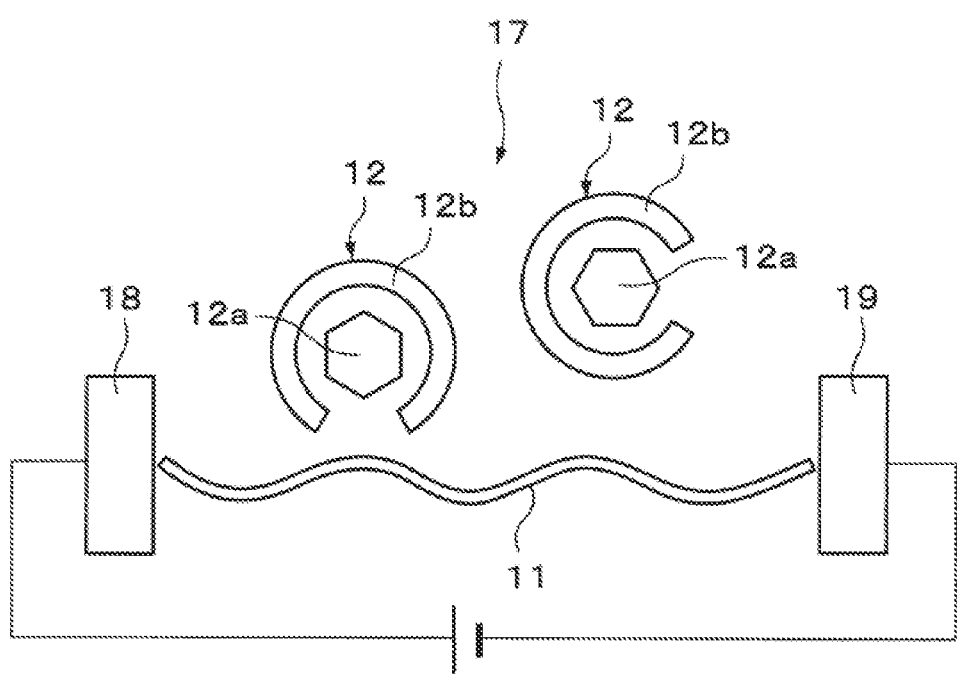
FIG. 7 is a schematic view illustrating a photoelectric conversion element of a third embodiment.

FIG. 7 shows a photoelectric conversion element in a third embodiment.

As shown in FIG. 7, in the photoelectric conversion element, the network-like conductive polymer and/or polymer semiconductor 11 in the photoconductor 17, which is similar to that in the first embodiment, is electrically connected to a first electrode 18 and a second electrode 19 at positions different from each other. For example, the photoconductor 17 is formed as it is formed both over the first electrode 18 and the second electrode 19, and the conductive polymer and/or polymer semiconductor 11 is electrically connected to the first electrode 18 and the second electrode 19 at positions where the photoconductor 17 is in contact with the first electrode 18 and the second electrode 19. The distance between the first electrode 18 and the second electrode 19 is not particularly limited and selected properly, as necessary, but it is, for example, 1 μm or more and 30 μm or less, typically 5 μm or more and 20 μm or less, for example 10 μm. Any known conductive material may be used as the material for the first electrode 18 and second electrode 19 and it is selected, as necessary. An example thereof for use is a pure metal or alloy of at least one metal selected from the group consisting of copper (Cu), silver (Ag), aluminum (Al), chromium (Cr), gold (Au), iron (Fe), nickel (Ni), titanium (Ti) and platinum (pt). In the case of the first electrode 18 and the second electrode 19 being formed transparent, examples of the transparent electrode materials for use include transparent metal oxides such as ITO (indium tin mixed oxide), FTO (fluorine-doped tin oxide) and NESA glass ($SnO_2$ glass); ultrathin metal films, such as Au film, that permit light transmission and the like. When the first electrode 18 and the second electrode 19 are formed transparent and the substrate is used in the following manner, it is possible to obtain a transparent photoelectric conversion element by making the substrate transparent.

For example for mechanical support of the photoelectric conversion element, the photoelectric conversion element is formed on a substrate, as necessary. Specifically, a photoconductor 17, a first electrode 18 and a second electrode 19 are formed on a substrate. Any known substrate may be used as the substrate, as it is selected as necessary, and it may be a transparent or opaque substrate. The material for transparent substrate is selected properly, as necessary, but it is, for example, a transparent inorganic material, such as quartz or glass, or a transparent plastic material. A transparent plastic substrate is used as the flexible transparent substrate. Examples of the transparent plastics include polyethylene terephthalate, polyethylene naphthalate, polycarbonate, polystyrene, polyethylene, polypropylene, polyphenylene sulfide, polyvinylidene fluoride, acetylcellulose, brominated phenoxy resins, aramides, polyimides, polystyrenes, polyarylates, polysulfones, polyolefins and the like. For example, a silicon substrate is used as the opaque substrate.

Figure 8:
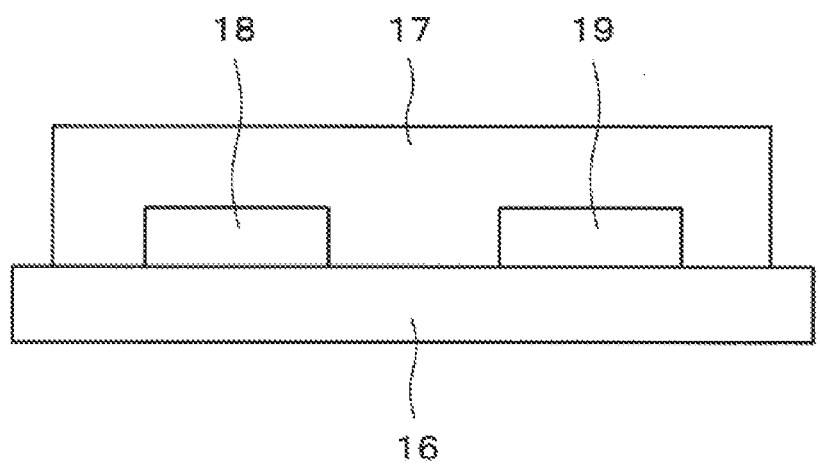
FIG. 8 is a cross-sectional view illustrating a typical configuration of the photoelectric conversion element of the third embodiment.

FIG. 8 shows a typical example of the configuration of the photoelectric conversion element. As shown in FIG. 8, in the photoelectric conversion element, a first electrode 18 and a second electrode 19 are formed, as separated from each other, on a substrate 16 and a photoconductor 17 is formed over both of the first electrode 18 and the second electrode 19.

[Production Method for Photoelectric Conversion Element]

The production method for the photoelectric conversion element will be described below.

First, a first electrode 18 and a second electrode 19 are formed on a substrate 16. For example for preparation of the first electrode 18 and second electrode 19, a film of a conductive material is formed and patterned on the substrate 16 by lithography and etching.

Then, a photoconductor 17 is formed on the substrate 16 carrying the first and second electrodes in a manner similar to the first embodiment, to give a desired photoelectric conversion element.

[Operation of Photoelectric Conversion Element]

Operation of the photoelectric conversion element will be described below with reference to FIG. 7.

In the photoelectric conversion element when it is not irradiated with light (in dark state), the conductive polymer and/or polymer semiconductor 11 and the protein 12 constituting the photoconductor 17 are both insulators, and thus the photoconductor 17 is an insulator.

On the other hand, when the photoconductor 17 of the photoelectric conversion element is irradiated with light having photon energy sufficient for excitation of the dye 12a of protein 12, the dye 12a is excited, giving electron-hole pairs (excitons). The electrons or holes of the electron-hole pairs thus generated are injected from the dye 12a into the conductive polymer and/or polymer semiconductor 11 through routes formed in the protein 12 (photodoping). When electrons or holes are injected in this way, the conductivity of the conductive polymer and/or polymer semiconductor 11 increases rapidly and the conductivity of the photoconductor 17 also increases rapidly. When bias voltage is applied between the first electrode 18 and the second electrode 19 then, the holes or electrons injected into the conductive polymer and/or polymer semiconductor 11 moves to the first electrode 18 or second electrode 19 that is lower or higher in electric potential, causing flow of the photocurrent between the first electrode 18 and the second electrode 19. For example when the bias voltage is applied between the first electrode 18 and the second electrode 19 so that the first electrode 18 becomes higher in electric potential, the holes injected into the conductive polymer and/or polymer semiconductor 11 move to the second electrode 19, causing flow of the photocurrent from the first electrode 18 to the second electrode 19. The amount of the photocurrent increases when the intensity of the light irradiated to the photoconductor 17 increases. When no bias voltage is applied between the first electrode 18 and the second electrode 19 (bias voltage=0), no photocurrent flows between the first electrode 18 and the second electrode 19 even if the photoconductor 17 is irradiated with light. The direction of the photocurrent flowing between the first electrode 18 and the second electrode 19 can be controlled by the polarity of the bias voltage applied between the first electrode 18 and the second electrode 19. When the intensity of the light entering into the photoconductor 17 is constant, the photocurrent flowing between the first electrode 18 and the second electrode 19 can be controlled by the wavelength of the incident light and the bias voltage applied between the first electrode 18 and the second electrode 19.

In this case, because the proteins 12 are insulated from each other by the shell polypeptides 12*b*, recombination of the electrons and the holes between the proteins 12 and disappearance thereof can be prevented. It is thus possible to increase the contribution to the photocurrent significantly by the electron-hole pairs generated in the dye 12*a* by the incident light to the photoconductor 17. It is also possible to reduce the amount of the leak current (dark current) flowing between the first electrode 18 and the second electrode 19 significantly in the dark state in which no light is irradiated to the photoconductor 17.

EXAMPLE

A photoelectric conversion element was prepared for photocurrent generation test.

Figure 9:
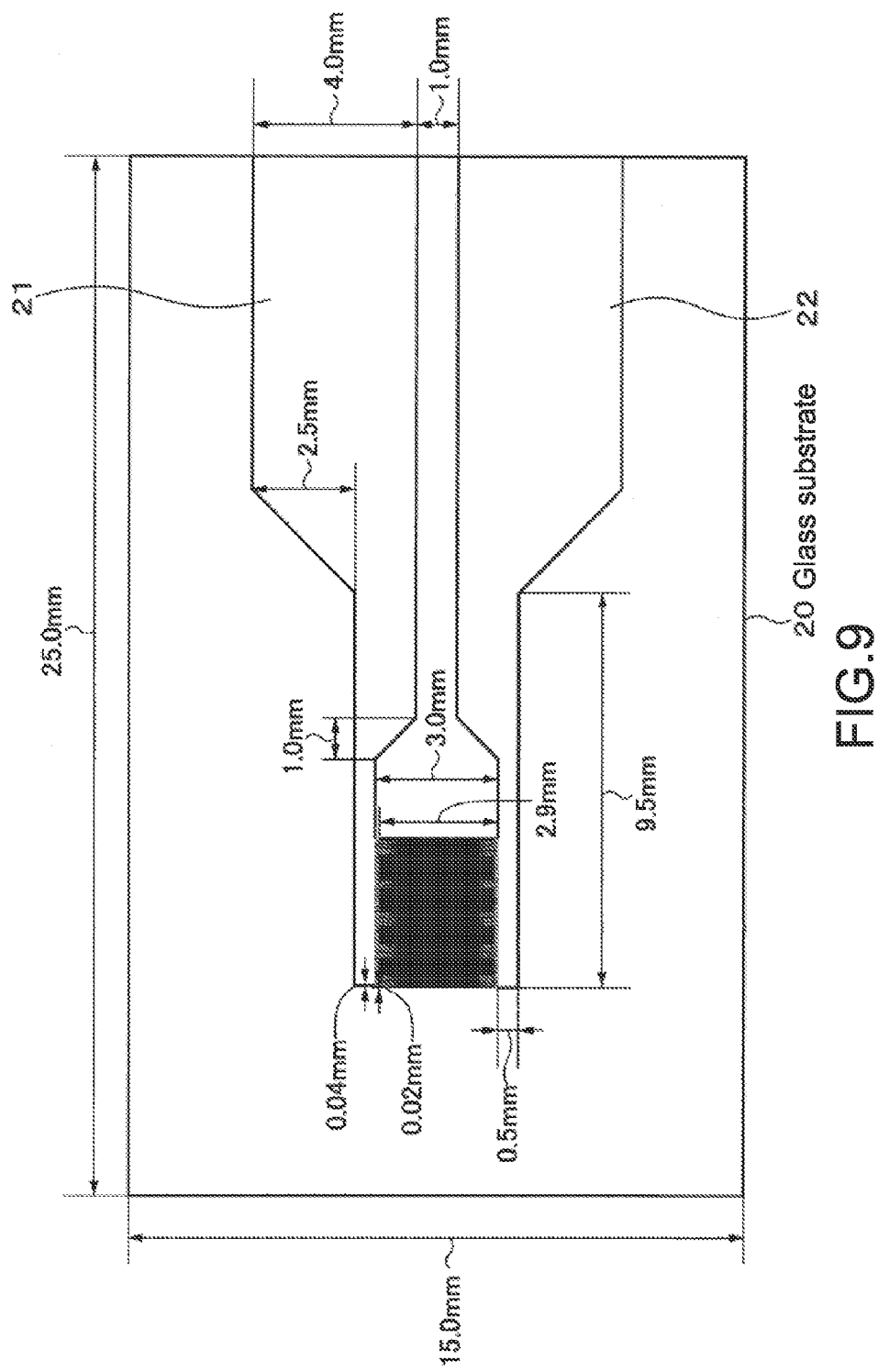
FIG. 9 is a top view illustrating the photoelectric conversion element used in a photocurrent-generating test in the third embodiment.
Figure 10:
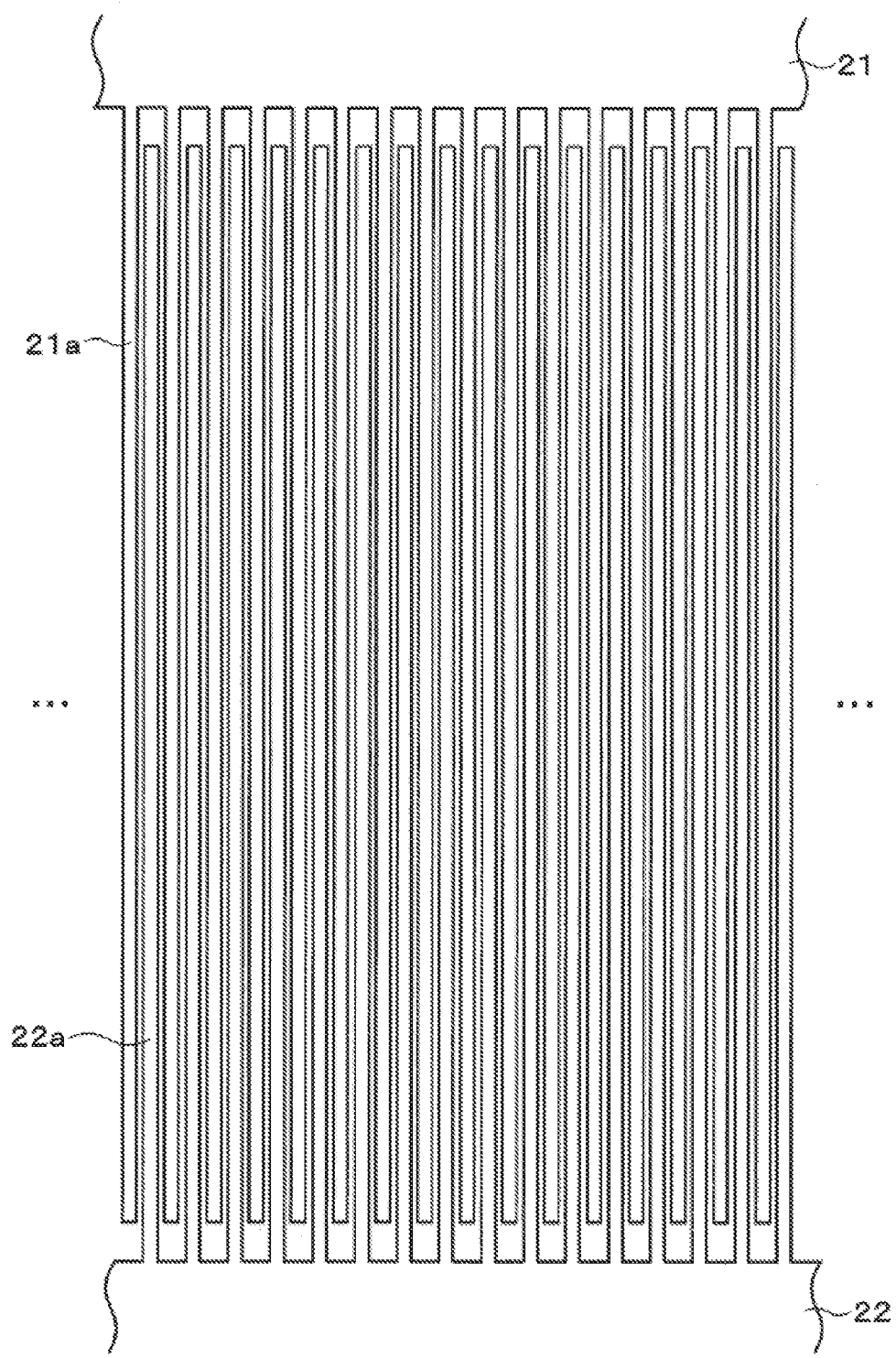
FIG. 10 is an expanded top view illustrating a comb-shaped electrode region of the photoelectric conversion element shown in FIG. 9.

The photoelectric conversion element was prepared in the following manner:

As shown in FIG. 9, a pair of ITO electrodes 21 and 22 in a particular shape was formed on a glass substrate 20 having a size of 15 mm×25 mm and a thickness of 1 mm. The ITO electrodes 21 and 22 correspond to the first electrode 18 and the second electrode 19. The dimension of the ITO electrodes 21 and 22 is as shown in FIG. 9. The thickness of the ITO electrodes 21 and 22 is 100 nm. As shown in FIG. 10, the ITO electrodes 21 and 22 have respectively comb-shaped electrode regions 21*a* and 22*a* in the terminal regions, and these comb-shaped electrode regions 21*a* and 22*a* are placed at positions facing each other at a particular distance, as they are engaged with each other. The electrode pitch in each of the comb-shaped electrode regions 21*a* and 22*a* is 20 μm, and the distance between the electrodes is 10 μm. The total area of the comb-shaped electrode regions 21*a* and 22*a* is 4 mm×4 mm(=16 mm$^2$).

The central metal iron of the equine cardiac muscle cytochrome c is substituted with zinc, to give a zinc-substituted cytochrome c. The zinc-substituted cytochrome c was dissolved in water, to give 0.73 mM protein solution. Separately, polyanilinesulfonic acid (PASA) was dissolved in water, to give 5.1 mg/mL PASA solution.

The PASA solution thus prepared was neutralized with sodium hydroxide (NaOH), to give a PASA sodium salt solution. The PASA sodium salt is represented by the following Formula:

[Chemical Formula 21]

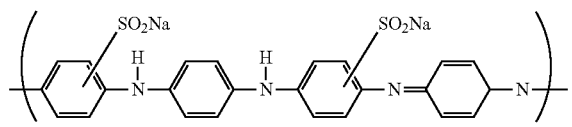

The PASA sodium salt solution thus prepared was then added to the protein solution, to give an aqueous protein-polymer solution. The weight ratio of the zinc-substituted cytochrome c to PASA sodium salt in the aqueous protein-polymer solution is 10:1. The concentration of the zinc-substituted cytochrome c in the aqueous protein-polymer solution was approximately 0.6 mM. The aqueous protein-polymer solution thus prepared was then applied on the comb-shaped electrode regions 21*a* and 22*a* by dipping method. After dipping, the ITO electrodes 21 and 22 were held under vacuum for approximately 3 hours for removal of water. The ITO electrodes 21 and 22 were then stored in a drying container overnight before the test.

Figure 11:
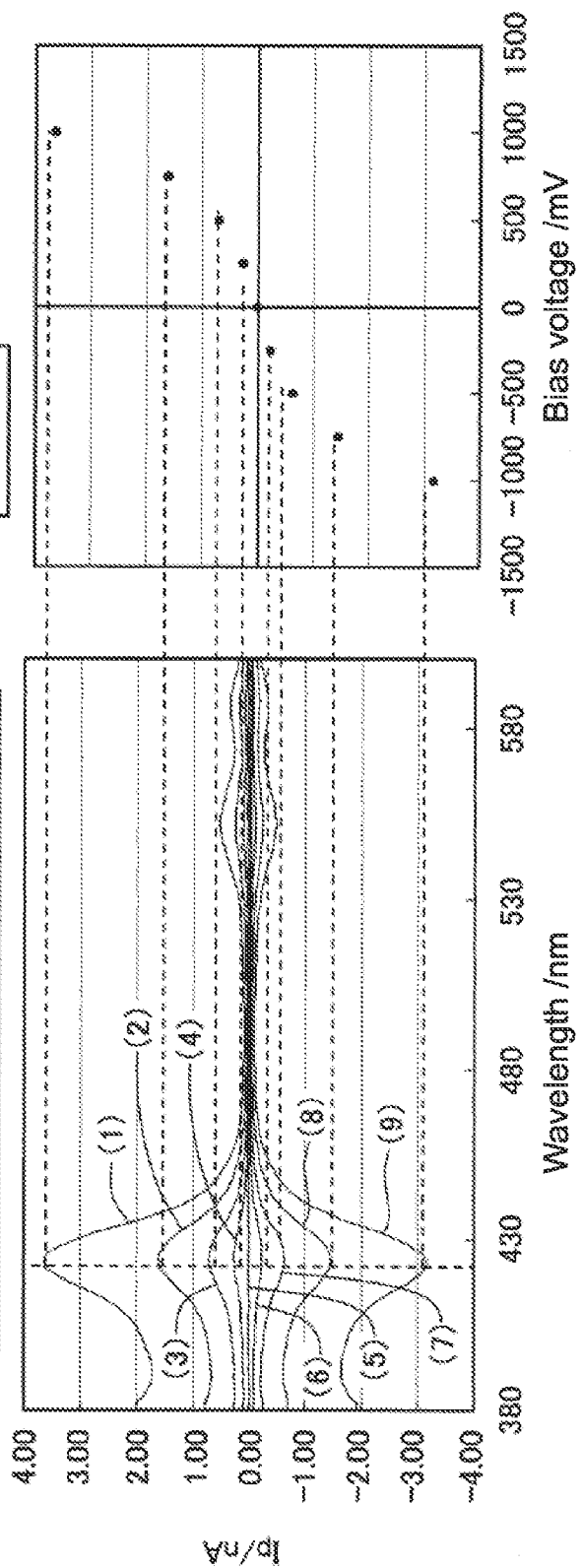
FIG. 11 is a schematic chart showing the results of measuring the photocurrent action spectrum of the photoelectric conversion element shown in FIG. 9 and also showing the bias voltage dependence of photocurrent.

The photocurrent action spectrum of the photoelectric conversion element was determined at a wavelength of 380 to 600 nm at room temperature. The voltage applied between the ITO electrodes 21 and 22 was changed from −1000 mV to +1000 mV at an interval of 250 mV. The photocurrent action spectrum obtained is shown in Graph A of FIG. 11. The maximum values of the photocurrent action spectrum are found at wavelengths of 408, 540 and 578 nm, similarly to the absorption spectrum of the zinc-substituted cytochrome c solution, indicating that the change in conductivity is caused by the zinc-substituted cytochrome c. Dependence of the photocurrent $I_p$ on bias voltage when the wavelength was left constant at 408 nm is shown in Graph B of FIG. 11. The bias voltage dependence shown in Graph B of FIG. 11 shows the property of the photoconductor. The bias voltage dependence shown in Graph B of FIG. 11 also shows that the sensitivity of the photoelectric conversion element to light can be altered by adjustment of the bias voltage. It is thus possible to prevent saturation of the amplifier, for example, by increasing the sensitivity by increase of bias voltage for detection of weak light and decreasing the sensitivity by decrease of bias voltage alternatively for detection of strong light.

A comparative test was performed for examination of the advantages of using a dye 12*a*-containing protein 12 in the photoconductor 17. For the purpose, a sample containing the complex of a conductive polymer and/or polymer semiconductor 11 and a dye 12*a* formed on comb-shaped electrode regions 21*a* and 22*a* (sample 1) and a sample containing the complex of a conductive polymer and/or polymer semiconductor 11 and a protein 12 formed on comb-shaped electrode regions 21*a* and 22*a* (sample 2) were prepared.

The sample 1 containing the complex of a conductive polymer and/or polymer semiconductor 11 and a dye 12*a* formed on comb-shaped electrode regions 21*a* and 22*a* was prepared in the following manner:

A dye 12*a* zinc protoporphyrin (ZPP) was dissolved in 1-methyl-2-pyrrolidone (NMP), to give 2 mg/mL dye solution. Separately, polyaniline (PANI) was dissolved in NMP, to give 2 mg/mL PANI solution. Then, the PANI solution was added to the dye solution, to give an aqueous dye-polymer solution. The weight ratio of ZPP to PANI in the aqueous dye-polymer solution is 10:1. The aqueous dye-polymer solution thus prepared was then diluted to a PANI concentration of 0.24 mg/mL and the resulting solution was applied on comb-shaped electrode regions 21*a* and 22*a* by dipping method. After dipping, the ITO electrodes 21 and 22 were held under vacuum for 48 hours for removal of water and NMP. The ITO electrodes 21 and 22 were then stored in a drying container overnight before test.

The sample 2 containing the complex of a conductive polymer and/or polymer semiconductor 11 and protein 12 formed on comb-shaped electrode regions 21*a* and 22*a* was prepared in the following manner:

Zinc-substituted cytochrome c was dissolved in water, to give 0.73 mM protein solution. Separately, polyaniline (PANI) was dissolved in NMP, to give 2 mg/mL PANI solution. The PANI solution was then added to the protein solution, to give an aqueous protein-polymer solution. The weight ratio of the zinc-substituted cytochrome c to PANI in the aqueous protein-polymer solution is 10:1. The aqueous protein-polymer solution thus prepared was then diluted to a PANI concentration of 0.24 mg/mL and the resulting solution was applied on comb-shaped electrode regions 21*a* and 22*a* by dipping method. After dipping, the electrodes were held under vacuum for 48 hours for removal of water and NMP. The ITO electrodes 21 and 22 were then stored in a drying container overnight before test.

Figure 12:
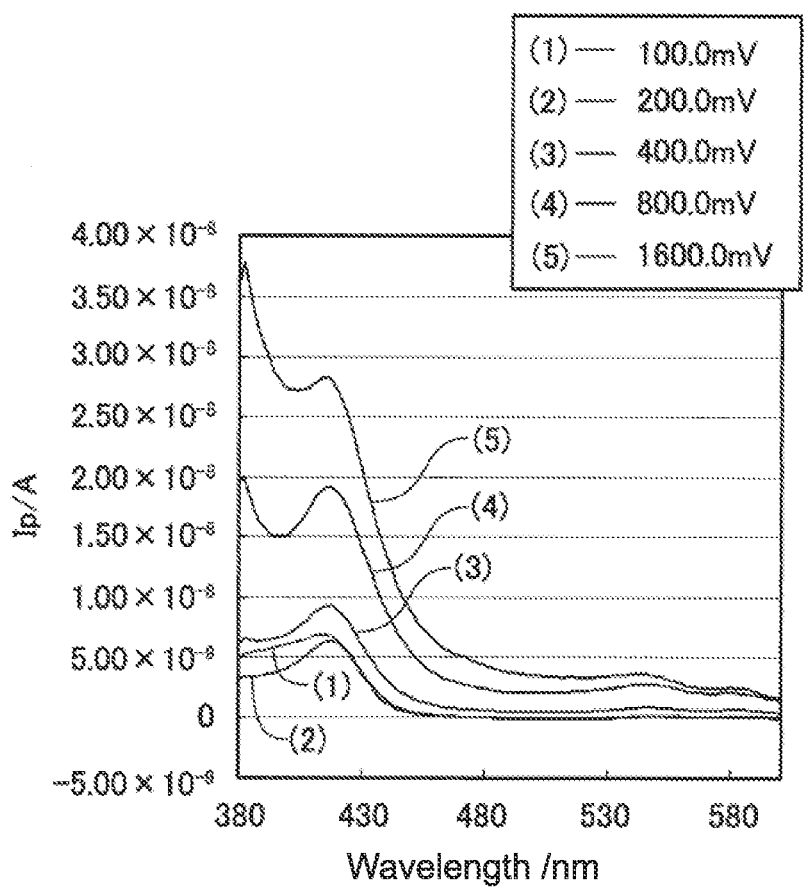
FIG. 12 is a schematic chart showing the results of measuring the photocurrent action spectrum of the complex of zinc protoporphyrin and polyaniline.
Figure 13:
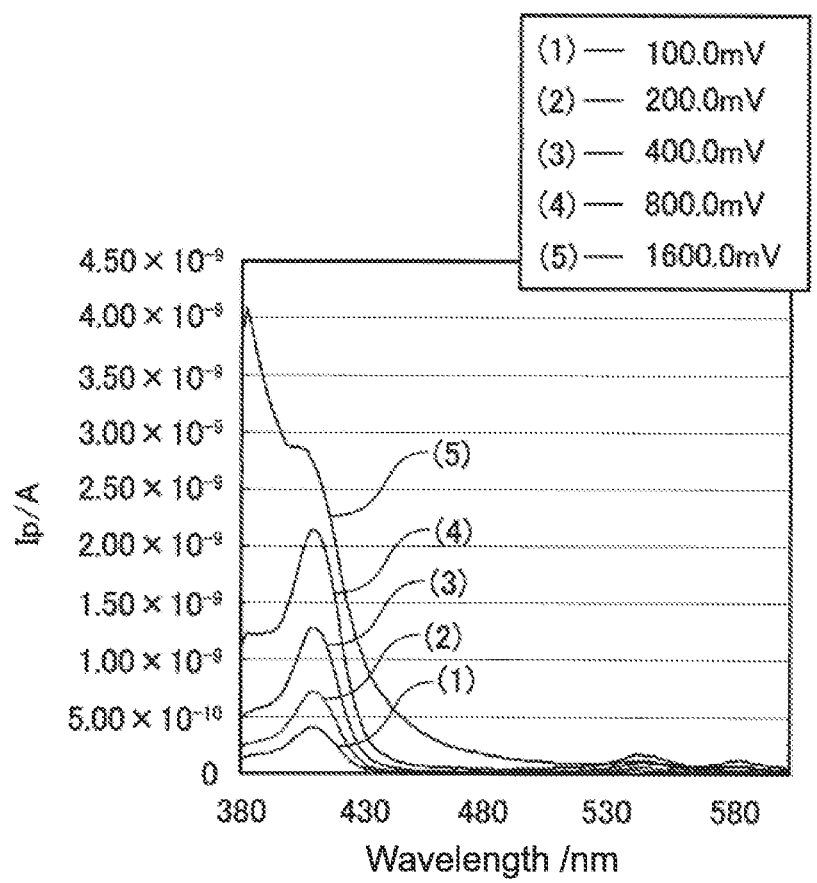
FIG. 13 is a schematic chart showing the results of measuring the photocurrent action spectrum of the complex of zinc-substituted cytochrome c and polyaniline.

Photocurrent action spectra of the samples 1 and 2 were determined at room temperature at a wavelength of 380 to 600 nm. The voltage applied between the ITO electrodes 21 and 22 was changed at 100 mV, 200 mV, 400 mV, 800 mV or 1600 mV. The photocurrent action spectra obtained for samples 1 and 2 are shown respectively in FIGS. 12 and 13. As shown in FIG. 12, there are a peak in the Soret band (428 nm) and peaks in the Q band (550 nm and 580 nm) observed in sample 1. As shown in FIG. 13, there are a peak in the Soret band (408 nm) and peaks in the Q band (550 nm and 580 nm) observed in sample 2.

Figure 14A:
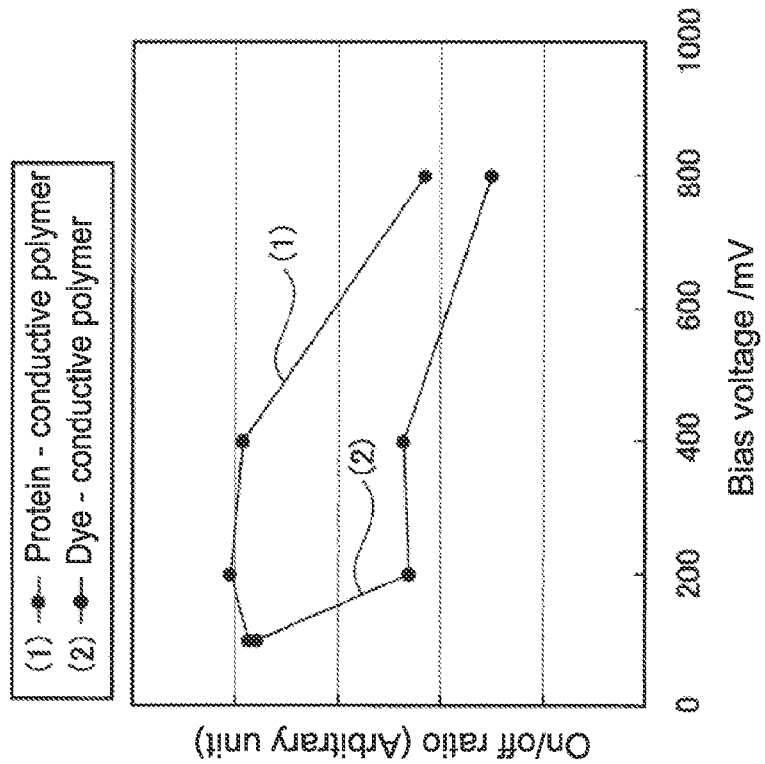
FIG. 14 are schematic charts showing the photocurrents and on/off ratios of the complex of zinc protoporphyrin and polyaniline and the complex of zinc-substituted cytochrome c and polyaniline, as they are compared to each other.
Figure 14B:
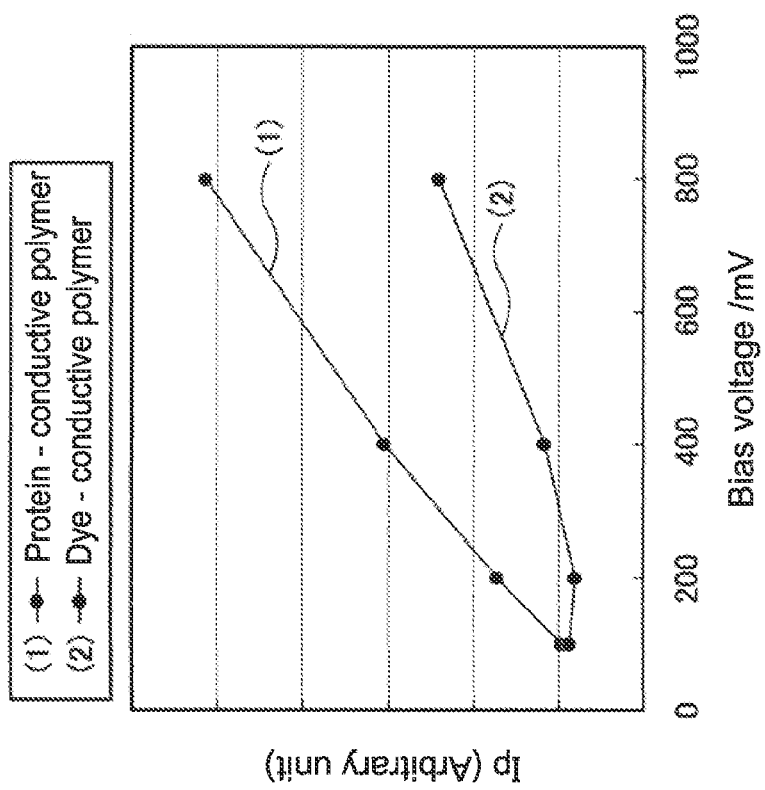

Dependence of the photocurrent $I_p$ obtained from the sample 1 or 2 on the bias voltage is shown in FIG. 14A, and dependence of the on/off ratio of sample 1 or 2 on bias voltage is shown in FIG. 14B. As obvious from FIGS. 14A and 14B, the sample 2 containing the complex of a conductive polymer and/or polymer semiconductor 11 and a protein 12 was much superior both in photocurrent value and on/off ratio to the sample 1 containing the complex of a conductive polymer and/or polymer semiconductor 11 and a dye 12a.

Figure 15:
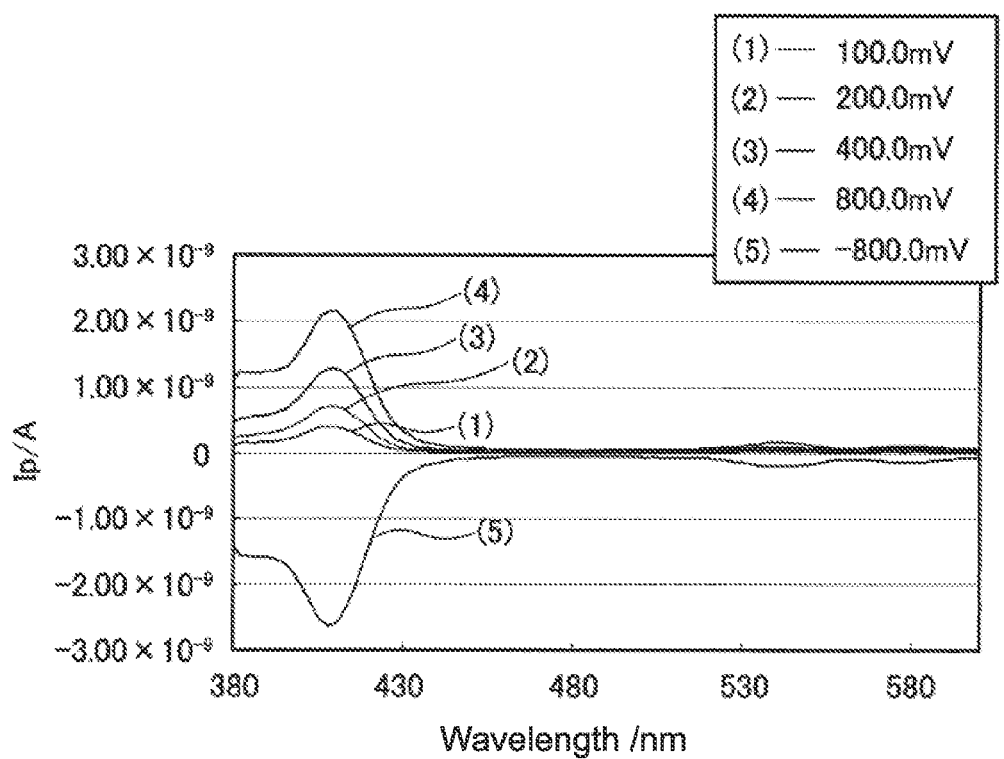
FIG. 15 is a schematic chart showing the results of measuring the photocurrent action spectrum of the complex of zinc-substituted cytochrome c and polyaniline.

For examination of the behavior of the sample 2 containing a photoconductor 17 containing the complex of a conductive polymer and/or polymer semiconductor 11 and protein 12 when positive or negative bias voltage is applied thereto, a bias voltage of −800 mV to +800 mV was applied between the ITO electrodes 21 and 22. The photocurrent action spectrum obtained is shown in FIG. 15. As obvious from FIG. 15, the photocurrent is oppositely directed and symmetrical when the bias voltage applied between the ITO electrodes 21 and 22 is +800 mV or −800 mV.

(Application to Photosensor Array)

Examples of application of the photoelectric conversion element to photosensor array will be described.

Figure 16A:
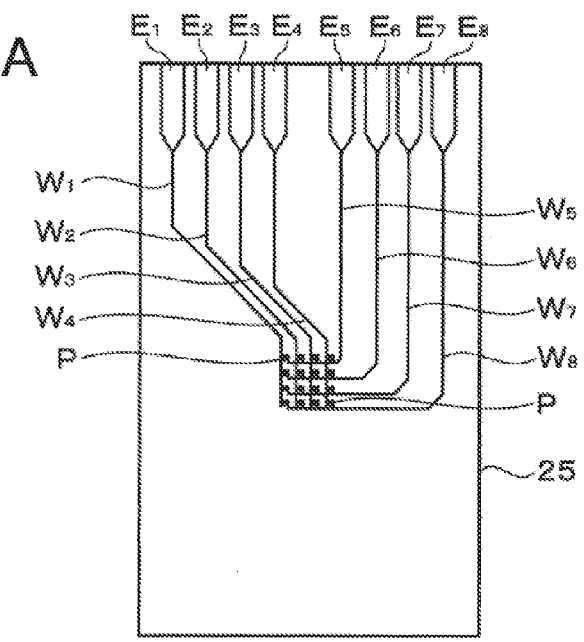
FIG. 16A is a top view thereof and FIG. 16B is a partially expanded top view of FIG. 16A.
Figure 16B:
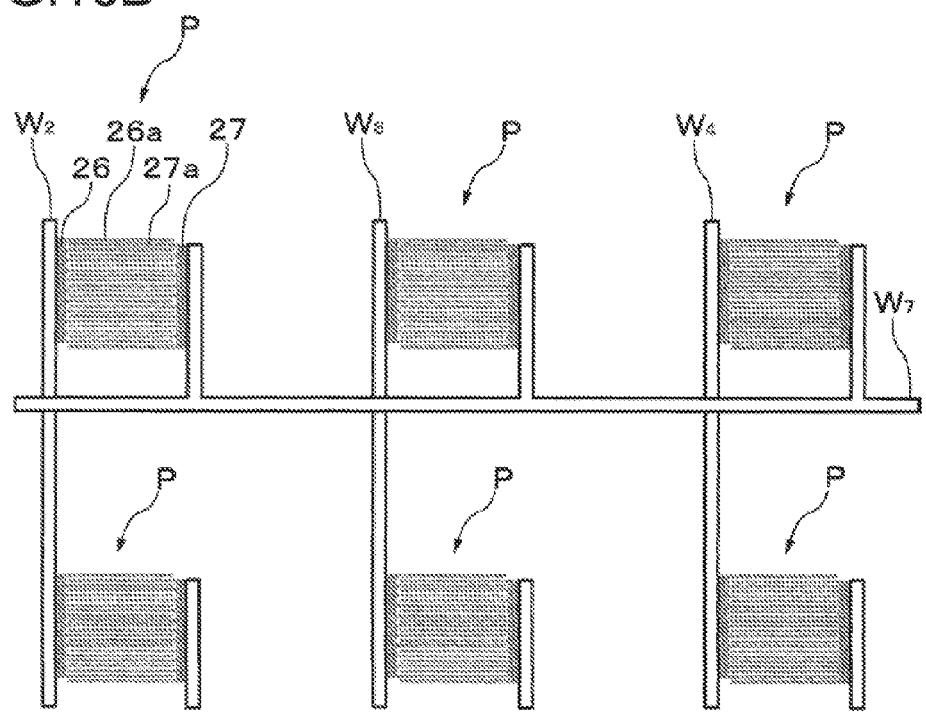

FIG. 16A shows such a photosensor array. As shown in FIG. 16A, the photosensor array has photosensors P formed in the two-dimensional array (matrix) shape on a substrate 25 such as glass substrate. Here, a photosensor array containing total 16 photosensors P in the 4×4 arrangement will be described, but the configuration of the photosensor array is not limited thereto, and the arrangement and the number of the photosensors P are selected properly, as necessary. An expanded view of each photosensor P is shown in FIG. 16B. As shown in FIG. 16B, in each photosensor P, the comb-shaped electrode regions 26a and 27a of the electrodes 26 and 27, for example made of ITO, are engaged, facing each other at a particular distance. Although not shown in Figure, in each photosensor P, a photoconductor 17 is formed, as it covers the comb-shaped electrode regions 26a and 27a and as it is electrically connected to these comb-shaped electrode regions 26a and 27a. As shown in FIG. 16A, the electrode 26 of each photosensor P in the first column is connected to a wire $W_1$; the electrode 26 of each photosensor P in the second column is connected to a wire $W_2$; the electrode 26 of each photosensor P in the third column is connected to a wire $W_3$; and the electrode 26 of each photosensor P in the fourth column is connected to a wire $W_4$. In addition, the electrode 27 of each photosensor P in the first row is connected to a wire $W_5$; the electrode 27 of each photosensor P in the second row is connected to a wire $W_6$; the electrode 27 of each photosensor P in the third row is connected to a wire W7; the electrode 27 of each photosensor P in the fourth row is connected to a wire $W_8$. Wires $W_1$ to $W_4$ are connected respectively to electrodes $E_1$ to $E_4$. Alternatively, wires $W_5$ to $W_8$ are connected respectively to electrodes $E_5$ to $E_8$. The shape and size of the substrate 25 are selected properly as necessary but for example, the shape is rectangular and the size is 15 mm×25 mm. The distance between neighboring two photosensors P is also selected properly, as necessary, but it is, for example, 0.2225 mm. The material for the wires $W_1$ to $W_8$ and the electrodes $E_1$ to $E_8$ is selected properly, as necessary, but it is, for example, Al, Cr, Au or the like. (Example of adding other polymers, in addition to the conductive polymer and/or polymer semiconductor 11, to photoconductor 17)

For examination of the influence when other polymers are added in addition to the conductive polymer and/or polymer semiconductor 11, MEH-PPV was used as the conductive polymer and/or polymer semiconductor 11 and PMMA represented by the following structural formula was used as the other polymer.

[Chemical Formula 22]

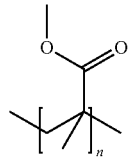

Figure 17:
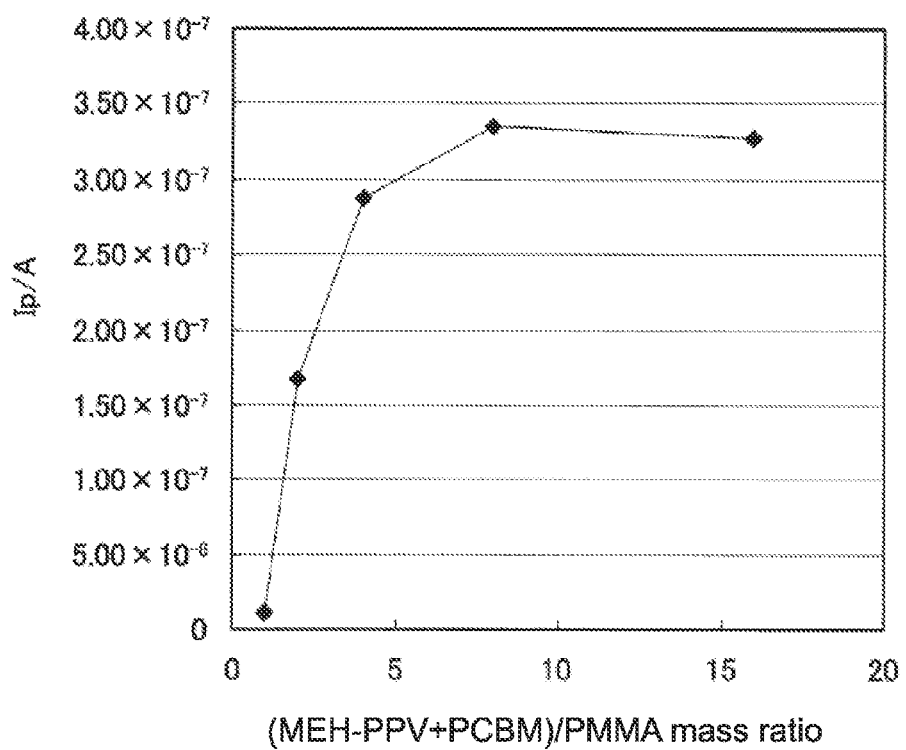
FIG. 17 is a schematic chart showing the results of measuring the photocurrent of a photoelectric conversion element prepared by using a photoconductor produced from a conductive polymer and/or polymer semiconductor and other additional polymers.

For convenience in experiment, [6,6]-phenyl-C61-butyric acid methyl ester (PCBM) was used, replacing the protein 12. A photoconductor was prepared by using these MEH-PPV, PMMA and PCBM. Because use of PCBM permits drying of the photoconductor at a temperature of 150° C. or higher during its production, it can shorten the period necessary for production of the photoconductor significantly. A photoelectric conversion element similar to that shown in FIG. 9 was prepared by using the photoconductor. Photoconductors and also photoelectric conversion elements were prepared as the addition amount of PMMA was altered. Light at a wavelength of 550 nm was irradiated and the photocurrent $I_p$ was determined, as a bias voltage of 8 V was applied between the ITO electrodes 21 and 22 of these photoelectric conversion elements. The results are shown in FIG. 17. The abscissa in FIG. 17 shows the weight ratio of (MEH-PPV+PCBM) in the PMMA in the photoconductor. As obvious from FIG. 17, when the (MEH-PPV+PCBM)/PMMA mass ratio is approximately 8 or more, in other words when the mass rate of PMMA in the photoconductor is approximately 11% or less, the photocurrent $I_p$ is almost constant and there is no decrease in photocurrent $I_p$ observed by addition of PMMA.

As described above, it is possible in the third embodiment to obtain a novel photoelectric conversion element by using the novel photoconductor 17 described in the first embodiment. The photoelectric conversion element, which prevents recombination of electrons and holes between the proteins 12 in photoconductor 17 and disappearance thereof, has high photoelectric conversion efficiency, compared to photodiodes in the past. In addition, although photodiodes in the past have a photoelectric conversion efficiency of up to 100%, the photoelectric conversion element can have a photoelectric conversion efficiency of more than 100%. Further, although it was not possible to adjust the photoelectric conversion efficiency of photodiodes in the past, because they are operated under reverse bias, it is possible to adjust the photoelectric conversion efficiency of the photoelectric conversion element easily by the bias voltage applied between the first electrode 18 and the second electrode 19. It is also possible to reduce the dark current significantly in the photoelectric conversion element. Because it is possible to make the photoconductor 17 flexible, it is also possible to make the photoelectric conversion element flexible, and even when a substrate is used, it is possible to make the photoelectric conversion element flexible by using a flexible substrate. The shape and size of the photoconductor 17 may be selected arbitrarily; the shape and size of the photoelectric conversion element can also be determined arbitrarily; and thus, a large-area photoelectric conversion element can also be prepared easily.

4. Fourth Embodiment

[Multilayer Transparent Photoelectric Conversion Element]

Figure 18:
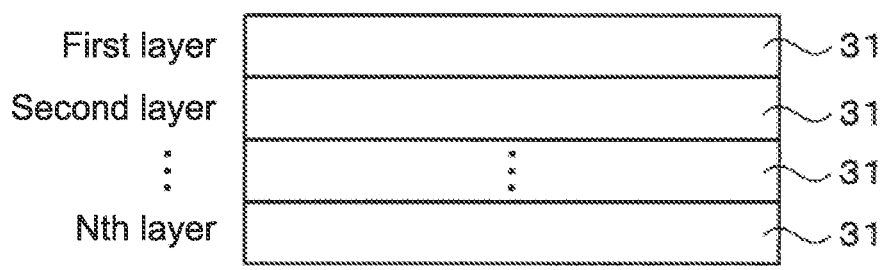
FIG. 18 is a schematic view illustrating a multilayer transparent photoelectric conversion element of a fourth embodiment.
Figure 19:
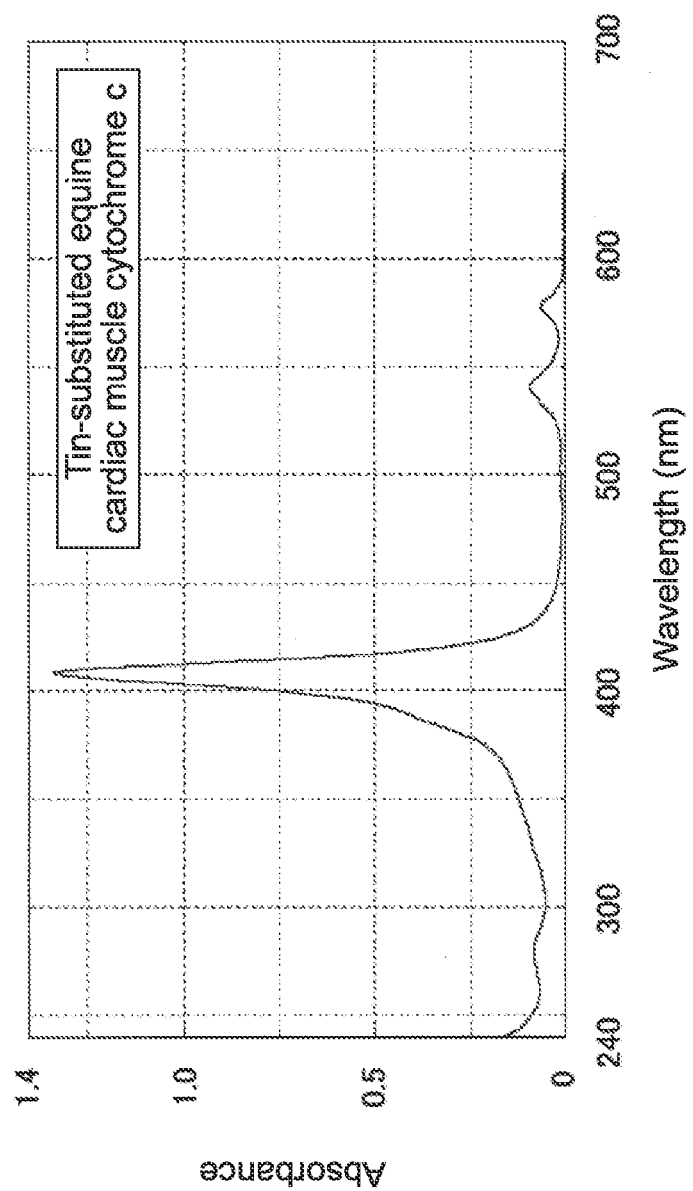
FIG. 19 is a schematic chart showing the results of measuring the ultraviolet-visible absorption spectrum of the tin-substituted equine cardiac muscle cytochrome c used in the transparent photoelectric conversion element constituting the multilayer transparent photoelectric conversion element of a fifth embodiment.
Figure 20:
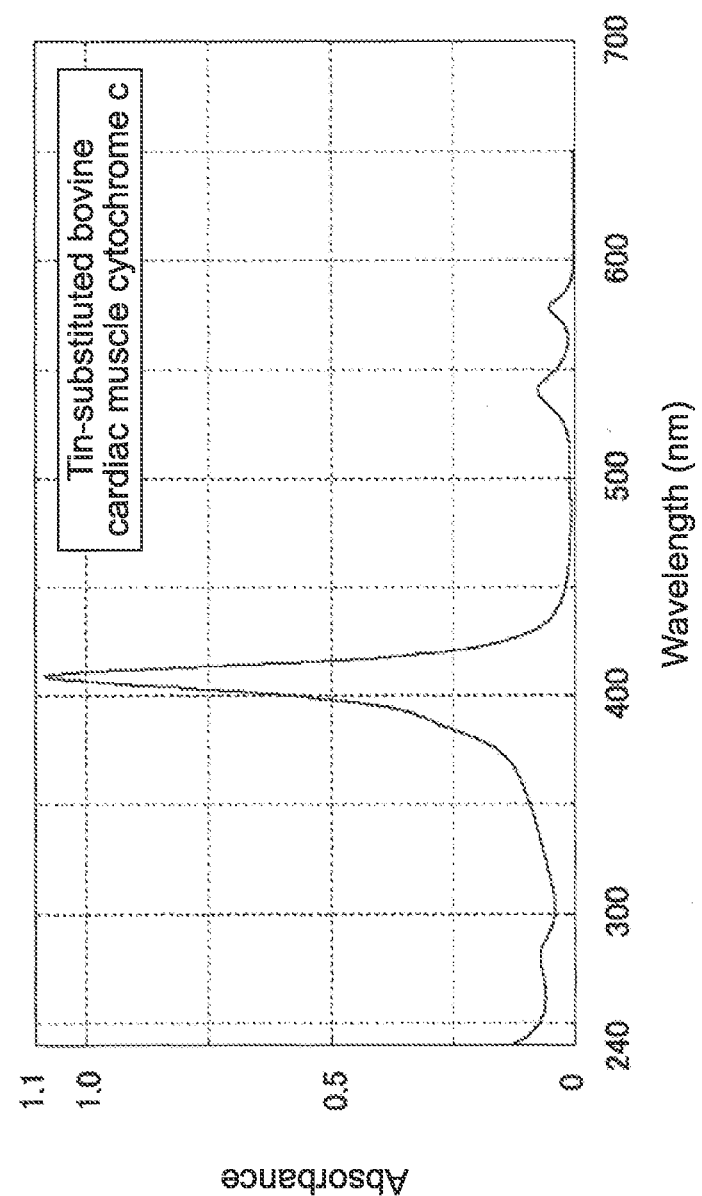
FIG. 20 is a schematic chart showing the results of measuring the ultraviolet-visible absorption spectrum of the tin-substituted bovine cardiac muscle cytochrome c used in the transparent photoelectric conversion element constituting the multilayer transparent photoelectric conversion element of the fifth embodiment.
Figure 21:
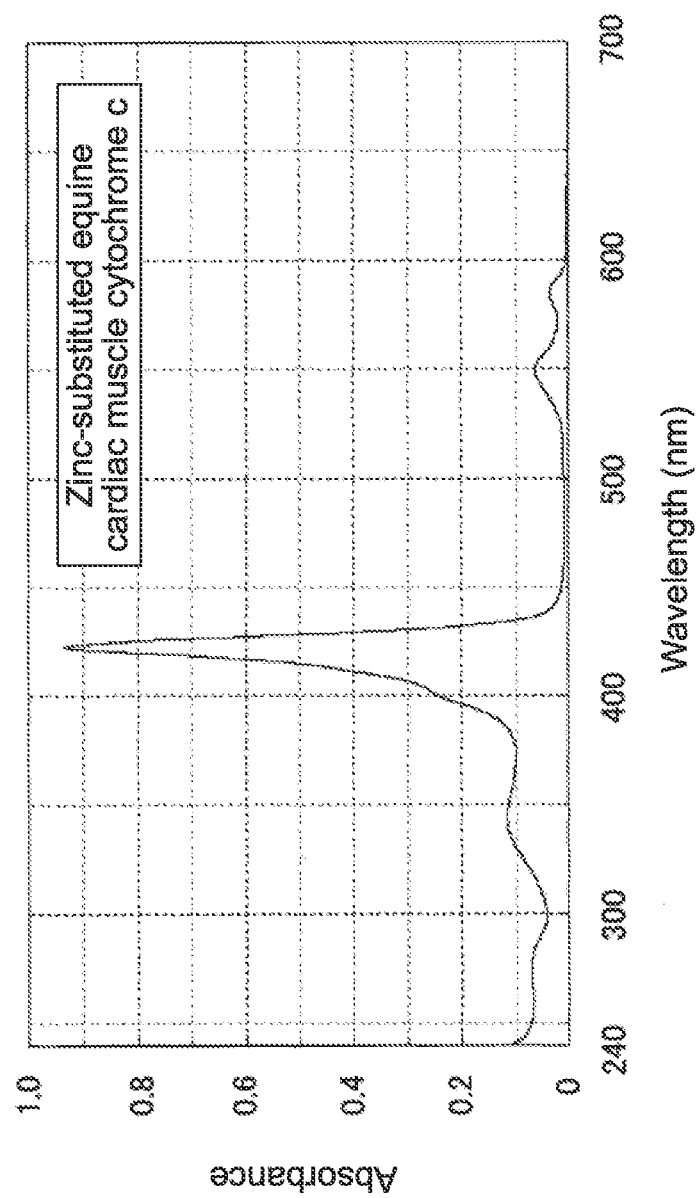
FIG. 21 is a schematic chart showing the results of measuring the ultraviolet-visible absorption spectrum of zinc-substituted equine cardiac muscle cytochrome c.
Figure 22:
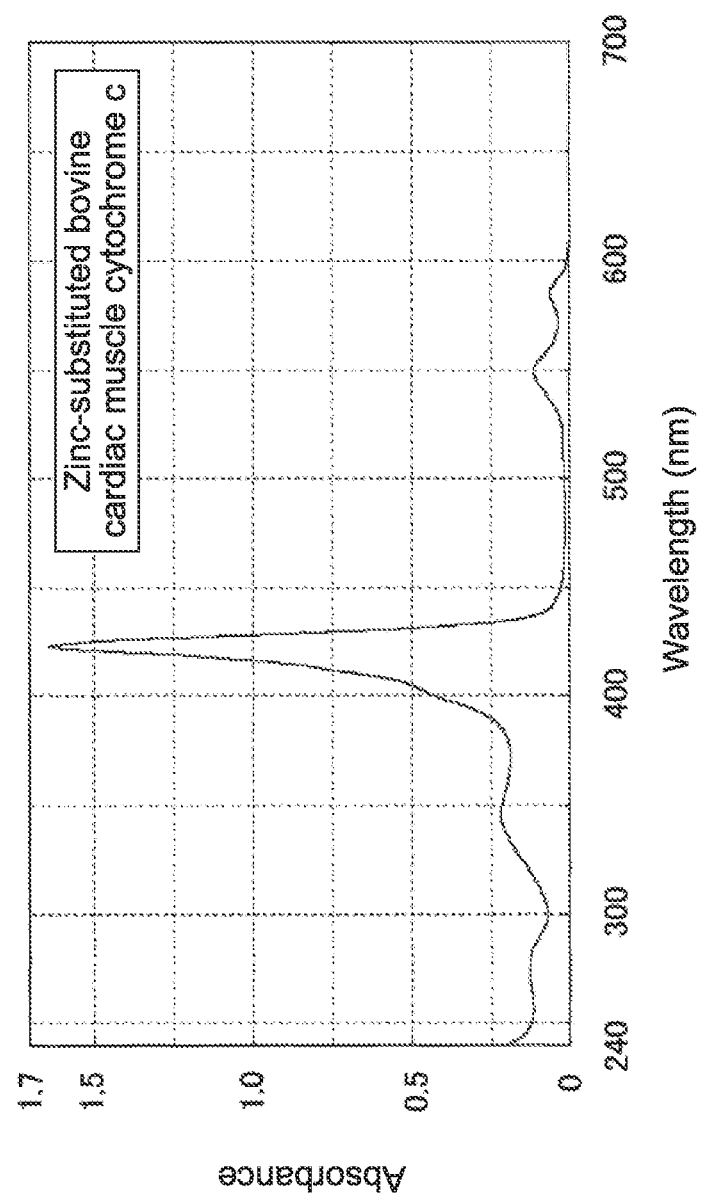
FIG. 22 is a schematic chart showing the results of measuring the ultraviolet-visible absorption spectrum of zinc-substituted bovine cardiac muscle cytochrome c.

FIG. 18 shows the multilayer transparent photoelectric conversion element in the fourth embodiment.

As shown in FIG. 18, the multilayer transparent photoelectric conversion element has N layers (N is an integer of 2 or more) of transparent photoelectric conversion elements 31 that are laminated. The transparent photoelectric conversion element 22 has a configuration similar to that of the photoelectric conversion element in the third embodiment, in which the first electrode 18 and second electrode 19 are transparent and, if the electrodes are formed on a substrate, the substrate is also transparent. The number N of the laminated layers of the transparent photoelectric conversion elements 31 may be selected properly according to the applications of the multilayer transparent photoelectric conversion element. In addition, the planar shape, size and thickness of the multilayer transparent photoelectric conversion element and the transparent photoelectric conversion element 31 can also be determined properly.

In FIG. 18, each transparent photoelectric conversion element 31 is shown to have a flat-surfaced shape, but the surface shape of each transparent photoelectric conversion element 31 is arbitrary and may be, for example, bent, protruded, or irregular.

[Production Method for Multilayer Transparent Photoelectric Conversion Element]

In production of the multilayer transparent photoelectric conversion element, a desired number of transparent photoelectric conversion elements 31 are laminated and the transparent photoelectric conversion elements 31 are bonded to each other then, for example, with a transparent adhesive, as necessary.

[Operation of Multilayer Transparent Photoelectric Conversion Element]

When light at a wavelength suitable for the dye 12a in protein 12 enters into the photoconductor 17 in each transparent photoelectric conversion element 31 of the multilayer transparent photoelectric conversion element, electron-hole pairs are generated in the dye 12a by photoexcitation and the electrons or holes are injected into the conductive polymer and/or polymer semiconductor 11. The photocurrent is withdrawn to external devices from the first electrode 18 and the second electrode 19.

It is possible in the fourth embodiment to prepare a multilayer transparent photoelectric conversion element in which multiple novel transparent photoelectric conversion elements 31 each containing the photoconductor 17 are laminated.

The multilayer transparent photoelectric conversion element can be used in various apparatuses and devices that use photoelectric conversion, specifically, for example, as electronic apparatuses having a light-receiving unit. Such an electronic apparatus is fundamentally arbitrary and may be portable or stationary. For example as will be described below, it is possible to provide a camera that can focus on multiple objects placed at different positions simultaneously by using a single lens. It means that it is possible to obtain information constituting an 3D image at once with a single lens and thus, the multilayer transparent photoelectric conversion element can provide a simpler and more compact stereo camera. In addition, such a multilayer transparent photoelectric conversion element, when used, permits multi-focusing and high-speed focusing with a single lens. It is also possible to read out a multilayer optical disk in parallel and to read out a holographic recording medium easily, by using the multilayer transparent photoelectric conversion element as a light-receiving element for optical disk systems using a multilayer optical disk and optical recording and reproducing systems using a holographic recording medium.

5. Fifth Embodiment

[Multilayer Transparent Photoelectric Conversion Element]

The multilayer transparent photoelectric conversion element in the fifth embodiment has a configuration similar to that of the multilayer transparent photoelectric conversion element in the fourth embodiment, except that a novel electron transfer protein is used as the protein 12 of the transparent photoelectric conversion element 31.

The novel electron transfer protein is a tin-substituted mammal cytochrome c in which the hem central metal iron of the mammal cytochrome c is replaced with tin or a tin-containing protein derived from mammal-derived cytochrome c in which one or more amino acids of the amino acid sequence are deleted, substituted or added. Examples of the mammal cytochrome c's include equine and bovine cardiac muscle cytochrome c's. These novel electron transfer proteins are highly stable to photoirradiation and retain their photoelectric conversion function over an extended period of time.

Details and production method of the tin-substituted cytochrome c will be described below.

(Tin-Substituted Cytochrome c)

Table 1 shows the amino acid sequences (in one-letter code) of equine cardiac muscle cytochrome c (referred to as CYC_HORSE) and bovine cardiac muscle cytochrome c (referred to as CYC_BOVIN). As shown in Table 1, the bovine and equine cardiac muscle cytochrome c's are different from each other only by 3 residues in all 104 amino acid residues. Thr47, Lys60 and Thr89 in the equine cardiac muscle cytochrome c are replaced respectively with Ser47, Gly60 and Gly89 in bovine cardiac muscle cytochrome c.

TABLE 1

| sp: CYC_HORSE_001 | GDVEKGKKIFVQKCAQCHTVEKGGKHKTGP |
|---|---|
| sp: CYC_BOVIN_001 | GDVEKGKKIFVQKCAQCHTVEKGGKHKTGP<br>                            47                 60 |
| sp: CYC_HORSE_031 | NLHGLFGRKTGQAPGF<u>T</u>YTDANKNKGIT<u>WK</u> |
| sp: CYC_BOVIN_031 | NLHGLFGRKTGQAPGF<u>S</u>YTDANKNKGIT<u>WG</u><br>                                           89 |
| sp: CYC_HORSE_061 | EETLMEYLENPKKYIPGTKMIFAGIKKK<u>TE</u> |
| sp: CYC_BOVIN_061 | EETLMEYLENPKKYIPGTKMIFAGIKKK<u>GE</u> |
| sp: CYC_HORSE_091 | REDLIAYLKKATNE 104 |
| sp: CYC_BOVIN_091 | REDLIAYLKKATNE 104 |

Bovine cardiac muscle cytochrome c is known to be high in stability of its protein region to heat and modifying agent (guanidine hydrochloride salt), compared to equine cardiac muscle cytochrome c (McLendon, G. and Smith, M. J. Biol. Chem. 253, 4004 (1978), and Moza, B. and 2 others, Biochim. Biophys. Acta 1646, 49 (2003), hereinafter referred to as Non-patent Documents 1 and 2, respectively). Table 2 shows the denaturation midpoint temperature $T_{1/2}$ and the denaturation midpoint concentration $[Gdn-HCl]_{1/2}$ of equine and bovine cardiac muscle cytochrome c's. The denaturation midpoint temperature $T_{1/2}$ is a temperature at which the rate of the denatured protein in all proteins present in the system is ½. Alternatively, the denaturation midpoint concentration $[Gdn-HCl]_{1/2}$ is a concentration of guanidine hydrochloride salt (Gdn-HCl) at which the rate of the denatured protein in all proteins present in the system is ½. The cardiac muscle cytochrome c is higher in stability when the values of the $T_{1/2}$ and the $[Gdn-HCl]_{1/2}$ are higher.

TABLE 2

|  | $T_{1/2}$ (° C.) | $[Gdn-HCl]_{1/2}$ (M) |
| --- | --- | --- |
| Equine cardiac muscle cytochrome c | 85 | 2.50 |
| Bovine cardiac muscle cytochrome c | 88 | 2.61 |

(Preparation of Tin-Substituted Cytochrome c)

Tin-substituted equine and bovine cardiac muscle cytochrome c's were prepared in the following manner: Zinc-substituted equine and bovine cardiac muscle cytochrome c's were also prepared for comparative tests.

Equine and bovine cardiac muscle cytochrome c's produced by Sigma-Aldrich were used.

Hereinafter, the method of producing tin-substituted equine cardiac muscle cytochrome c will be described mainly, but tin-substituted bovine cardiac muscle cytochrome c, zinc-substituted equine and bovine cardiac muscle cytochrome c's are also prepared similarly. Tin-containing proteins having the amino acid sequence of equine or bovine cardiac muscle cytochrome c of which one or more amino acids are deleted, substituted or added can also be prepared similarly by using a technology such as random mutation or chemical modification, properly.

Six mL of 70% hydrofluoric acid/pyridine is added to 100 mg of equine cardiac muscle cytochrome c powder, the mixture is incubated at room temperature for 10 minutes, for removal of iron, the central metal of the hem of equine cardiac muscle cytochrome c. 9 mL of 50 mM ammonium acetate buffer solution (pH 5.0) is added to the iron-depleted equine cardiac muscle cytochrome c for termination of the reaction, and the solution is processed by gel filtration column chromatography (column volume: 150 mL, resin: Sephadex G-50, developing solvent: 50 mM sodium acetate buffer solution (pH 5.0)), to give a central metal-depleted metal-free equine cardiac muscle cytochrome c.

The metal free equine cardiac muscle cytochrome c solution is concentrated as much as possible and adjusted to pH 2.5 (±0.05) by addition of glacial acetic acid. Approximately 25 mg of tin chloride powder is added to the solution thus obtained and the mixture is incubated at 50° C. in a dark place for 30 minutes. Addition of zinc acetate or zinc chloride, replacing tin chloride, in the process gives a zinc-substituted derivative. The incubation is continued, while the ultraviolet-visible absorption spectrum is measured repeatedly at an interval of 10 minutes, until the ratio of the absorption peak of the protein at a wavelength of 280 nm to the absorption peak of the tin porphyrin at a wavelength of 408 nm becomes constant.

The operation thereafter is carried out in a dark place. The solution finally obtained was adjusted to neutral (6.0<) by addition of saturated disodium hydrogen phosphate solution and buffer-exchanged with 10 mM sodium phosphate buffer solution (pH 7.0). The monomer fraction is then collected by cation-exchange column chromatography (column volume: 40 mL, resin: SP-Sephadex Fast Flow, elution: linear concentration gradient of 10 to 150 mM sodium phosphate buffer solution (pH 7.0)), to give tin-substituted equine cardiac muscle cytochrome c.

Measurement results of the ultraviolet-visible absorption spectra of the tin-substituted equine and bovine cardiac muscle cytochrome c's and zinc-substituted equine and bovine cardiac muscle cytochrome c's thus prepared are shown in FIGS. 19 to 22. Hereinafter, the tin-substituted equine cardiac muscle cytochrome c will be referred to as Snhhc, the tin-substituted bovine cardiac muscle cytochrome c as Snbvc, the zinc-substituted equine cardiac muscle cytochrome c as Znhhc, and the zinc-substituted bovine cardiac muscle cytochrome c as Znbvc, as necessary. As shown in FIGS. 19 to 22, zinc-substituted equine and bovine cardiac muscle cytochrome c's have absorption maximums at wavelengths 280, 346, 423, 550 and 584 nm, while tin-substituted equine and bovine cardiac muscle cytochrome c's have absorption maximums at wavelengths 280, 409, 540 and 578 nm and does not have 5 band (around 346 nm).

(Photoirradiation Decomposition Test of Metal-Substituted Cytochrome c's)

Photoirradiation decomposition test of the 4 kinds of metal-substituted cytochrome c's, tin-substituted equine and bovine cardiac muscle cytochrome c's and zinc-substituted equine and bovine cardiac muscle cytochrome c's was carried out in the following manner:

Approximately 4 μM of a metal-substituted cytochrome c (dissolved in 10 mM sodium phosphate buffer solution (pH 7.0)) was placed in a 1 mL cuvette; the zinc substituted derivative was irradiated with a light at a wavelength of 420 nm (intensity: 1255 μW) and the tin substituted derivative with a light at a wavelength of 408 nm (intensity: 1132 μW) in a dark room at room temperature. The ultraviolet-visible absorption spectrum at a wavelength of 240 to 700 nm was determined every 30 minutes. The results are shown in FIGS. 23 to 26. The arrow in FIGS. 25 and 26 indicates the direction of the change in spectrum.

Figure 23:
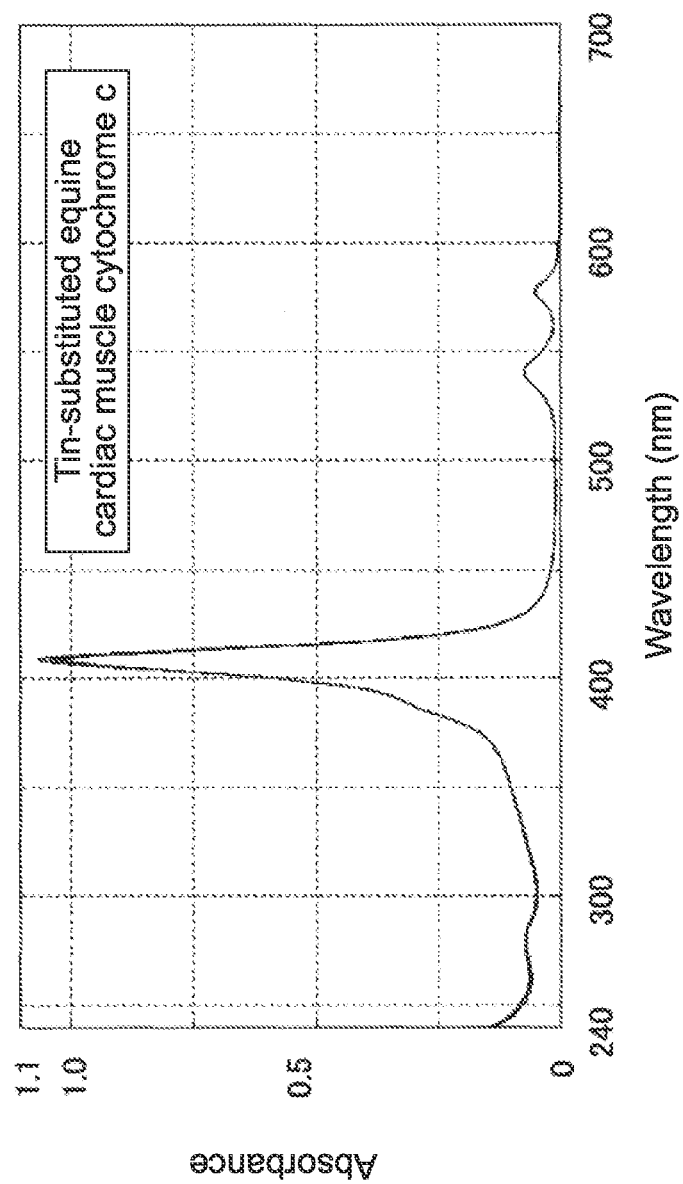
FIG. 23 is a schematic chart showing the results of measuring the change over time in the ultraviolet-visible absorption spectrum of the tin-substituted equine cardiac muscle cytochrome c used in the transparent photoelectric conversion element constituting the multilayer transparent photoelectric conversion element of the fifth embodiment.
Figure 24:
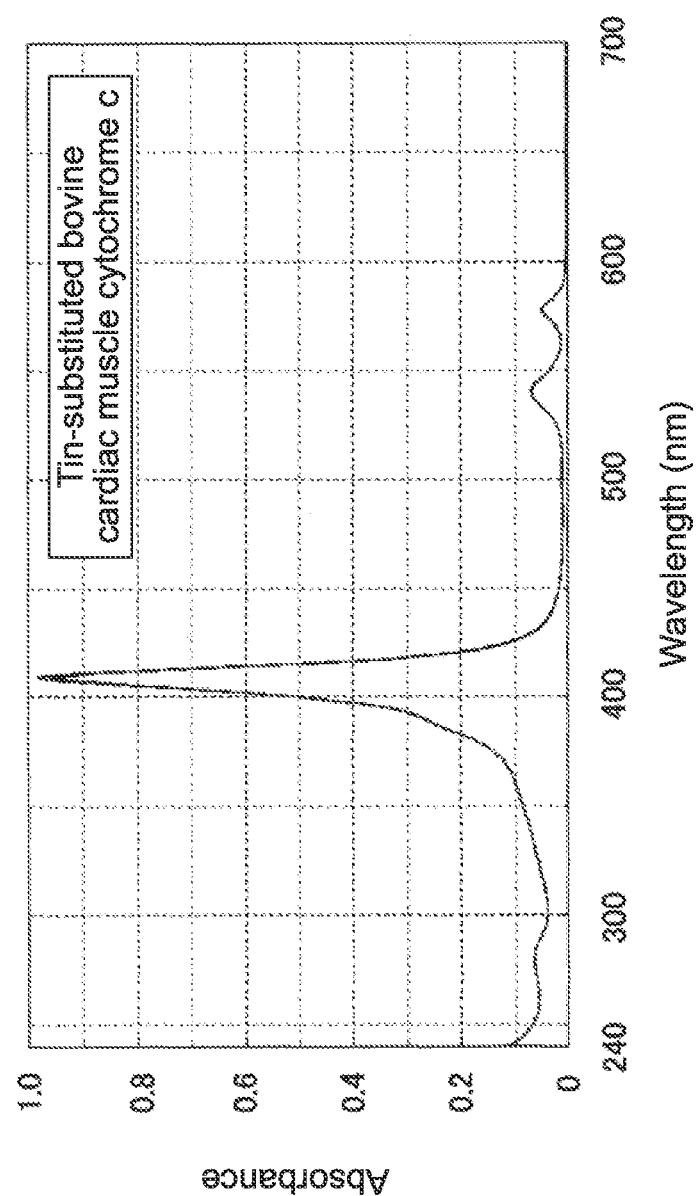
FIG. 24 is a schematic chart showing the results of measuring the change over time in the ultraviolet-visible absorption spectrum of the tin-substituted bovine cardiac muscle cytochrome c used in the transparent photoelectric conversion element constituting the multilayer transparent photoelectric conversion element of the fifth embodiment.
Figure 25:
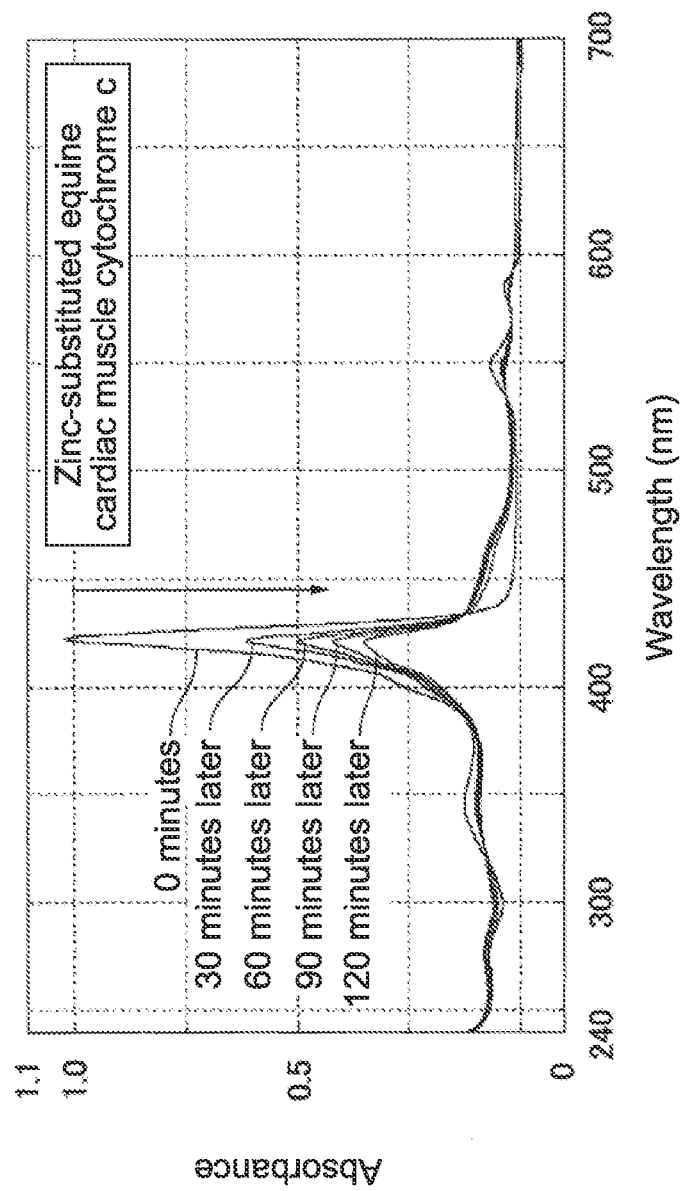
FIG. 25 is a schematic chart showing the results of measuring the change over time in the ultraviolet-visible absorption spectrum of zinc-substituted equine cardiac muscle cytochrome c.
Figure 26:
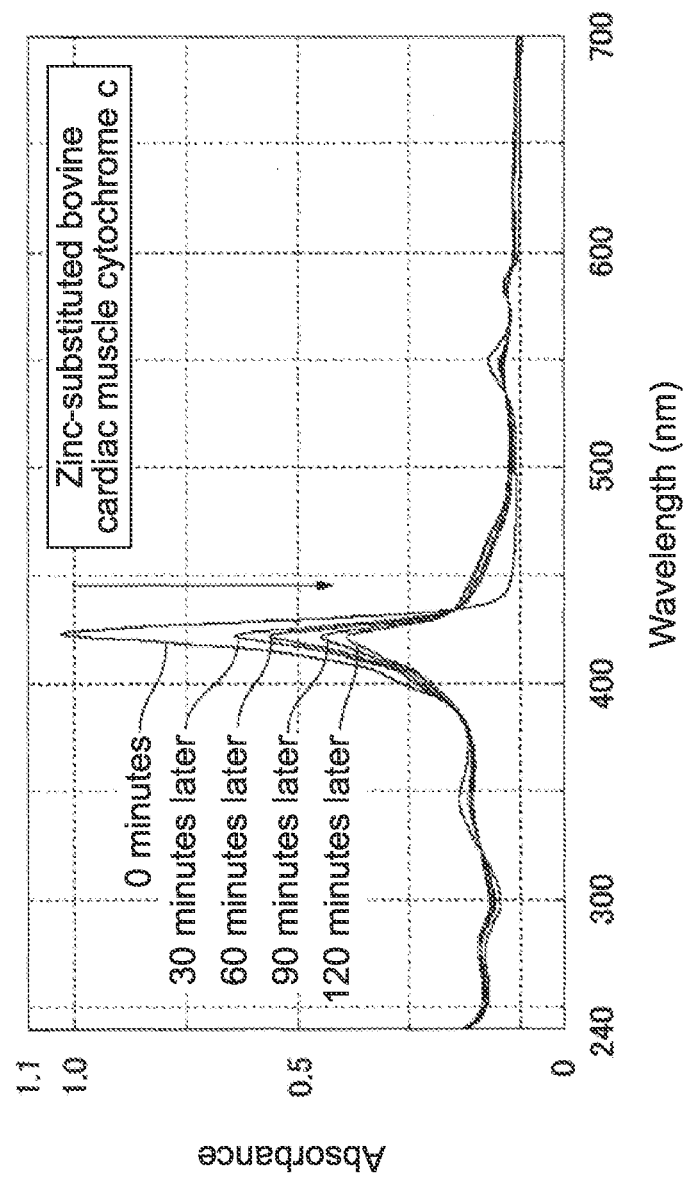
FIG. 26 is a schematic chart showing the results of measuring the change over time in the ultraviolet-visible absorption spectrum of zinc-substituted bovine cardiac muscle cytochrome c.
Figure 27:
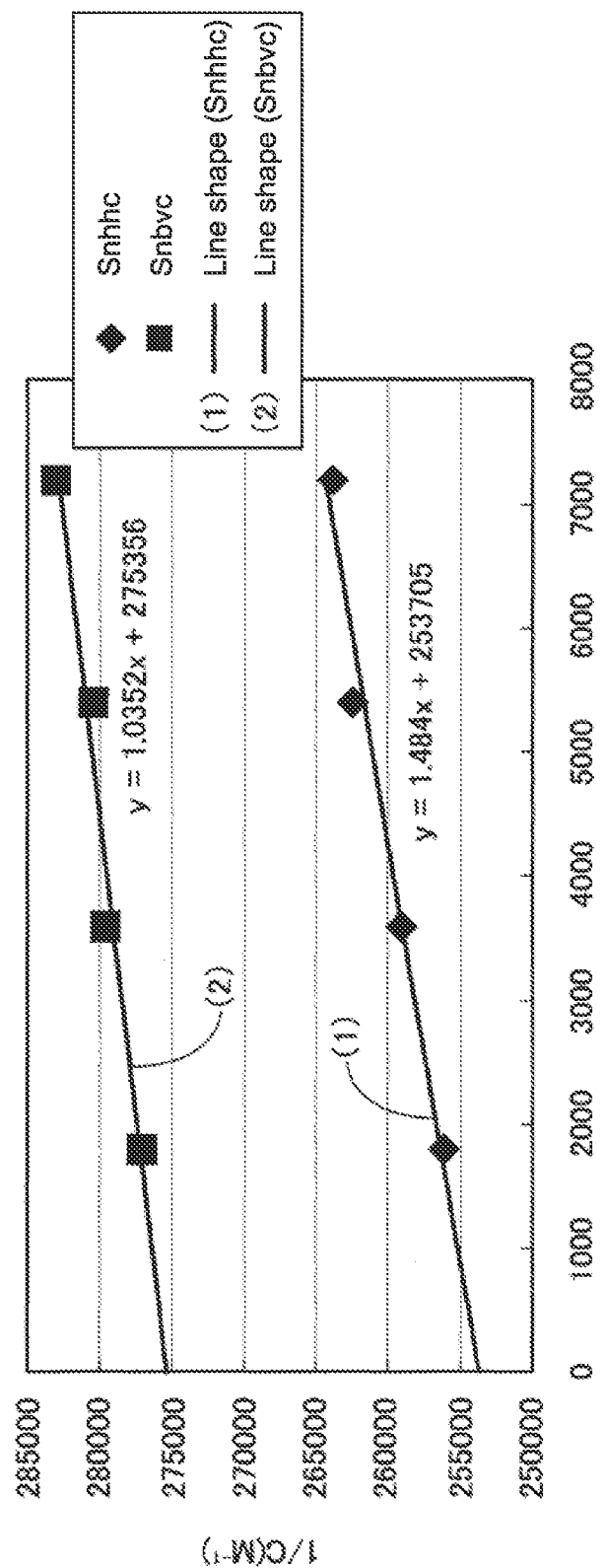
FIG. 27 is a schematic chart showing an example of the second-order reaction formula obtained by curve fitting of the photodecomposition reaction of the tin-substituted equine and bovine cardiac muscle cytochrome c used in the transparent photoelectric conversion element constituting the multilayer transparent photoelectric conversion element of the fifth embodiment.
Figure 28:
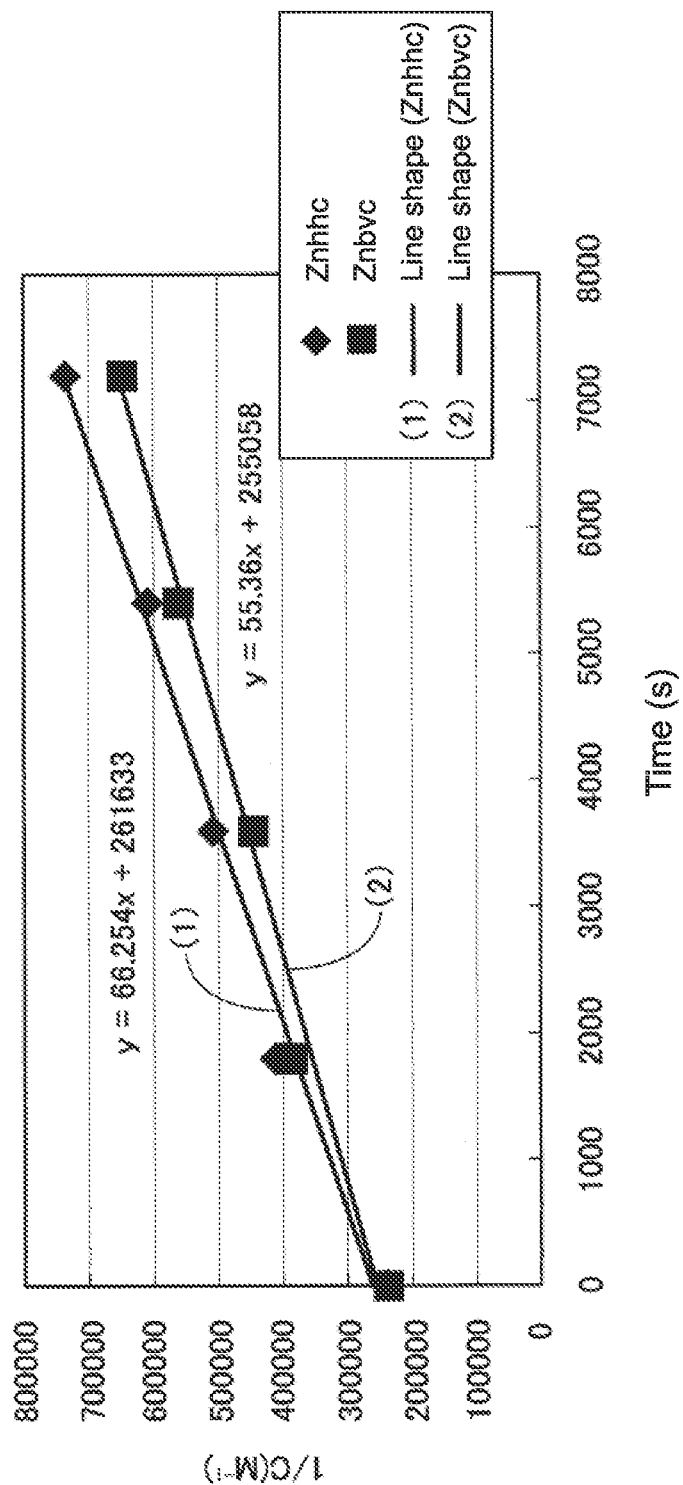
FIG. 28 is a schematic chart showing an example of the second-order reaction formula obtained by curve fitting of the photodecomposition reaction of zinc-substituted equine and bovine cardiac muscle cytochrome c's.

FIGS. 25 and 26 show that zinc-substituted equine and bovine cardiac muscle cytochrome c's are photodecompose rapidly over time. In contrast, FIGS. 23 and 24 show that the spectra of tin-substituted equine and bovine cardiac muscle cytochrome c's after some time is mostly identical with the initial spectra, indicating that almost no photodecomposition occurred over time. The concentration (M) was calculated from the absorbance in the Soret band (zinc (Zn): 423 nm, tin (Sn): 409 nm) in the ultraviolet-visible absorption spectra shown in FIGS. 23 to 26 by using millimolar extinction coefficients ε (Zn: 243000 $M^{-1}cm^{-1}$, Sn: 267000 $M^{-1}cm^{-1}$, these numerical values are from Vanderkooi, J. M. and 2 others, Eur. J. Biochem. 64, 381-387 (1976), hereinafter referred to as Non-patent Document 3); the reciprocal of the concentration was plotted against time (second (s)); and the photodecomposition rate constant k was calculated from the slope. The plot of the reciprocal of the concentration of tin-substituted equine cardiac muscle cytochrome c and tin-substituted bovine cardiac muscle cytochrome c (1/C) against time (t) is shown in FIG. 27, while the plot of the reciprocal of the concentration of zinc-substituted equine cardiac muscle cytochrome c and zinc-substituted bovine cardiac muscle cytochrome c (1/C) against time (t) is shown in FIG. 28. In FIGS. 27 and 28, the straight line is a fitting curve obtained as a second-order reaction equation ($1/C=kt+1/C_0$). In the formula, $C_0$ is initial concentration. The slope of the line is the photodecomposition rate constant k. In the first-order equation of the straight line shown in FIGS. 27 and 28, t is expressed with x, and 1/C with y.

The photodecomposition rate constant k of the 4 kinds of metal-substituted cytochrome c's was determined from the average of two tests. As a result, the photodecomposition rate constant k of tin-substituted equine cardiac muscle cytochrome c was $1.39\pm0.13$ $M^{-1}$ $s^{-1}$; that of tin-substituted bovine cardiac muscle cytochrome c was $0.90\pm0.20$ $M^{-1}s^{-1}$; that of zinc-substituted equine cardiac muscle cytochrome c was $67.2\pm1.4$ $M^{-1}s^{-1}$; and that of zinc-substituted bovine cardiac muscle cytochrome c was $56.1\pm1.0$ $M^{-1}s^{-1}$. The results show that both tin-substituted equine and bovine cardiac muscle cytochrome c's had a photodecomposition rate 50 to 60 times smaller than that of zinc-substituted equine and bovine cardiac muscle cytochrome c's, indicating that they are quite stable against photoirradiation. In addition, bovine cardiac muscle cytochrome c's, both zinc- and tin-substituted derivatives, had a photodecomposition rate 1.2 to 1.5 times smaller than equine cardiac muscle cytochrome c's, indicating that they are stable against photoirradiation. In particular, tin-substituted bovine cardiac muscle cytochrome c is 75 times more stable against photoirradiation than the zinc-substituted equine cardiac muscle cytochrome c used in Patent Document 1.

(Photocurrent-Generating Test of Metal-Substituted Cytochrome c's)

A protein-immobilized electrode for use in photocurrent-generating test was prepared in the following manner.

Figure 29:
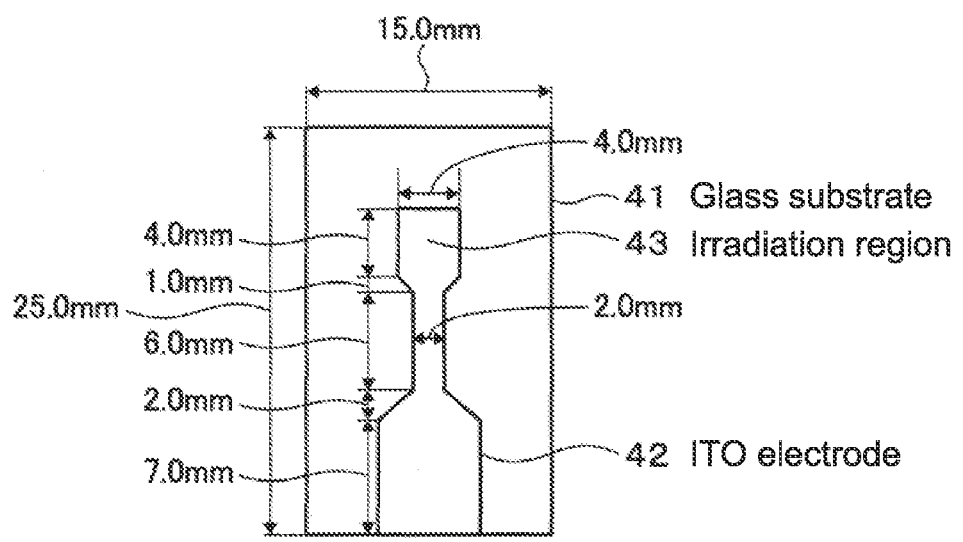
FIG. 29 is a top view illustrating a protein-immobilized electrode used in the photocurrent-generating test of metal-substituted cytochrome c's in the fifth embodiment.

As shown in FIG. 29, an ITO electrode 42 in a particular shape was formed on a glass substrate 41 having a size of 15.0 mm×25.0 mm and a thickness of 1 mm. The dimension of the ITO electrode 42 is as shown in FIG. 29. The thickness of the ITO electrode 42 is 100 nm. The ITO electrode 42 serves as a working electrode. The size of the irradiation region 43 is 4.0 mm×4.0 mm. 10 μL of 50 μM metal-substituted cytochrome c solution (dissolved in 10 mM Tris-HCl (pH 8.0)) was applied dropwise on the irradiation region 43 of the ITO electrode 42 and the resulting wet electrode was left at 4° C. for 2 days, to give a protein-immobilized electrode.

The protein-immobilized electrode was immersed in 27 mL of 10 mM sodium phosphate buffer solution containing 0.25 mM potassium ferrocyanide (pH 7.0), and the photocurrent action spectrum at a wavelength of 380 to 600 nm was determined by using the photocurrent analyzer shown in FIG. 4 of Patent Document 1, by using a platinum mesh as the counter electrode and a silver/silver chloride electrode as the reference electrode, with an electric potential applied to the silver/silver chloride electrode at 120 mV. In the measurement, the standby time was 900 seconds; the measuring time, 60 second; the current range, 10 nA; the frequency of the filter, 30 Hz; and the time resolution, 50 ms. Five electrodes were prepared and measured for each of the four kinds of metal-substituted cytochrome c's.

Figure 30:
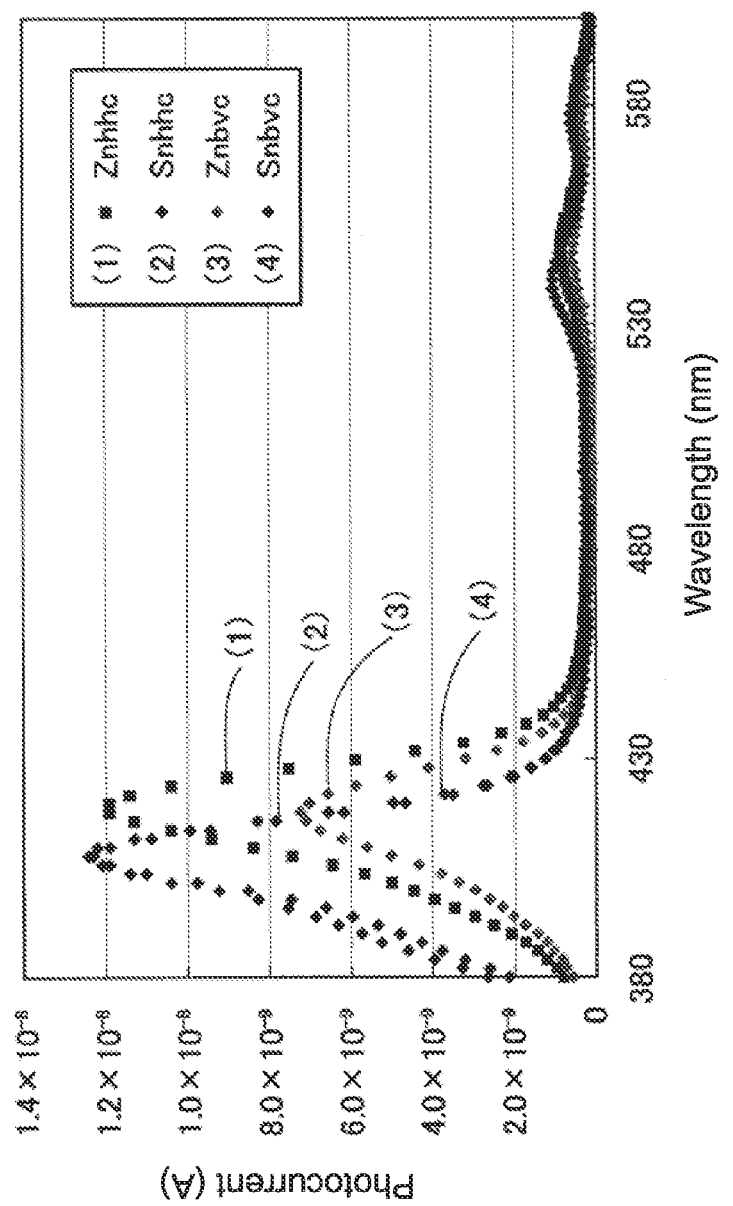
FIG. 30 is a schematic chart showing the results of measuring the photocurrent action spectrum of the protein-immobilized electrode shown in FIG. 29.
Figure 31:
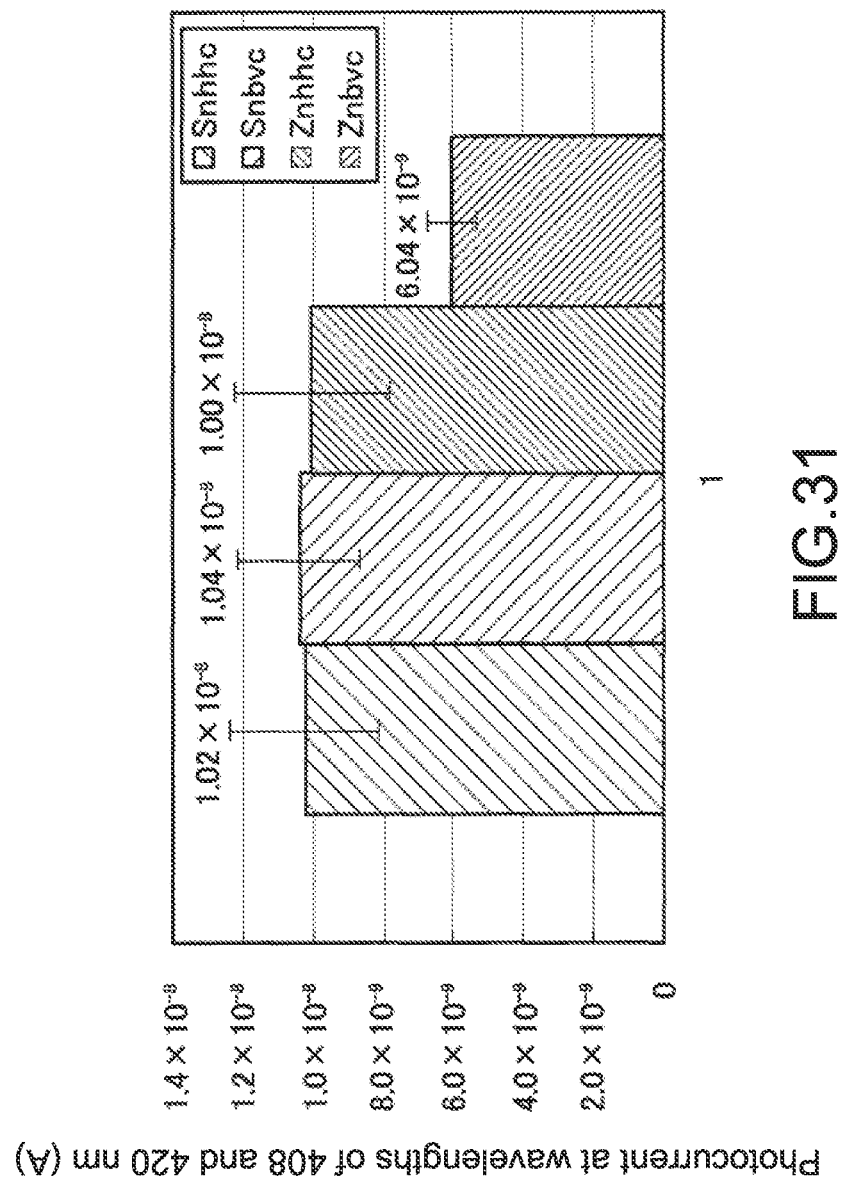
FIG. 31 is a schematic chart showing the average of the Soret-band photocurrent observed on the protein-immobilized electrode shown in FIG. 29.

The photocurrent action spectra obtained are shown in FIG. 30. The maximum peaks in the photocurrent action spectra were observed at 408, 540 and 578 nm, similarly to those in the solution absorption spectra. As shown in FIG. 30, because the intensity ratio of the Soret band (408 nm) to the Q band (540 nm) is 10:1, the mechanism of photocurrent generation by tin-substituted equine and bovine cardiac muscle cytochrome c's is considered to be the hole transfer mechanism, similarly to the zinc-substituted equine cardiac muscle cytochrome c (Tokita, Y. and 4 others, J. Am. Chem. Soc. 130, 5302 (2008), hereinafter referred to as Non-patent Document 4). A graph showing the averages of photocurrent in the Soret band (sample number: 5) is shown in FIG. 31. FIG. 31 shows that both equine and bovine tin-substituted cytochrome c's generate photocurrent (10 nA), similarly to zinc-substituted equine cardiac muscle cytochrome c.

(Fluorescence Quantum Yield of Metal-Substituted Cytochrome c's)

Figure 32:
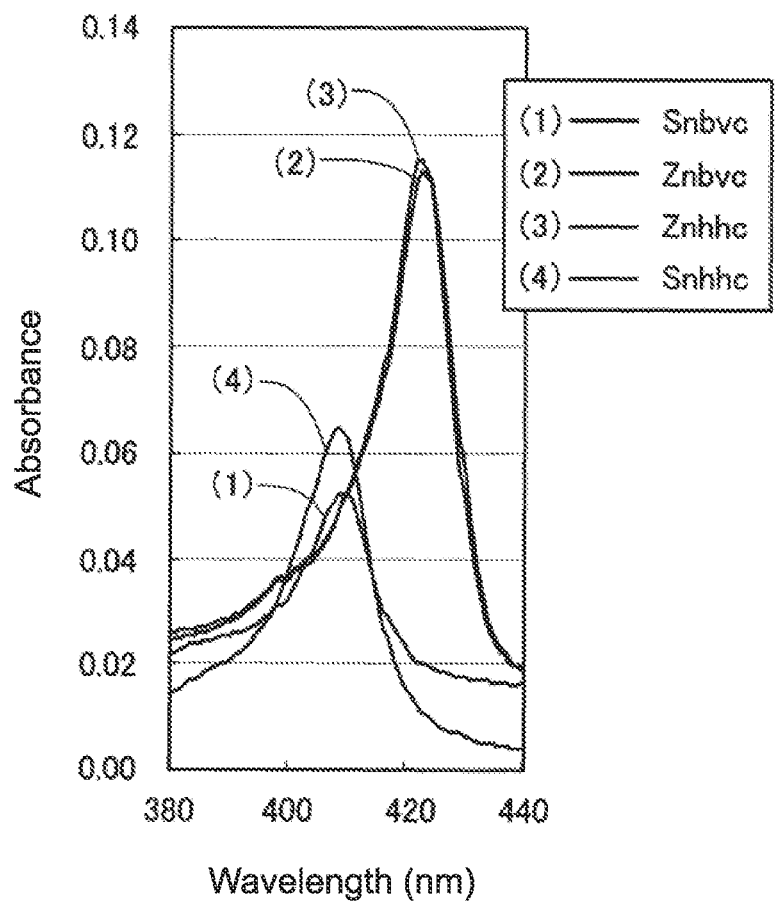
FIG. 32 is a schematic chart showing the results of measuring the ultraviolet-visible absorption spectra of various metal-substituted cytochrome c's.
Figure 33:
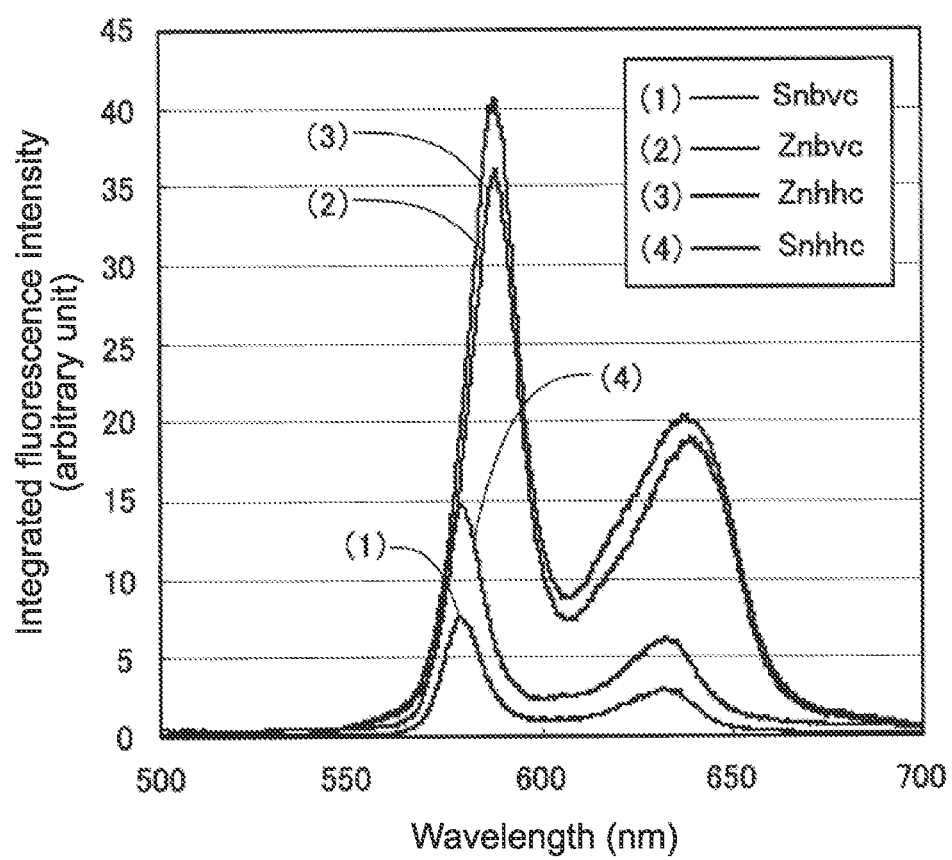
FIG. 33 is a schematic chart showing the results of measuring the fluorescence spectra of various metal-substituted cytochrome c's.

Dilute solutions of metal-substituted cytochrome c's at different concentrations were prepared and the ultraviolet-visible absorption spectra at a wavelength of 380 to 440 nm and the fluorescence spectra (excitation wavelength: 409 nm) at a wavelength of 500 to 700 nm were determined. The results are shown in FIGS. 32 and 33.

Figure 34:
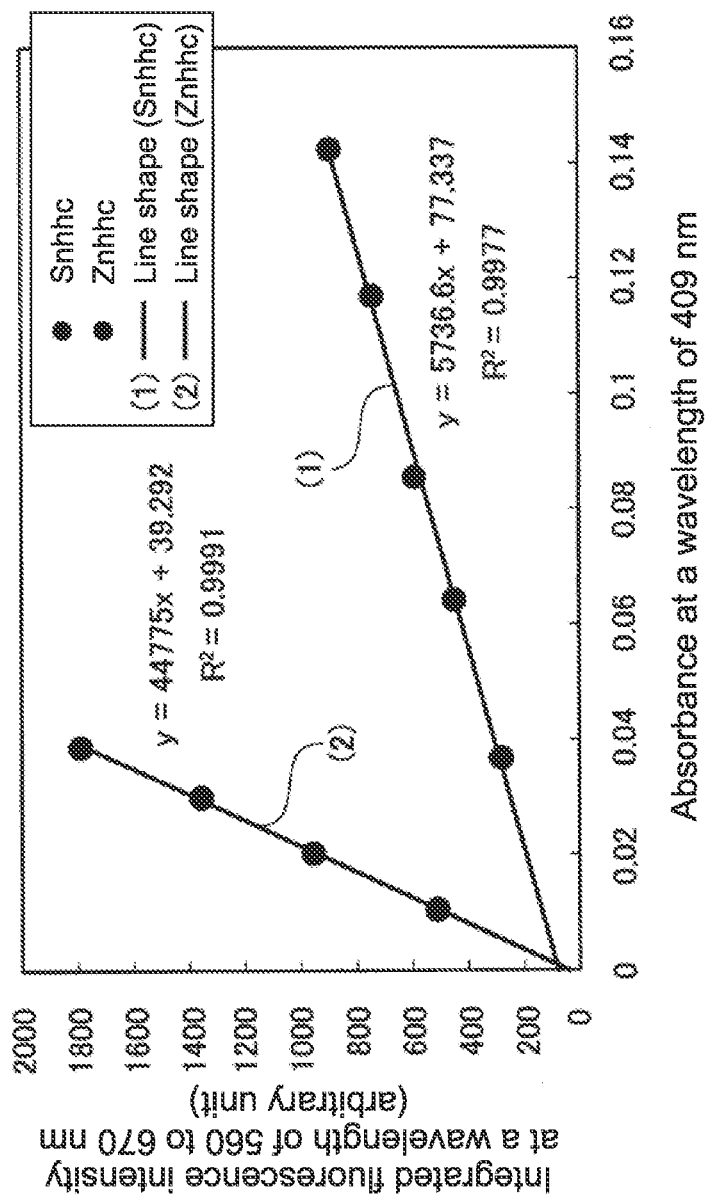
FIG. 34 is a schematic chart showing the integrated fluorescence intensity plotted against the absorbance at a wavelength of 409 nm of tin- and zinc-substituted equine cardiac muscle cytochrome c's.
Figure 35:
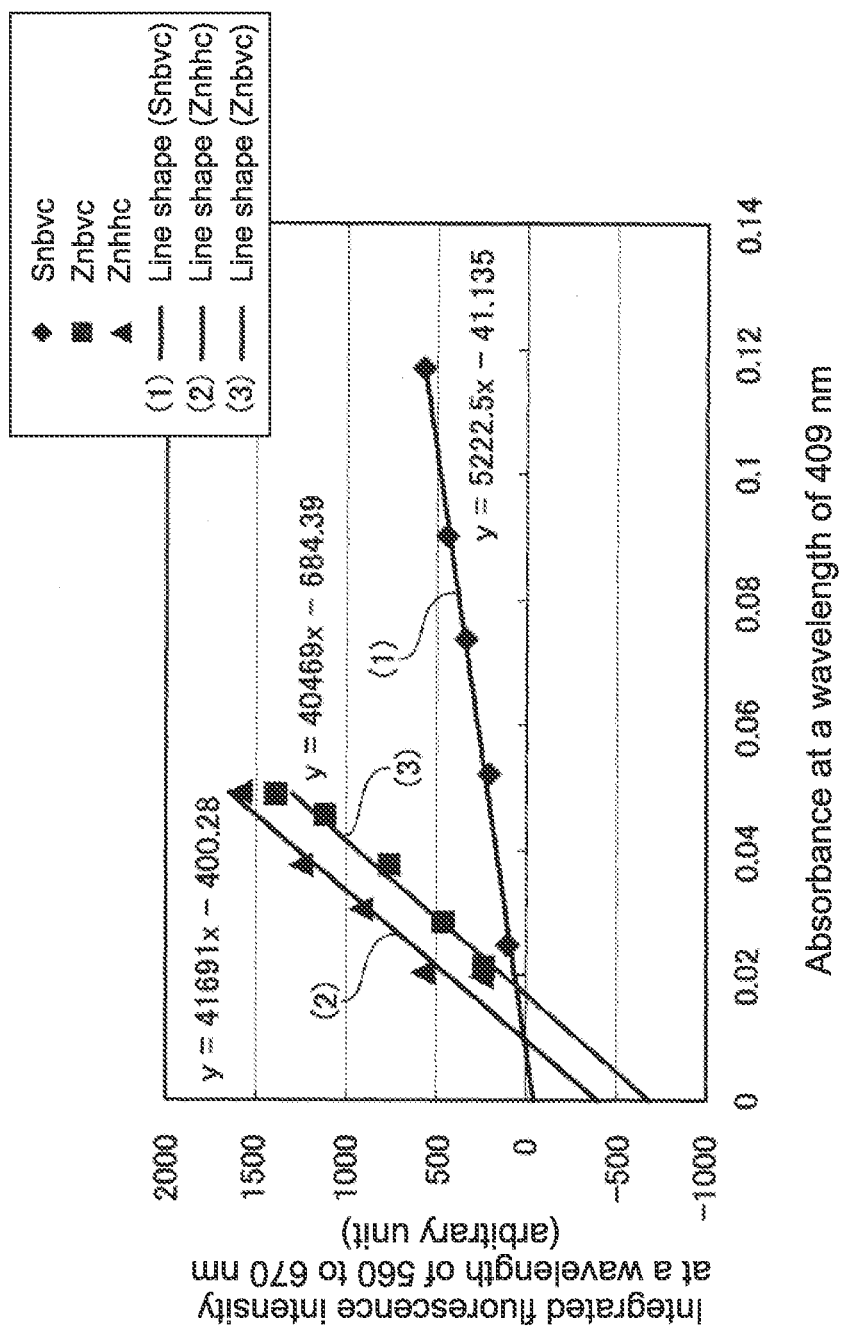
FIG. 35 is a schematic chart showing the integrated fluorescence intensity plotted against the absorbance at a wavelength of 409 nm of tin- and zinc-substituted bovine cardiac muscle cytochrome c's and zinc-substituted equine cardiac muscle cytochrome c.

As shown in FIGS. 34 and 35, the data are plotted as the absorbance at a wavelength of 409 nm is plotted along the abscissa (X axis) and the integrated fluorescence intensity at a wavelength of 560 to 670 nm along the ordinate (y axis) and a linear regression line was drawn. The slope of the line thus obtained is the fluorescence quantum yield. In the fluorescence spectrum shown in FIG. 33, the area in the wavelength region of 560 to 670 nm was used as the integrated fluorescence intensity (arbitrary unit (a.u.)). The slope of the line of zinc-substituted equine cardiac muscle cytochrome c, i.e., the relative fluorescence quantum yield φ of each metal-substituted cytochrome c when the fluorescence quantum yield is 1.0, was calculated. The results are summarized in Table 3. As obvious from Table 3, the fluorescence intensity of tin substituents are approximately ⅐ to ⅛ of the fluorescence intensity of zinc substituted derivatives. It is considered that smaller lifetime of the excited electrons in the tin substituted derivatives suppresses radical generation during photoirradiation, contributing to stabilization.

TABLE 3

| Protein | Fluorescence quantum yield (Φ) |
| --- | --- |
| Zinc-substituted equine cardiac muscle cytochrome c | 1.0 |
| Zinc-substituted bovine cardiac muscle cytochrome c | 0.97 |
| Tin-substituted equine cardiac muscle cytochrome c | 0.13 |
| Tin-substituted bovine cardiac muscle cytochrome c | 0.13 |

As described above, both tin-substituted equine and bovine cardiac muscle cytochrome c's have stability against photoirradiation extremely higher than that of zinc-substituted equine and bovine cardiac muscle cytochrome c's. For that reason, it is possible by using the tin-substituted equine or bovine cardiac muscle cytochrome c to prepare a novel transparent photoelectric conversion element 31 that can be used for an extended period of time. The transparent photoelectric conversion element 31 can be used, for example, as an optical sensor or an image sensor.

[Production Method for Multilayer Transparent Photoelectric Conversion Element]

The multilayer transparent photoelectric conversion element can be prepared similarly to the method described in the fourth embodiment.

[Operation of Multilayer Transparent Photoelectric Conversion Element]

Operation of the multilayer transparent photoelectric conversion element is similar to that described in the fourth embodiment.

As described above, according to the fifth embodiment, by using the tin-substituted equine or bovine cardiac muscle cytochrome c highly stable against photoirradiation as the protein 12, it is possible to prepare a novel transparent photoelectric conversion element 31 and thus to prepare a multilayer transparent photoelectric conversion element, containing the protein 12 that does not decompose even after long-term photoirradiation and thus remaining stable after used for an extended period of time.

The multilayer transparent photoelectric conversion element can be used in various apparatuses, devices and others using photoelectric conversion, specifically in electronic apparatuses containing a light-receiving unit, similarly to the multilayer transparent photoelectric conversion element in the fourth embodiment.

For example, as will be described below, it can provide a camera that can focus on multiple objects placed at positions different from each other simultaneously by using a single lens. Use of the multilayer transparent photoelectric conversion element also enables multi-focusing and high speed focusing with a single lens. Further, use of the multilayer transparent photoelectric conversion element as the light-receiving element of an optical disk system using a multilayer optical disk or an optical recording and reproducing system using a holographic recording medium, enables easy parallel read out of multilayer optical disks and easy read out of holographic recording media.

6. Sixth Embodiment

[Multilayer Transparent Photoelectric Conversion Element]

The multilayer transparent photoelectric conversion element in the sixth embodiment has a configuration similar to that of the multilayer transparent photoelectric conversion element in the fourth embodiment, except that a novel electron transfer protein is used as the protein 12 of the transparent photoelectric conversion element 31.

The novel electron transfer protein is a metal-substituted cytochrome c having a fluorescence excitation life $\tau$ of $5.0 \times 10^{-11} s < \tau \leq 8.0 \times 10^{-10}$ that was prepared by replacing the hem central metal iron of mammal cytochrome c with a metal other than zinc and tin, or a protein having a fluorescence excitation life $\tau$ of $5.0 \times 10^{-11} s < \tau \leq 8.0 \times 10^{-10} s$ that has an amino acid sequence obtained by deleting, substituting or adding one or more amino acids to the amino acid sequence of mammal cytochrome c and contains a metal other than zinc and tin. Examples of the mammal cytochrome c's include equine and bovine cardiac muscle cytochrome c's. These novel electron transfer proteins are extremely stable against photoirradiation and can retain their photoelectric conversion function over an extended period of time. (Metal-substituted cytochrome c's)

Metal-substituted equine and bovine cardiac muscle cytochrome c's in which the hem central metal iron of equine and bovine cardiac muscle cytochrome c's is substituted with a metal other than tin and zinc will be described below.

Examples of the metals used in these metal-substituted equine and bovine cardiac muscle cytochrome c's are shown in Table 4. Porphyrins containing such a metal as the central metal are known to emit fluorescence (Gouterman M., Optical spectra and electronic structure of porphyrins and related rings, in "The Porphyrins" Vol. 3, Dolphin, D. ed., pp. 1-156, Academic Press (1978), hereinafter referred to as Non-patent Document 5). In Table 4, the subscription of each element symbol shows the phosphorescence lifetime of the corresponding metal octaethylporphyrin.

TABLE 4

|  | Be(II) 12 ms |  |  |  |  |  |  |
|---|---|---|---|---|---|---|---|
| Na(I) ~50 ms | Mg(II) 130 ms |  |  |  |  |  |  |
| K(I) ~50 ms | Ca(II) 63 ms | Sc(III) 400 ms | Ti(IV) 41 ms |  |  | Al(III) 115 ms | Si(IV) 95 ms |
|  | Sr(II) 7 ms | Y(III) 55 ms | Zr(IV) 65 ms | Nb(V) 14.5 ms | Zn(II) 75 ms |  | Ge(IV) 42 ms | As(V) 86 ms |
|  | Ba(II) 8 ms | Lu(III) 7.8 ms | Hf(IV) 8.4 ms | Ta(V) 2.5 ms | Cd(II) 7 ms |  | Sn(IV) 30 ms | Sb(V) 26 ms |
|  |  |  | Th(IV) 0.43 ms |  |  |  | Pb(IV) 2.8 ms |  |

Table 4 shows the phosphorescence lifetime of tin (Sn) porphyrin is 30 ms, and metal porphyrins having a phosphorescence lifetime equivalent to or shorter than it are considered to be resistant to the damage to the protein and the porphyrin ring region by photoirradiation. As Table 4 shows, these metals are beryllium (Be), strontium (Sr), niobium (Nb), barium (Ba), lutetium (Lu), hafnium (Hf), tantalum (Ta), cadmium (Cd), antimony (Sb), thorium (Th), lead (Pb) and the like.

Thus, the hem central metal iron of equine and bovine cardiac muscle cytochrome c's is substituted with one of these metals. The substitution may be carried out by a method similar to that described in the fifth embodiment.

The metal-substituted equine and bovine cardiac muscle cytochrome c's thus obtained are stable against photoirradiation to an extent similar to that of tin-substituted equine and bovine cardiac muscle cytochrome c's and hardly show photodecomposition.

Hereinafter, the range of the fluorescence excitation lifetime desirable for the metal-substituted equine and bovine cardiac muscle cytochrome c's will be described. The intramolecular hole transfer rate of zinc-substituted equine cardiac muscle cytochrome c is as follows (Non-patent Document 4): When the molecular orbital (MO) number used in Non-patent Document 4 is used as the MO number, the hole transfer rate during transition between MO3272 and MO3271 is $1.5 \times 10^{11} s^{-1}$, while it is $2.0 \times 10^{10} s^{-1}$ during transition between MO3268 and MO3270. The latter value $2.0 \times 10^{10} s^{-1}$ is used as the lower limit of the intramolecular hole transfer rate.

The fluorescence excitation lifetime of the tin-substituted equine cardiac muscle cytochrome c is $8.0 \times 10^{-10}$ s (Non-patent Document 3). The fluorescence excitation lifetime of the zinc-substituted equine cardiac muscle cytochrome c is $3.2 \times 10^{-10}$ s.

The intramolecular hole transfer number during one electronic excitation of tin-substituted equine cardiac muscle cytochrome c is $(1.5 \times 10^{11} s^{-1}) \times (8.0 \times 10^{-10} s) = 120$ during transition between MO3272 and MO3271, and $(2.0 \times 10^{10} s^{-1}) \times (8.0 \times 10^{-10} s) = 16$ during transition between MO3268 and MO3270. Thus, the latter value 16 is used as the lower limit of the intramolecular hole transfer number during one electronic excitation.

In this case, the fluorescence excitation lifetime necessary for at least one hole transfer is $8.0 \times 10^{-10} s/16 = 5.0 \times 10^{-11} s$.

Thus, the range of the fluorescence excitation lifetime ($\tau$) of the metal-substituted equine and bovine cardiac muscle cytochrome c's necessary for hole transfer without any damage on protein region or porphyrin by photoirradiation is $5.0 \times 10^{-11} s$ (fluorescence excitation lifetime necessary for at least one hole transfer) $< \tau \leq 8.0 \times 10^{-10} s$ (fluorescence excitation lifetime of tin-substituted equine cardiac muscle cytochrome c).

According to the sixth embodiment, it is possible, by using a metal-substituted equine or bovine cardiac muscle cytochrome c as the protein 12 of the transparent photoelectric conversion element 31, to obtain advantages similar to those of the multilayer transparent photoelectric conversion element in the fifth embodiment, containing tin-substituted equine or bovine cardiac muscle cytochrome c.

7. Seventh Embodiment

[Multilayer Transparent Photoelectric Conversion Element]

The multilayer transparent photoelectric conversion element in the seventh embodiment is identical with the multilayer transparent photoelectric conversion element in the fourth embodiment in that it has a multilayer configuration of N layers of transparent photoelectric conversion elements 31, but different from it in that many pixels of the transparent photoelectric conversion element 31 are formed, as accumulated, on the plane.

Figure 36:
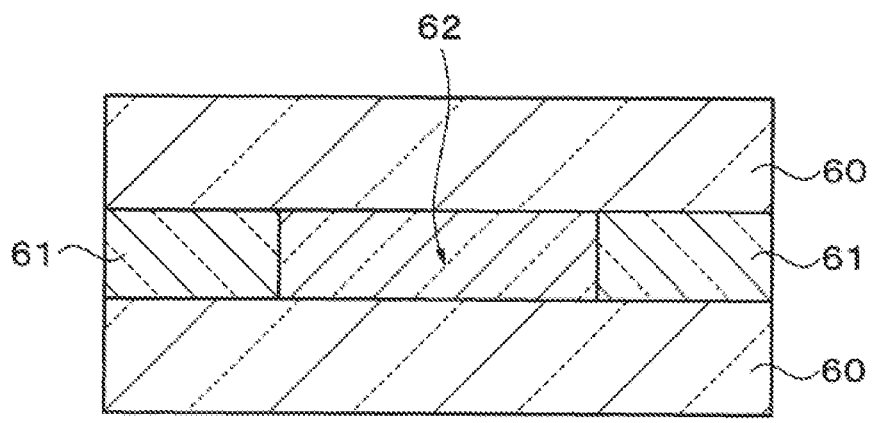
FIG. 36 is a schematic view illustrating the multilayer transparent photoelectric conversion element of a seventh embodiment.

Specifically as shown in FIG. 36, in the multilayer transparent photoelectric conversion element, transparent spacers 61 are formed for example between Nth transparent substrate 60 and (N−1)th transparent substrate 60 and the gap between these transparent substrates 60 is determined by the thickness of the spacer 61. A pixel 62 of a transparent photoelectric conversion element 31 is formed in the space between the spacer 61 and the spacer 61 and many such pixels 62 are aligned in the two-dimensional matrix shape on the plane. The face carrying these aligned pixels 62 serves as the light-receiving face and there are total N light-receiving faces therein.

Transmission and processing of the signal from the pixels 62 in the integrated multilayer transparent photoelectric conversion element are performed by using a known technology. For example, wires are formed in the line and row directions, in such a manner that they are in contact with upper and lower electrodes of the pixels 62 of m rows and n columns aligned in a two-dimensional matrix shape. For example for read out of the signals from m pixels 62 in a selected column, a particular bias voltage is applied only to the wire connected to the electrodes corresponding to the pixels 62 in the column and then the photocurrent flowing in the wire connected to the other electrodes corresponding to the pixels 62 in m rows is detected.

It is possible in the seventh embodiment to obtain advantages similar to those obtained in the fourth embodiment. In addition, the integrated multilayer transparent photoelectric conversion element has applications similar to the multilayer transparent photoelectric conversion element described in the fourth embodiment.

8. Eighth Embodiment

[Multilayer Transparent Photoelectric Conversion Element]

Figure 37:
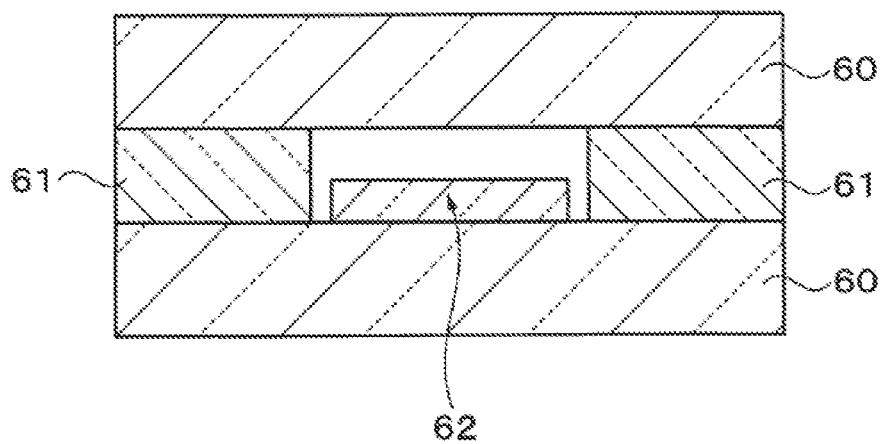
FIG. 37 is a schematic view illustrating the multilayer transparent photoelectric conversion element of an eighth embodiment.

As shown in FIG. 37, in the multilayer transparent photoelectric conversion element of the eighth embodiment, for example transparent spacers 61 with a variable height are formed between Nth transparent substrate 60 and (N−1)th transparent substrate 60 and the gap between these transparent substrates 60 is determined by the thickness of the spacer 61. A pixel 62 of a transparent photoelectric conversion element 31 is formed in the space between spacers 61 and many such pixels 62 are aligned in the two-dimensional matrix shape on the plane. The face carrying these aligned pixels 62 serves as the light-receiving face and there are total N light-receiving faces therein. In this case, the thickness of the pixel 62 of the transparent photoelectric conversion element 31 is smaller than the thickness of the spacer 61; the width of the pixel 62 of the transparent photoelectric conversion element 31 is smaller than the width of the space between spacers 61; and there are openings between the transparent substrate 60 and the pixel 62 and between the pacers 61 and pixel 62. Because there are openings between the transparent substrate 11 and the pixel 62 and between the spacer 61 and the pixel 62, it is possible to make the multilayer transparent photoelectric conversion element flexible.

Transmission and processing of the signal of the pixels 62 in the integrated multilayer transparent photoelectric conversion element are performed by using a known technology.

It is possible according to the eighth embodiment to obtain advantages similar to those obtained in the fourth embodiment. In addition, the integrated multilayer photoelectric conversion element has applications similar to those of the multilayer transparent photoelectric conversion element in the fourth embodiment.

9. Ninth Embodiment

[3D Imaging System]

The 3D imaging system of the ninth embodiment uses a camera containing the integrated multilayer transparent photoelectric conversion element of the seventh or eighth embodiment as its optical sensor. The camera is, for example, a digital camera or a video camcorder.

Figure 38:
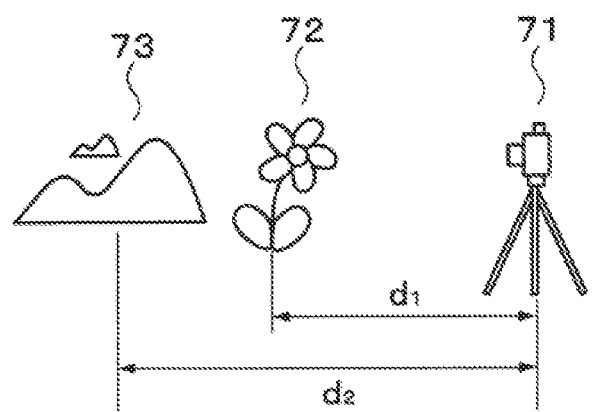
FIG. 38 are schematic views explaining a 3D imaging system of a ninth embodiment.

The camera has a configuration in which the optical-axis direction of the imaging optical system of the camera is in parallel with the lamination direction of the pixels 62 of the transparent photoelectric conversion elements 31 in the integrated multilayer transparent photoelectric conversion element. In this way, the camera permits use of each of the N light-receiving faces in the integrated multilayer transparent photoelectric conversion element, in focusing during imaging of an object. Thus, it is possible to image objects placed at positions at different distances from the camera by focusing thereon. For example as shown in FIGS. 38A and 38B, when there is a flower 72 at a position at a distance d: from a camera 71 and a mountain 73 at a position at a distance $d_2$ ($d_2 > d_1$), if these flower 72 and mountain 73 are imaged by the camera 71, it is possible to focus on both of these flower 72 and mountain 73 with the integrated multilayer transparent photoelectric conversion element and to take a picture of them in that state. It is also possible to obtain a 3D image by processing the signal from the integrated multilayer transparent photoelectric conversion element. Both the flower 72 and the mountain 73 are imaged clearly in the image, and the flower 72 is imaged closer and the mountain 73 far behind, giving sufficiently perspective.

Reproduction of the image taken by the camera 71 on a display will be described. In a first example, a real 3D image taken by a camera 71 is reproduced on a display. It is possible, for example, to reproduce a real 3D image in which the flower 71 is shown closer and the mountain 72 far behind.

Figure 39B:
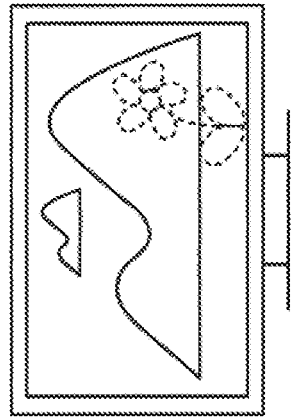
FIG. 39 is a schematic view explaining the 3D imaging system of the ninth embodiment.
Figure 39A:
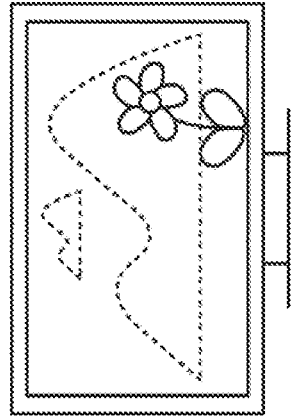

In a second example, a region of particular interest in a 3D image taken by the camera 71 is represented as emphasized. For example in the example of FIGS. 38A and 38B, when only a flower 72 in the 3D image containing a flower 72 and a mountain 73 taken by the camera 71 is desirably reproduced, as shown in FIG. 39A, it is possible to show only the flower 72 clearly on a display 74, while leaving the mountain 73 blurred, by processing the image signal. On the other hand, as shown in FIG. 39B, it is possible to show only the mountain 73 clearly, while leaving the flower 72 blurred, by processing the image signal. It is possible in this way to reproduce an image demanded by the user on a display 74.

Use of each of N light-receiving faces in the integrated multilayer transparent photoelectric conversion element for focusing during imaging of an object will be described below in detail once again.

Figure 40:
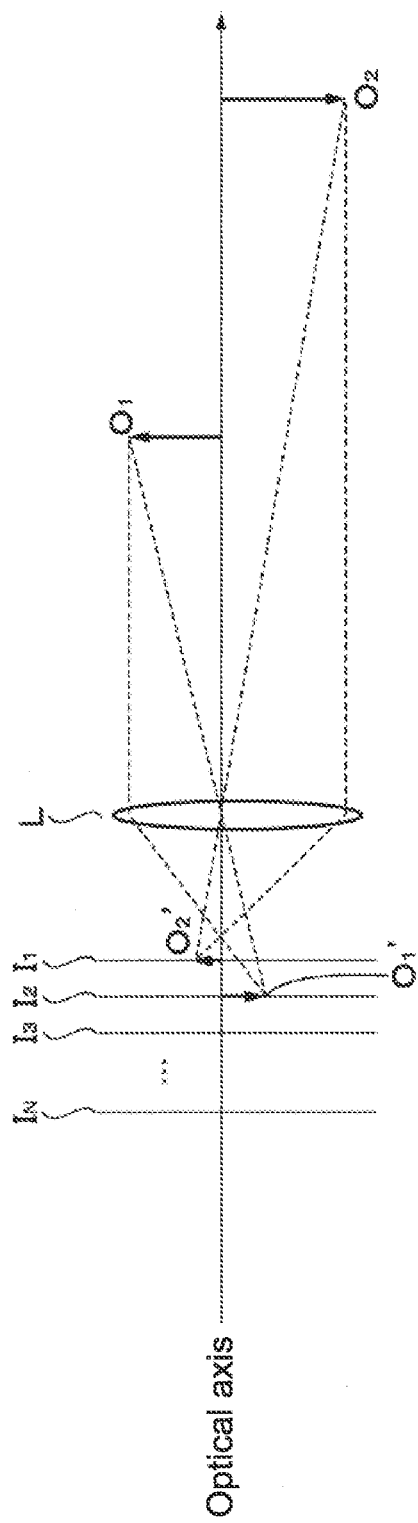
FIG. 40 is a schematic view explaining the 3D imaging system of the ninth embodiment.

FIG. 40 shows an imaging optical system containing the integrated multilayer transparent photoelectric conversion element. The imaging optical system generally has two or more lenses, but only one lens L is shown here for simplicity of description. The image surfaces $I_1$ to $I_N$ correspond to N light-receiving faces in the integrated multilayer transparent photoelectric conversion element. The case where two objects $O_1$ and $O_2$ are placed at positions at different distances from a lens L will be considered. The image of the object $O_1$ obtained through the lens L concentrates on the image surface $I_2$ (image point $O_1'$), and the image of the object $O_2$ on the image surface $I_1$ (image point $O_2'$). In this case, both of the objects $O_1$ and $O_2$ can be focused, giving a clear image of them.

Figure 41:
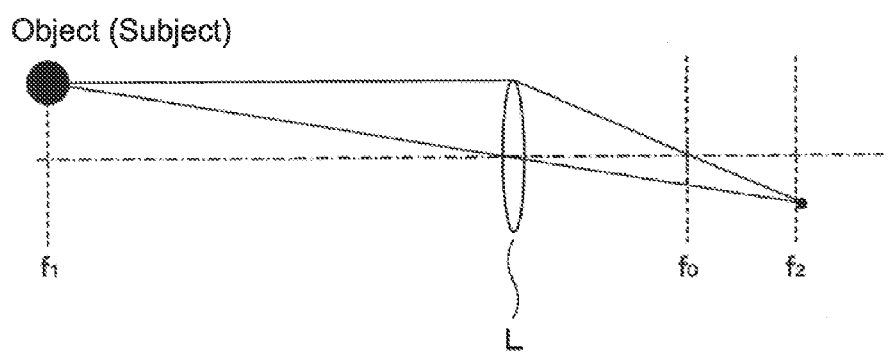
FIG. 41 is a schematic view explaining the 3D imaging system of the ninth embodiment.

Change of the position on image plane in the integrated multilayer transparent photoelectric conversion element according to the distance of the object from lens L, i.e., change of focal point, will be described. As shown in FIG. 41, the image of an object separated by a distance $f_1$ from a lens L having a focal length of $f_0$ is formed at a position at a distance $f_2$ from the lens L. Then, the following equation $f_1 = f_2 f_0 / (f_2 - f_0)$ is satisfied according to the lens equation. The relationship between $f_1$ and $f_2$, for example when $f_0 = 5$ cm, is as shown in Table 5 or graphically in FIG. 42.

TABLE 5

| $f_1$ (m) | $f_2$ (cm) |
| --- | --- |
| 1 | 5.263158 |
| 5.623413 | 5.044856 |
| 10 | 5.025126 |
| 20.53525 | 5.012204 |
| 56.23413 | 5.00445 |
| 100 | 5.002501 |
| 205.3525 | 5.001218 |
| 562.3413 | 5.000445 |
| 1000 | 5.00025 |
| 10000 | 5.000025 |

Figure 42:
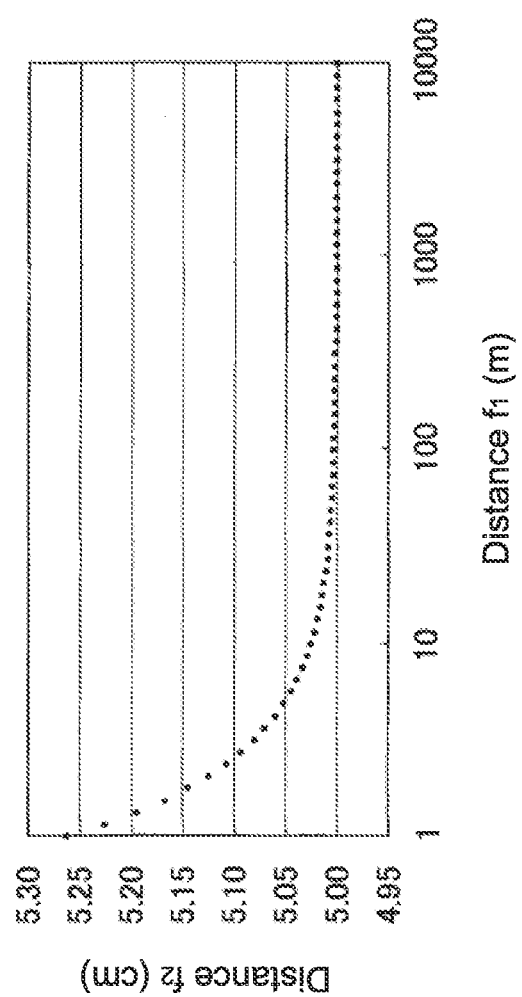
FIG. 42 is a schematic view explaining the 3D imaging system of the ninth embodiment.

As obvious from Table 5 and FIG. 42, the distance $f_2$ from lens L to the image of the object changes only by approximately 0.26 cm, even when the distance $f_1$ from lens L to the object changes from 1 m to 10000 m. In this case, the gap between the first light-receiving face and the Nth light-receiving face in the integrated multilayer transparent photoelectric conversion element is sufficient, even if it is 0.3 cm or less.

When the image plane of the image of the object obtained by lens L does not agree with the light-receiving face of the integrated multilayer transparent photoelectric conversion element, in other words when the focal point do not reside on the light-receiving face, the image of the object can be reproduced by the software algorithm from the signal obtained on each light-receiving face.

Figure 43:
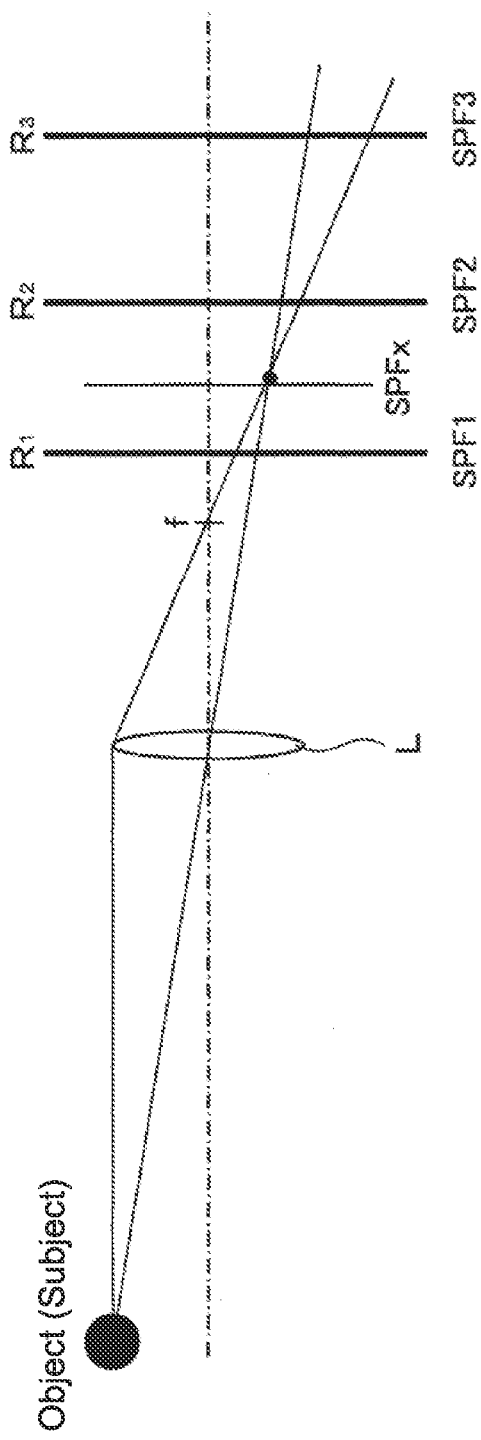
FIG. 43 is a schematic view explaining the 3D imaging system of the ninth embodiment.

As shown in FIG. 43, if the image of the object imaged by the lens L is present between the light-receiving face $R_1$ and the light-receiving face $R_2$ among the light-receiving faces $R_1$ to $R_3$ of the integrated multilayer transparent photoelectric conversion element, it is possible to obtain the point spread function $SPF_x$ of the object image plane, as a function of point spread functions SPF1, SPF2 and SPF3 respectively of light-receiving faces $R_1$ to $R_3$, i.e., F(SPF1, SPF2, SPF3). This calculation can be made easily by a computer. It is possible by using the point spread function $SPF_x$ to obtain the image of the object and reproduce the image on a display.

For example when an image is taken by a television camera in a broadcasting station by using the technology and the image is reproduced on a 3D television set by using the image signal distributed from a broadcasting station, it is possible arbitrarily to zoom in or zoom out the region of particular interest for the user of an image shown according to the output signal from the light-receiving face of the integrated multilayer transparent photoelectric conversion element.

Figure 44:
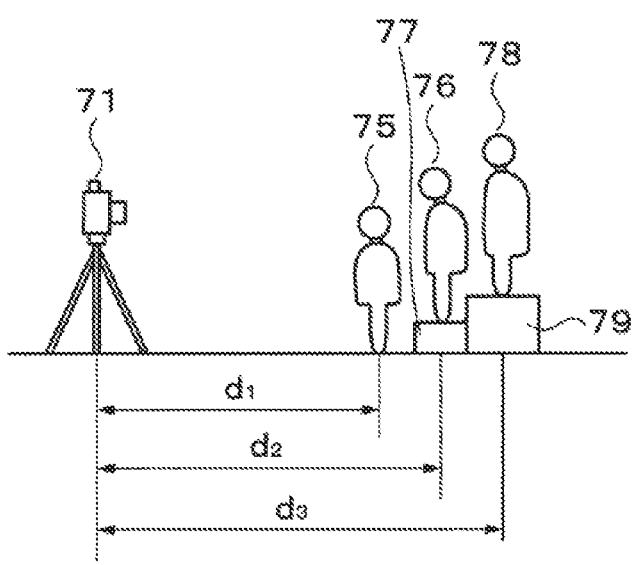
FIG. 44 is a schematic view explaining the 3D imaging system of the ninth embodiment.

It is possible by using a camera 71 to obtain clear images of multiple objects placed at positions at distances mutually different to each other from the camera 71. For example, as shown in FIG. 44, considered is a case when a person on the first row 75 stands on the ground, a person on the second row 76 stands on a low table 77 and a person on the third row 78 stands on a table 79 higher than the table 77 and a picture of these persons 75, 76 and 78 are taken by a camera 71. In this case, because of the multilayer transparent photoelectric conversion element of the camera 71 it is possible to focus on each of these persons 75, 76 and 78 and thus obtain a clear image of these persons 75, 76 and 78.

Figure 45:
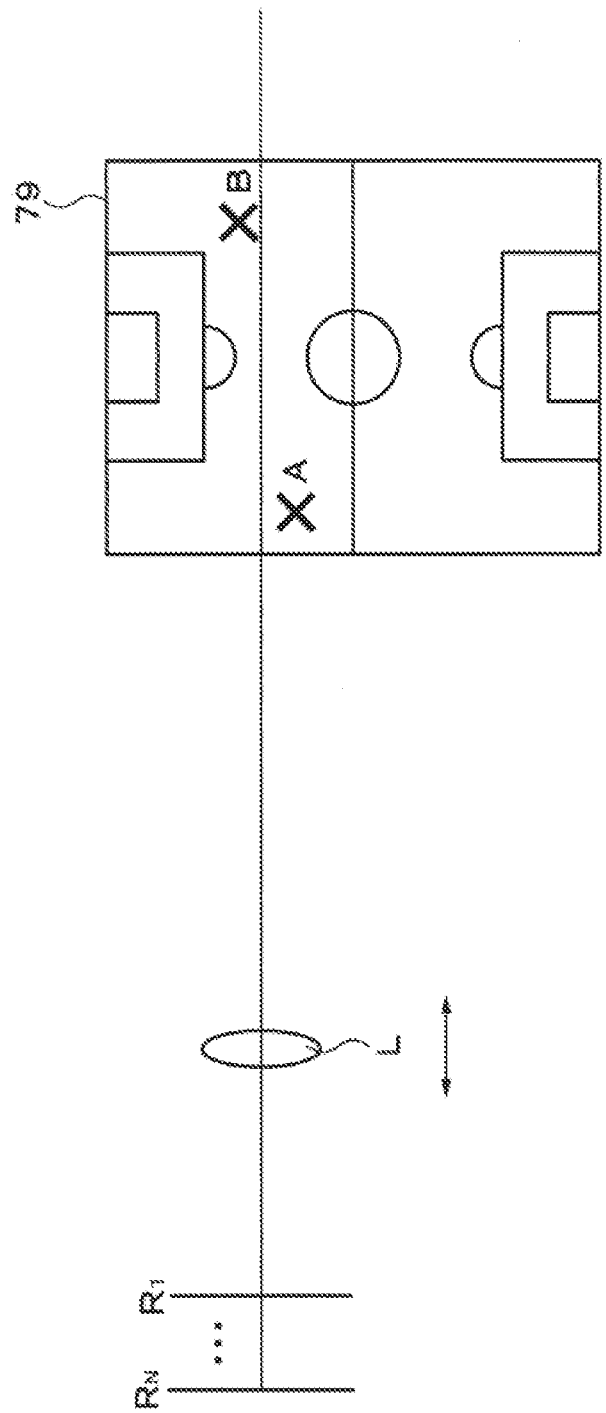
FIG. 45 is a schematic view explaining the 3D imaging system of the ninth embodiment.

It is possible by using the camera 71 to focus on the desired object at high speed. For example, as shown in FIG. 45, the case where there is a game on a soccer court 79 and the game is monitored with a camera 71 is considered. The focal point is changed from point A to point B of the soccer court 79. In such a case, if a common camera is used, it is necessary to move the lens of the camera significantly, while if the camera 71 is used, it is possible to focus on the point B without significant movement of the lens L and change the focal point at high speed. It is because of the following reasons.

Figure 46A:
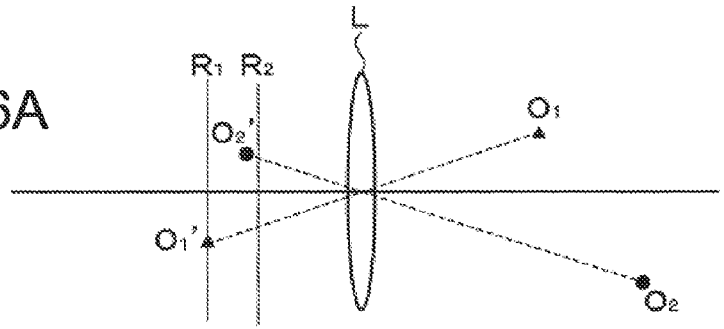
FIG. 46 are schematic views explaining the 3D imaging system of the ninth embodiment.
Figure 46B:
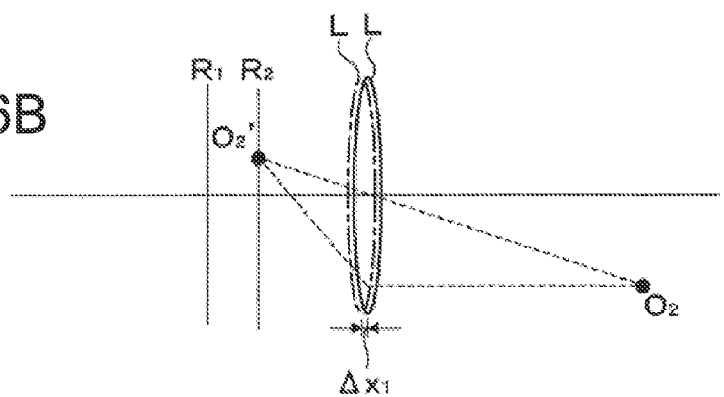
Figure 46C:
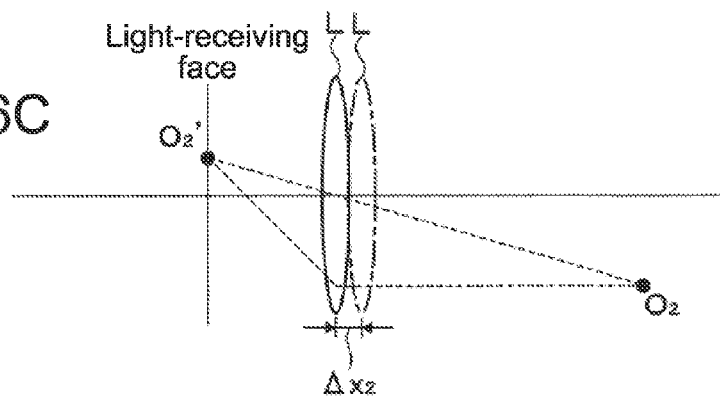

As shown in FIG. 46A, the focal point is first directed to the Object $O_1$ at the point A of the soccer court 79 and the image $O_1'$ is formed on the light-receiving face $R_1$ of the integrated multilayer transparent photoelectric conversion element in camera 71, while the focal point is not directed to the Object $O_2$ at the point B and the image $O_2'$ is formed at a position slightly separated from the light-receiving face $R_2$ of the integrated multilayer transparent photoelectric conversion element in camera 71. If the focal point is directed to the point B from that state, as shown in FIG. 46C, it is necessary in the case of a camera in the past to make the image $O_2'$ of Object $O_2$ formed on the light-receiving face, by moving the lens L by a distance $\Delta x_2$ which corresponds to the difference in position of the images $O_1'$ and $O_2'$. In contrast, as shown in FIG. 46B, it is only necessary, when the camera 71 is used, to move the lens L only by a distance $\Delta x_1$ between image $O_2'$ and the light-receiving face $R_2$, to make image $O_2'$ formed on the light-receiving face $R_2$ close to the light-receiving face $R_1$ and thus to make the lens L-travelling distance smaller and perform the focusing to the point B at high speed. It is also possible to make the camera 71 thinner.

Figure 47:
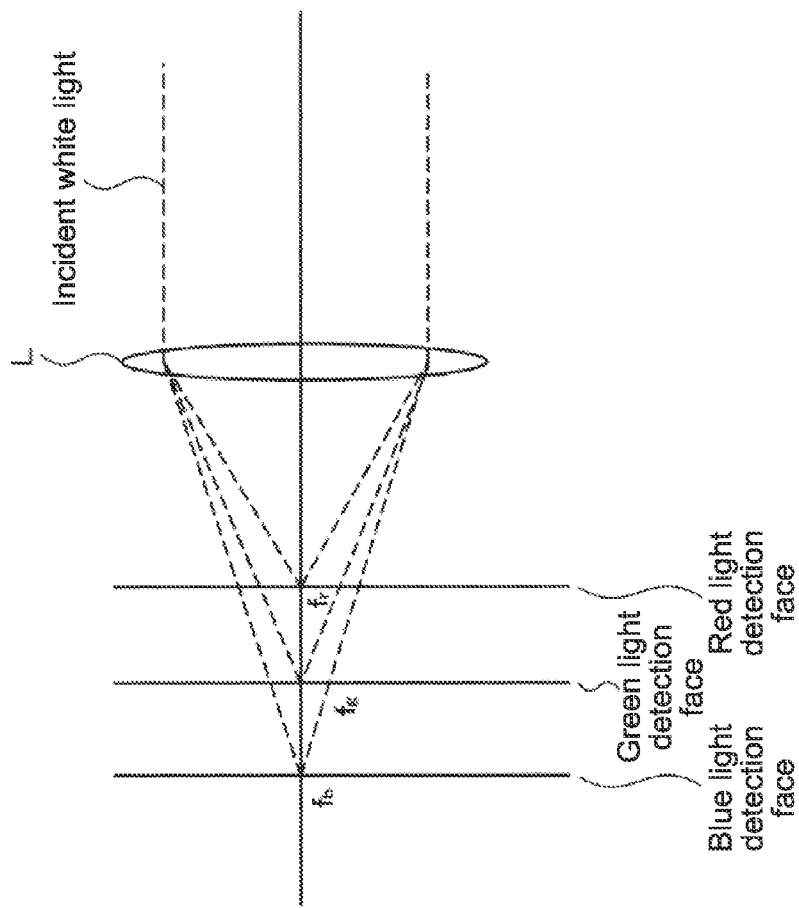
FIG. 47 is a schematic view explaining the 3D imaging system of the ninth embodiment.

It is possible by using the camera 71 to correct chromatic aberration without use of an expensive achromat lens. Specifically as shown in FIG. 47, when white light enters into the lens L, by chromatic aberration of the lens L for example even if images of blue light, green light and red light are formed on different planes (distances from lens L: respectively $f_b$, $f_g$ and $f_r$), the blue light, green light and red light can be received on the light-receiving face of one of the light-receiving faces $R_1$ to $R_N$ of the integrated multilayer transparent photoelectric conversion element in camera 71.

10. Tenth Embodiment

[3D Imaging System]

In the 3D imaging system of the tenth embodiment, a camera containing the integrated multilayer transparent photoelectric conversion element of the eighth embodiment is used as the optical sensor.

Figure 48:
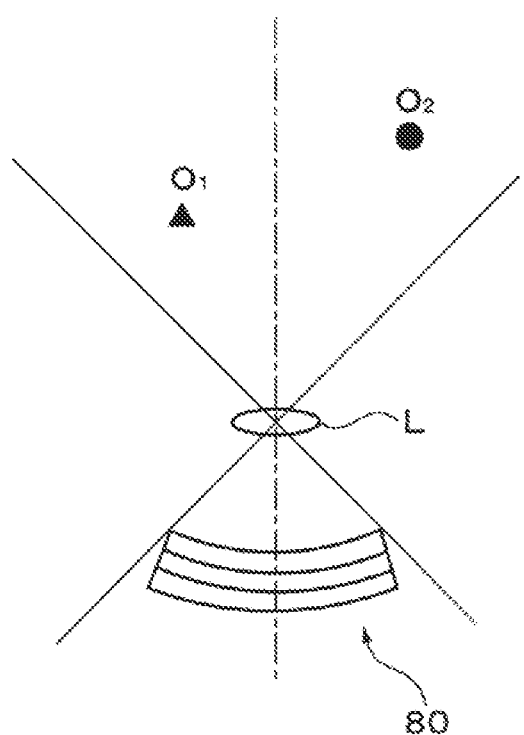
FIG. 48 is a schematic view explaining the 3D imaging system of a tenth embodiment.

As shown in FIG. 48, an integrated multilayer transparent photoelectric conversion element 80 in the curved shape is used as the optical sensor in the camera 71. The lens L is placed at a position close to the center of curvature of the integrated multilayer transparent photoelectric conversion element 80. In this way, it is possible to take a picture of multiple objects (for example, Objects $O_1$ and $O_2$) in a wide angle range.

11. Eleventh Embodiment

[3D Imaging System]

In the 3D imaging system of the eleventh embodiment, a camera containing the integrated multilayer transparent photoelectric conversion element of the eighth embodiment is used as the light-receiving element.

Figure 49:
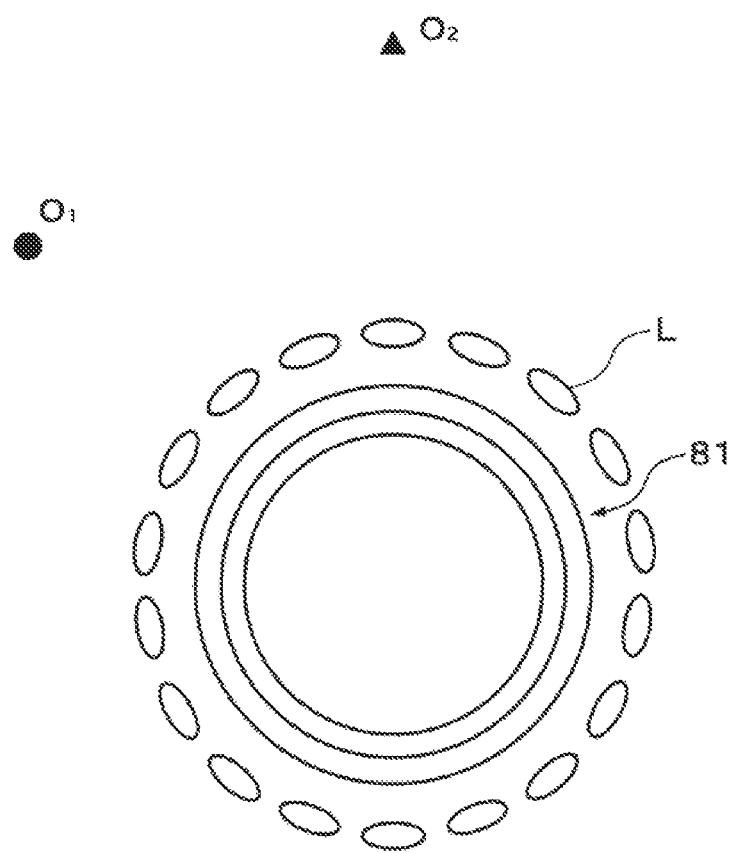
FIG. 49 is a schematic view explaining the 3D imaging system of an eleventh embodiment.

As shown in FIG. 49, an integrated multilayer transparent photoelectric conversion element 81 in the spherocylindrical shape is used as the light-receiving element in the camera 71. The lenses L are placed at the external surface of the integrated multilayer transparent photoelectric conversion element 81. In this way it is possible to take a picture of Objects $O_1$ and $O_2$ present in an angle range of 360° and obtain an omnidirectional 3D imaging system.

12. Twelfth Embodiment

[Optical Disk System]

Figure 50:
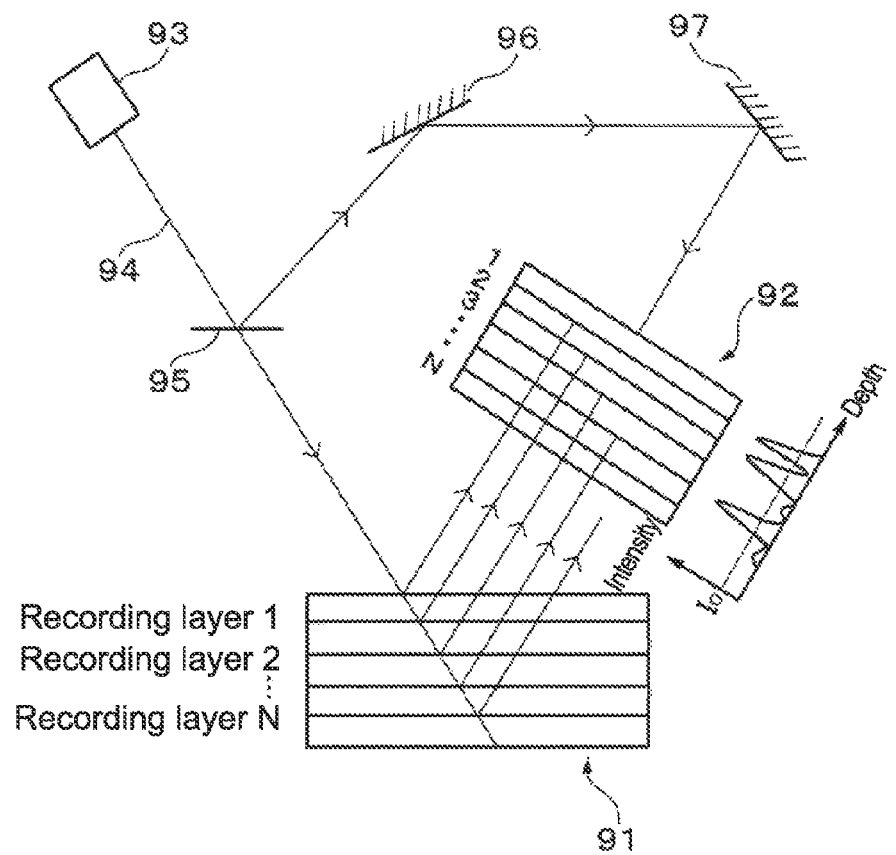
FIG. 50 is a schematic view illustrating an optical disk system of a twelfth embodiment.

FIG. 50 shows the optical disk system of the twelfth embodiment.

As shown in FIG. 50, the optical disk system collectively reads out the digital data recorded in N recording layers of the multilayer optical disk 91 by using a multilayer optical disk 91 having N recording layers and by using a multilayer transparent photoelectric conversion element 92 having N transparent photoelectric conversion elements 31. Specifically as shown in FIG. 50, light 94 from a low-coherence light source 93 is split into two by a beam splitter 95, and the light passing through the beam splitter 95 is guided into the multilayer optical disk 91. The incident light guided into the multilayer optical disk 91 is reflected by respective recording layers, and the reflected lights enter into the multilayer transparent photoelectric conversion element 92. On the other hand, the light reflected by the beam splitter 95 is reflected by mirrors 96 and 97 sequentially and guided into the multilayer transparent photoelectric conversion element 92. When the two lights produced, as divided by the beam splitter 95, enter into the multilayer transparent photoelectric conversion element 92 in this way, these lights cause interference. As a result, as shown in the graph shown to the side of the multilayer transparent photoelectric conversion element 92 in FIG. 50, the light intensity distribution on the light-receiving faces of the N layers of the multilayer transparent photoelectric conversion element 92 is formed, the intensity distribution reflects the data recorded in respective recording layers of the multilayer optical disk 91. In this case, it is possible to read out the recorded digital data on the multilayer optical disk 91, for example, by expressing the peak having an intensity of more than the threshold intensity $I_0$ with "1" and that of lower than the threshold intensity $I_0$ with "0."

13. Thirteenth Embodiment

[Optical Recording and Reproducing System]

Figure 51:
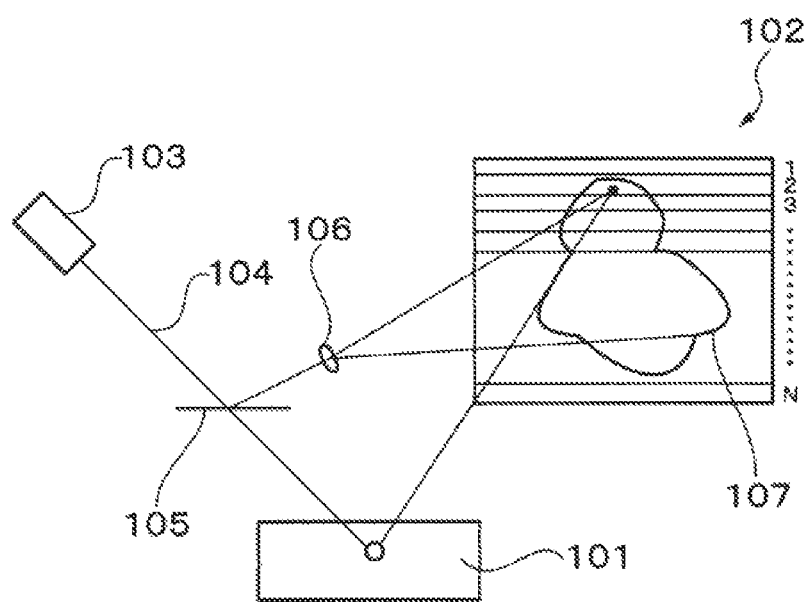
FIG. 51 is a schematic view illustrating an optical recording and reproducing system of a thirteenth embodiment.

FIG. 51 shows the optical recording and reproducing system in the thirteenth embodiment.

As shown in FIG. 51, the optical recording and reproducing system reads out the data recorded on the holographic recording medium 101, by using a holographic recording medium 101 and a multilayer transparent photoelectric conversion element 102 having N layers of transparent photoelectric conversion elements 31. Specifically as shown in FIG. 51, light 109 from a high-coherence light source 103 is divided into two by a beam splitter 105, and the light passing through the beam splitter 105 is guided into the holographic recording medium 101. The light guided into the holographic recording medium 101 is reflected and directed to the multilayer transparent photoelectric conversion element 102. On the other hand, the light reflected by the beam splitter 105 is guided through a lens 106 into the multilayer transparent photoelectric conversion element 102, where it is superimposed with the light from the holographic recording medium 101. As a result, the image recorded in the holographic recording medium 101 is reproduced as light intensity distribution on the multilayer transparent photoelectric conversion element 92. In this way, the image recorded on the holographic recording medium 101 can be reproduced.

14. Fourteenth Embodiment

[CCD Image Sensor]

Figure 52:
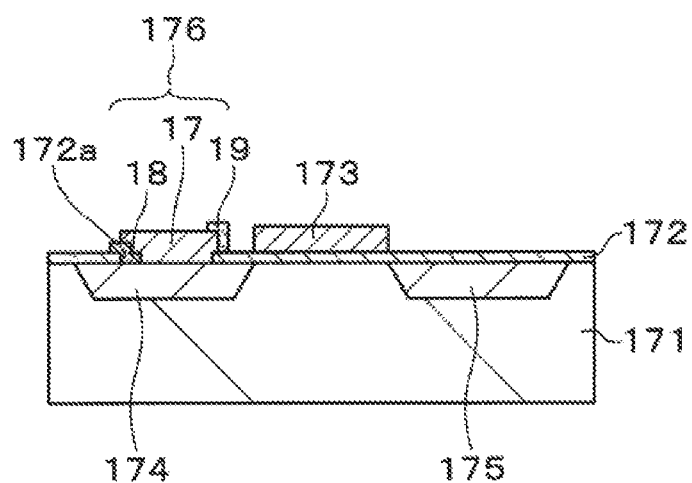
FIG. 52 is a cross-sectional view illustrating a CCD image sensor of a fourteenth embodiment.

FIG. 52 shows the cross-sectional structure of a light-receiving unit and a vertical register placed close to the light-receiving unit of the CCD image sensor in the fourteenth embodiment. The CCD image sensor is an interline-transfer image sensor having a light-receiving unit and vertical and horizontal registers.

As shown in FIG. 52, a gate insulation film 172 is formed on a p-type Si substrate 171 (or p well layer formed on an n-type Si substrate) and a read-out gate electrode 173 is formed on the gate insulation film 172. An n-type layer 174 and another n-type layer 175 serving as a vertical register are formed in the p-type Si substrate 171 in the regions on both sides of the read-out gate electrode 173. An opening 172a is formed in the gate insulation film 172 in the region over the n-type layer 174. A photoelectric conversion element, for example of the third embodiment, is formed as a light-receiving unit 176 on the n-type layer 174 in the opening 172a. The first electrode 18 of the photoelectric conversion element is formed as it extend over and surrounding the opening 172a of the gate insulation film 172 and it is in ohmic contact with the n-type layer 174 in the opening 172a. On the other hand, the second electrode 19 of the photoelectric conversion element is formed on the terminal of the photoconductor 17.

The configuration of the CCD image sensor except that described above is similar to that of interline-transmission CCD image sensors in the past.

In the CCD image sensor, the first electrode 18 is biased to positive voltage with respect to the second electrode 19 of the photoelectric conversion element. When light enters into the photoconductor 17 in the light-receiving unit 176, electrons generated by photoexcitation flow into the n-type layer 174. Then, an n-type channel is formed in the p-type Si substrate 171 immediately below the read-out gate electrode 173, as a positive voltage is applied to the read-out gate electrode 173 under the state that a voltage higher than that of the n-type layer 174 is applied to the n-type layer 175 serving as vertical register, and the electrons in the n-type layer 174 are read out through the n-type channel into the n-type layer 175. The charges thus read out are transmitted then in the vertical register and additionally in the horizontal register, and electrical signals corresponding to the captured image are withdrawn out of the output terminal.

It is possible according to the fourteenth embodiment to provide a novel CCD image sensor containing a photoelectric conversion element that contains a photoconductor 17 of the complex of a conductive polymer and/or polymer semiconductor 11 and a protein 12 as its light-receiving unit 176.

Embodiments and examples of the present disclosure have been described, but the technology is not limited to those described above in the embodiments and examples, and various modifications are possible within the technological scope of the present technology.

For example, the numerical values, structures, configurations, shapes and materials described above in embodiments and examples are nothing but examples and numerical values, structures, configurations, shapes, materials and others different from them may be used, as necessary.

It is possible to form a conductor with the conductive polymer and/or polymer semiconductor, inject carriers into the conductive polymer and/or polymer semiconductor for example by optical doping, chemical doping, electrochemical doping, charge injection doping or non-redox doping, and thus, to increase the conductivity of the conductor. Examples of the conductive polymers and/or polymer semiconductors for use in such a conductor include, but are not limited to, trans-$(CH)_x$'s, polyaniline, derivatives of polyaniline having additional branched chains such as of sulfonic acid and the like.

The present disclosure contains subject matter related to that disclosed in Japanese Priority Patent Application JP 2011-048510 filed in the Japan Patent Office on Mar. 7, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photoelectric conversion element, comprising a photoconductor containing a complex of a conductive polymer and/or polymer semiconductor and a protein containing at least one dye having a long-lived excited state.

2. The photoelectric conversion element according to claim 1, wherein the conductive polymer and/or polymer semiconductor is electrically connected to first and second electrodes therebetween.

3. The photoelectric conversion element according to claim 2, wherein the conductive polymer and/or polymer semiconductor and the protein are bound to each other via non-covalent or covalent bonds.

4. The photoelectric conversion element according to claim 3, wherein the conductive polymer and/or polymer semiconductor forms a network.

5. The photoelectric conversion element according to claim 4, wherein the dye is fluorescent or phosphorescent.

6. The photoelectric conversion element according to claim 5, wherein the protein is at least one protein selected from a group including electron transfer proteins, coenzyme-containing proteins, globins, fluorescent proteins and variants of the fluorescent proteins.

7. The photoelectric conversion element according to claim 6, wherein the complex contains additionally another polymer higher in mechanical strength than the conductive polymer and/or polymer semiconductor.

8. The photoelectric conversion element according to claim 6, wherein the photoconductor and the first and second electrodes are formed on a substrate.

9. The photoelectric conversion element according to claim 8, wherein the substrate and the first and second electrodes are transparent.

10. The photoelectric conversion element according to claim 1, wherein the photoelectric conversion element is a light-receiving element.

11. A method of producing a photoelectric conversion element, comprising forming a photoconductor containing a complex of a conductive polymer and/or polymer semiconductor and a protein containing at least one dye having a long-lived excited state.

12. The method of producing a photoelectric conversion element according to claim 11, wherein first and second electrodes are first formed on a substrate and the photoconductor is formed on the substrate in such a manner that the conductive polymer and/or polymer semiconductor is electrically connected to the first and second electrodes therebetween.

13. The method of producing a photoelectric conversion element according to claim 12, wherein the conductive polymer and/or polymer semiconductor and the protein are bound to each other via non-covalent or covalent bonds.

14. The method of producing a photoelectric conversion element according to claim 13, wherein the complex is formed by using a solution containing the conductive polymer and/or polymer semiconductor and the protein.

15. The method of producing a photoelectric conversion element according to claim 13, wherein the conductive polymer and/or polymer semiconductor and the protein are bound to each other with a linker, which is added to a solution containing the conductive polymer and/or polymer semiconductor and the protein, and the complex is then formed by using the solution.

16. The method of producing a photoelectric conversion element according to claim 13, wherein
the conductive polymer and/or polymer semiconductor is formed from a monomer by electrochemical polymerization method by using a solution containing the monomer for preparation of the conductive polymer and/or polymer semiconductor and the dye,
the protein containing the dye is formed by addition of an apoprotein to the solution, and
the complex is formed by using the solution.

17. A solid-state image sensor, comprising a photoconductor containing a complex of a conductive polymer and/or polymer semiconductor and a protein containing at least one dye having a long-lived excited state, as a light-receiving unit.

18. A method of producing a solid-state image sensor, comprising forming a light-receiving unit by using a photoconductor containing a complex of a conductive polymer and/or polymer semiconductor and a protein containing at least one dye having a long-lived excited state.

19. An electronic apparatus, comprising a photoelectric conversion element containing a photoconductor that contains a complex of a conductive polymer and/or polymer semiconductor and a protein containing at least one dye having a long-lived excited state.

20. An electronic apparatus, comprising a solid-state image sensor containing a photoconductor that contains a complex of a conductive polymer and/or polymer semiconductor and a protein containing at least one dye having a long-lived excited state, as a light-receiving unit.

21. A photoconductor, comprising a complex of a conductive polymer and/or polymer semiconductor and a protein containing at least one dye having a long-lived excited state.

22. A method of producing a photoconductor, comprising forming a complex of a conductive polymer and/or polymer semiconductor and a protein containing at least one dye having a long-lived excited state.

23. A multilayer transparent photoelectric conversion element, comprising multiple mutually-laminated transparent photoelectric conversion elements containing a photoconductor that contains a complex of a conductive polymer and/or polymer semiconductor and a protein containing at least one dye having a long-lived excited state.

24. An electronic apparatus, comprising a multilayer transparent photoelectric conversion element containing multiple mutually-laminated transparent photoelectric conversion elements containing a photoconductor that contains a complex of a conductive polymer and/or polymer semiconductor and a protein containing at least one dye having a long-lived excited state.

25. The electronic apparatus according to claim 24, wherein the electronic apparatus is a three-dimensional (3D) display, 3D image sensor, camera or optical recording and reproducing system.

* * * * *